United States Patent
Nanjundappa et al.

(10) Patent No.: US 10,922,208 B2
(45) Date of Patent: *Feb. 16, 2021

(54) OBSERVER FOR SIMULATION TEST AND VERIFICATION

(71) Applicant: The MathWorks, Inc., Natick, MA (US)

(72) Inventors: Mahesh Nanjundappa, Marlborough, MA (US); S. M. Shahed Nejhum, Natick, MA (US); Vijaya Raghavan, Brookline, MA (US); Krishna Balasubramanian, Wellesley, MA (US); John P. Dirner, Roslindale, MA (US)

(73) Assignee: The MathWorks, Inc., Natick, MA (US)

( * ) Notice: Subject to any disclaimer, the term of this patent is extended or adjusted under 35 U.S.C. 154(b) by 42 days.

This patent is subject to a terminal disclaimer.

(21) Appl. No.: 16/426,624

(22) Filed: May 30, 2019

(65) Prior Publication Data

US 2019/0370155 A1    Dec. 5, 2019

Related U.S. Application Data

(63) Continuation-in-part of application No. 16/128,099, filed on Sep. 11, 2018, now Pat. No. 10,684,936.
(Continued)

(51) Int. Cl.
*G06F 11/36* (2006.01)
*G06F 11/34* (2006.01)
(Continued)

(52) U.S. Cl.
CPC .......... *G06F 11/3608* (2013.01); *G06F 9/455* (2013.01); *G06F 11/261* (2013.01);
(Continued)

(58) Field of Classification Search
None
See application file for complete search history.

(56) References Cited

U.S. PATENT DOCUMENTS

| 7,072,820 B1 | 7/2006 | Bailey et al. |
| 7,464,373 B1 | 12/2008 | Yunt et al. |

(Continued)

OTHER PUBLICATIONS

"Simulink® Design Verifier: User's Guide," R2018a, The MathWorks, Inc., Mar. 2018, pp. 1-648.
(Continued)

*Primary Examiner* — Qing Chen
(74) *Attorney, Agent, or Firm* — Cesari and McKenna, LLP; Michael R. Reinemann

(57) ABSTRACT

Systems and methods validate the operation of a component of an executable model without inadvertently altering the behavior of the component. The model may be partitioned into a design space and a verification space. The component may be placed in the design space, while an observer for validating the component may be placed in the verification space, and linked to the component. During execution of the model, input or output values for the component may be computed and buffered. Execution of the observer may follow execution of the component. The input or output values may be read out of the buffer, and utilized during execution of validation functionality defined for the observer. Model compilation operations that may inadvertently alter the behavior of the component, such as back propagation of attributes, are blocked between the observer and the component.

49 Claims, 35 Drawing Sheets

Related U.S. Application Data

(60) Provisional application No. 62/678,648, filed on May 31, 2018.

(51) Int. Cl.
*G06F 9/455* (2018.01)
*G06F 11/26* (2006.01)

(52) U.S. Cl.
CPC ...... *G06F 11/3457* (2013.01); *G06F 11/3461* (2013.01); *G06F 11/36* (2013.01); *G06F 11/3664* (2013.01)

(56) References Cited

U.S. PATENT DOCUMENTS

| | | |
|---|---|---|
| 7,472,103 B1 | 12/2008 | Yang |
| 7,599,823 B2 | 10/2009 | Mosterman et al. |
| 8,156,147 B1 | 4/2012 | Tocci et al. |
| 8,301,423 B1 | 10/2012 | Aldrich et al. |
| 8,364,456 B2 | 1/2013 | Raghavan et al. |
| 8,903,688 B1 | 12/2014 | Aldrich et al. |
| 10,318,653 B1 | 6/2019 | Khoo et al. |
| 2005/0091026 A1 | 4/2005 | Hodgson et al. |
| 2005/0234692 A1 | 10/2005 | Reblewski |
| 2006/0129371 A1 | 6/2006 | Orofino, II et al. |
| 2010/0057426 A1 | 3/2010 | Reblewski |
| 2011/0295578 A1 | 12/2011 | Aldrich et al. |
| 2014/0358506 A1 | 12/2014 | Aldrich et al. |

OTHER PUBLICATIONS

"Simulink® Requirements: User's Guide," R2018a, The MathWorks, Inc., Mar. 2018, pp. 1-244.

"Simulink®: User's Guide," R2018a, The MathWorks, Inc., Mar. 2018, pp. 1-4212.

U.S. Appl. No. 16/128,099, filed Sep. 11, 2018 by Mahesh Nanjundappa et al. for Observer for Simulation Test and Verification, pp. 1-96.

Berutti, Martin, "Software Acceptance Testing with Mimic Simulation Software," MYNAH Technologies, Jan. 1, 2017, pp. 1-20.

"European Search Report and Written Opinion," European Application No. 19177656.6-1224/3575990, Applicant: The MathWorks, Inc., dated Feb. 11, 2020, pp. 1-17.

Wagner, Florian, "Modellbasierte Entwicklung und Verifikation einer modularen Antriebsplattform mit MATLAB/Simulink," Masterthesis, Smart Mechatronics, Hochschule Bochum-Bochum University of Applied Science, Feb. 16, 2017, pp. 1-106.

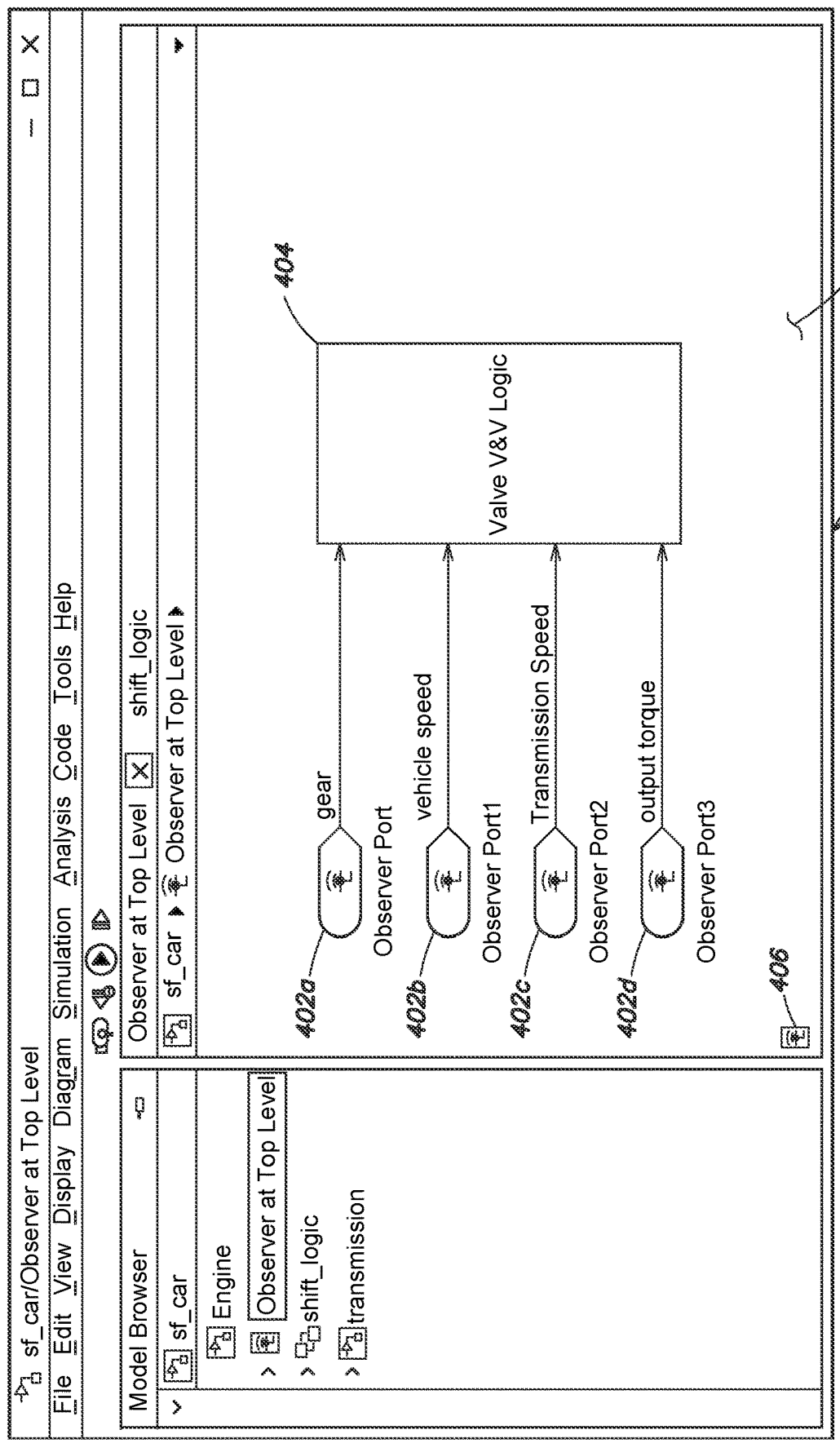

OBSERVER FOR SIMULATION TEST AND VERIFICATION

CROSS-REFERENCE TO RELATED APPLICATIONS

This application is a continuation-in-part of application Ser. No. 16/128,099 (now U.S. Pat. No. 10,684,936) filed Sep. 11, 2018 for an Observer for Simulation Test and Verification by Mahesh Nanjundappa et al, which claims the benefit of Provisional Patent Application Ser. No. 62/678, 648, filed May 31, 2018, for an Observer for Model Test and Verification, which applications are hereby incorporated by reference in their entireties.

BRIEF DESCRIPTION OF THE DRAWINGS

The disclosure description below refers to the accompanying drawings, of which:

FIG. 4 is a schematic illustration of an example observer in accordance with one or more embodiments;

DETAILED DESCRIPTION OF ILLUSTRATIVE EMBODIMENTS

Figure 1:
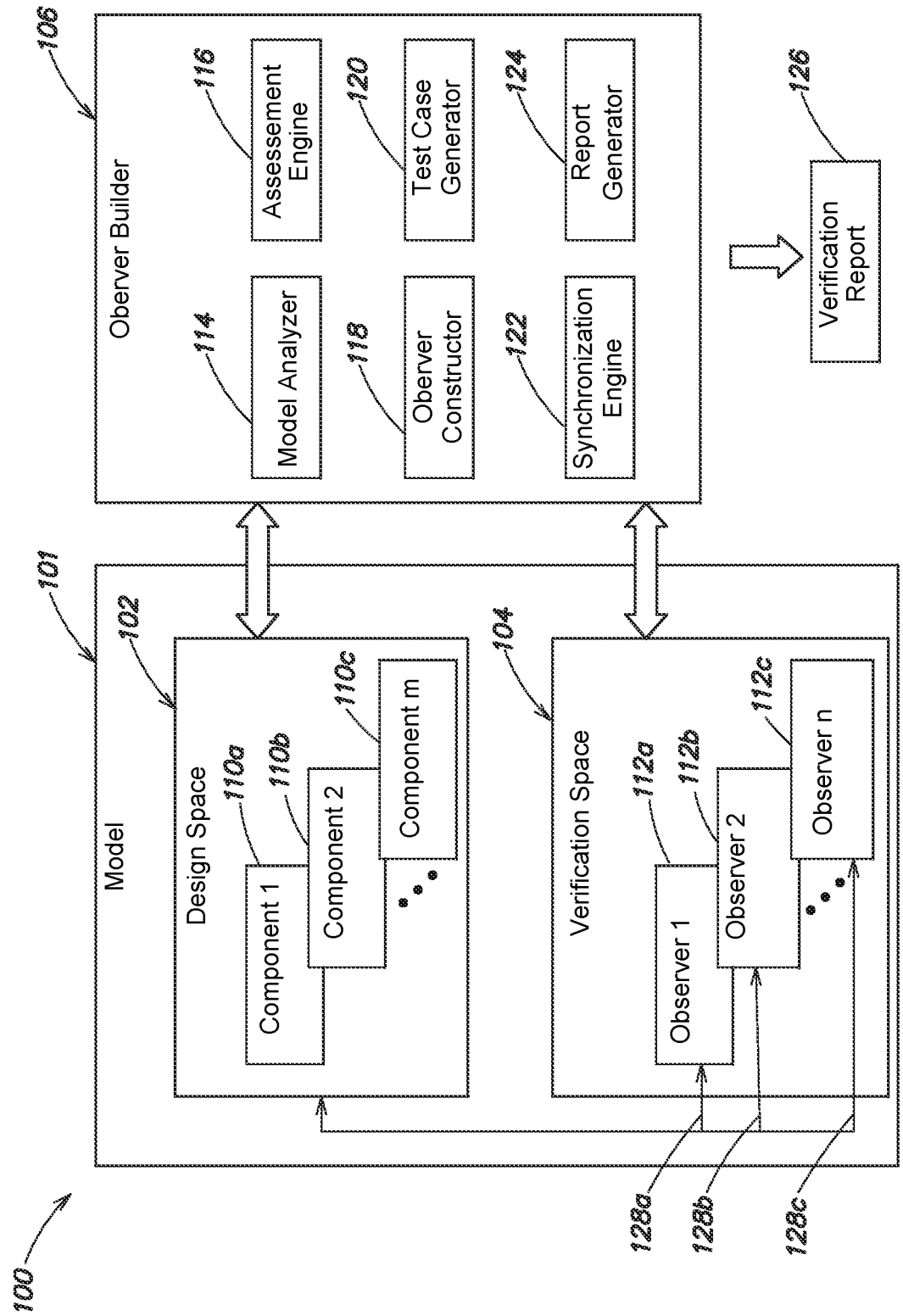
FIG. 1 is a schematic illustration of an example model verification environment in accordance with one or more embodiments.

Engineers and other users often utilize computer-based modeling environments to design and create systems, such as control systems, communications systems, factory automation systems, etc. A user may construct a computer-generated model of a system being developed within the modeling environment. The model may include a plurality of model elements, such as blocks, states, etc., which may be interconnected to define mathematical, dataflow, control flow, or other relationships. The model may have executable semantics, and may be executed producing model outputs. The user may evaluate the model's outputs to determine whether the model's behavior approximates operation of the system to an acceptable degree of accuracy.

A group of model elements may be contained within a component of the model. Exemplary components include subsystems, subcharts, sub-models, sub-Virtual Instruments (subVIs), etc. The component may be visually represented within the model as a single element, such as a subsystem block or a model reference block. A component may itself contain other components, establishing multiple hierarchical levels within the model. Model hierarchy may be established by containment relationships among components and model elements. For example, by configuring components to contain other components and/or model elements. Components may include input ports and output ports, and input/output data and/or control dependencies may extend across hierarchical levels of a model.

During the development of a model, the user may want to verify or validate the operation of one or more components of a model. To do so, the user may introduce verification and validation logic into the model. For example, a user may add new model elements to the model, and may connect these new elements to the component. The addition of these new elements, which are not part of the component's design, can clutter the model, making it difficult to discern the model's design. Furthermore, the new model elements may alter the execution behavior of the model. For example, signal and other attributes specified by the new model elements may propagate to model elements or other portions of the model, including the component being evaluated. As a result, attributes and properties of the component may be changed through the addition of the verification and validation logic. Evaluation of the component's original execution behavior may be difficult or impossible to obtain, and inaccurate results and/or incorrect conclusions may be drawn from the verification or validation of the component. That is, the new model elements added for verification or validation purposes may inadvertently affect the accuracy and/or behavior of the component. The user, moreover, may be unaware of this alteration in the component's execution behavior. Thus, there may be a need perform verification or validation of a component in a way that does not inadvertently affect its accuracy and/or behavior.

Briefly, the disclosure relates to systems and methods for constructing observers that perform verification and validation of an executable model or a component of a model without altering the behavior of the model and/or the component during execution. Observers may be separate from the model, and may be executed within one or more verification spaces. The one or more verification spaces may be separate from a design space within which the algorithmic portion of the model, which simulates the system, including the component being verified, may be executed. That is, execution of the observers may be isolated in a separate verification space so as to leave execution of the model in the design space unaffected. In this manner, artifacts from the observers affecting execution of the model are reduced or eliminated. Notably, information used or generated by the model in the design space may be shared with observers in the verification space, but information from the verification space affecting execution semantics of the model is not shared with the design space, e.g., is inaccessible to and blocked from propagating to the design space. In essence, a simulation engine executes components of the design space and components of the verification space such that information (e.g., signal values, signal attributes, etc.) from the verification space is not propagated to the design space which may affect computational results in the design space, e.g., verification space information remains private to or contained in the verification space. In this manner, the simulation engine reduces inaccuracy in a model to which verification and validation elements have been added.

For example, the design space may be a partition of the model, and may include the elements of the design model, such as model elements and components, that implement the model's behavior for simulating the system being modeled. The design space may include an instance of a model editor in which a model is opened, e.g., for editing and execution, and one or more workspaces whose scope is confined to the model. Even though they are executed within the one or more verification spaces for the model, observers may have access to information used or generated by the model, including the component, such as the values of signals, states, variables, parameters, etc., during model execution. Observers may be implemented as model components, such as subsystems, and thus also have executable semantics. Execution of observers may be scheduled and performed by a modeling environment. Execution of observers may occur after or during execution of the component or model. Even though the observer may be visually depicted as part of the model or a test harness, the modeling environment may prevent attributes, such as model-level parameters, block-level parameters, and port-level parameters, defined within the observer from propagating to the model or the component, for example by executing the observer separately following execution of the model.

The present disclosure thus solves the problem of verification or validation logic altering the execution behavior of a component, and provides for more accurate verification and validation of the component. For example, the present disclosure may more accurately determine whether a component satisfies requirements specified for the component. These requirements may be safety requirements, mission critical requirements, user experience requirements, etc.

FIG. 1 is a schematic illustration of an example model verification environment 100 in accordance with an embodiment. The model verification environment 100 may include a model 101, which may be partitioned into a design space 102 and a verification space 104, and an observer builder 106. The design space 102 may host the model elements and components that represent the algorithmic part of the model 101. For example, the model 101 may be opened or created in the design space 102. The model 101 may include a plurality of model elements and/or components, such as components 110a-c, configured and arranged to model the operation of a system or perform some other procedure. The model 101 may include multiple hierarchical levels, and the components 110a-c may be arranged at different hierarchical levels. The verification space 104 may include a plurality of observers, such as observers 112a-c. In some embodiments, the design space 102 and the verification space 104 may be separate modeling spaces supported by one or more modeling programs or environments. The observer builder 106 may include a model analyzer 114, an assessment engine 116, an observer constructor 118, a test case generator 120, a synchronization engine 122, and a report generator 124 that may generate reports, such as a verification report 126.

The observer builder 106 may define a new type of model element, which may be referred to as an observer port element type. The observer constructor 118 may add observer port elements to the observers 112a-c. For example, the observer constructor 118 may create instances of the observer port element type within the observers 112a-c. The observer port elements may access information from the design space 102, such as values for signals generated by one or more of the components 110a-c under observation, and may make those values available within the verification space 104, as indicated by arrows 128a-c, for verification. The model analyzer 114 may identify available information from the design space 102, such as values for signals, data, control, messages, events, variables, parameters, and properties, and values of selected information may be accessed via the observer port element. Values for the selected information may be utilized to perform verification operations within the observer 112. The test case generator 120 may generate sample inputs for the model 101 and/or the components 110a-c. The report generator 124 may collect verification and/or validation results, and present them in one or more verification reports, such as verification report 126.

The synchronization engine 122 may synchronize the observers 112a-c to the components 110a-c. For example, the synchronization engine 122 may monitor and detect changes to the components 110a-c, such as the definition of new signals, data, control, messages, events, variables, parameters, or properties, as well as changes to the interface of the components 110a-c, such as the definition of new or different inputs and outputs. In response, the synchronization engine 122 may update one or more of the observer port elements of the observers 112a-c to provide access to this new information from within the verification space 104.

In some embodiments, the observer constructor 118 may convert a test harness and/or a verification subsystem included in the design space 102 with the model 101 to an observer 112 in the verification space 104. For example, the observer constructor 118 may move verification and/or assessment logic in the test harness and/or the verification subsystem, which may, at least initially, have been included in the design space 102, to a newly created observer 112 of the verification space 104. The observer constructor 118 also may add one or more observer port elements to the newly created observer. The verification and/or assessment logic may no longer be present in the design space 102, as a result of having been moved to an observer in the verification space. In addition, graphical connection elements between the test harness and/or verification subsystem and one or more of the components 110a-c, which may have been visually presented in the design space 102, may be removed.

Modeling Environment

Figure 2:
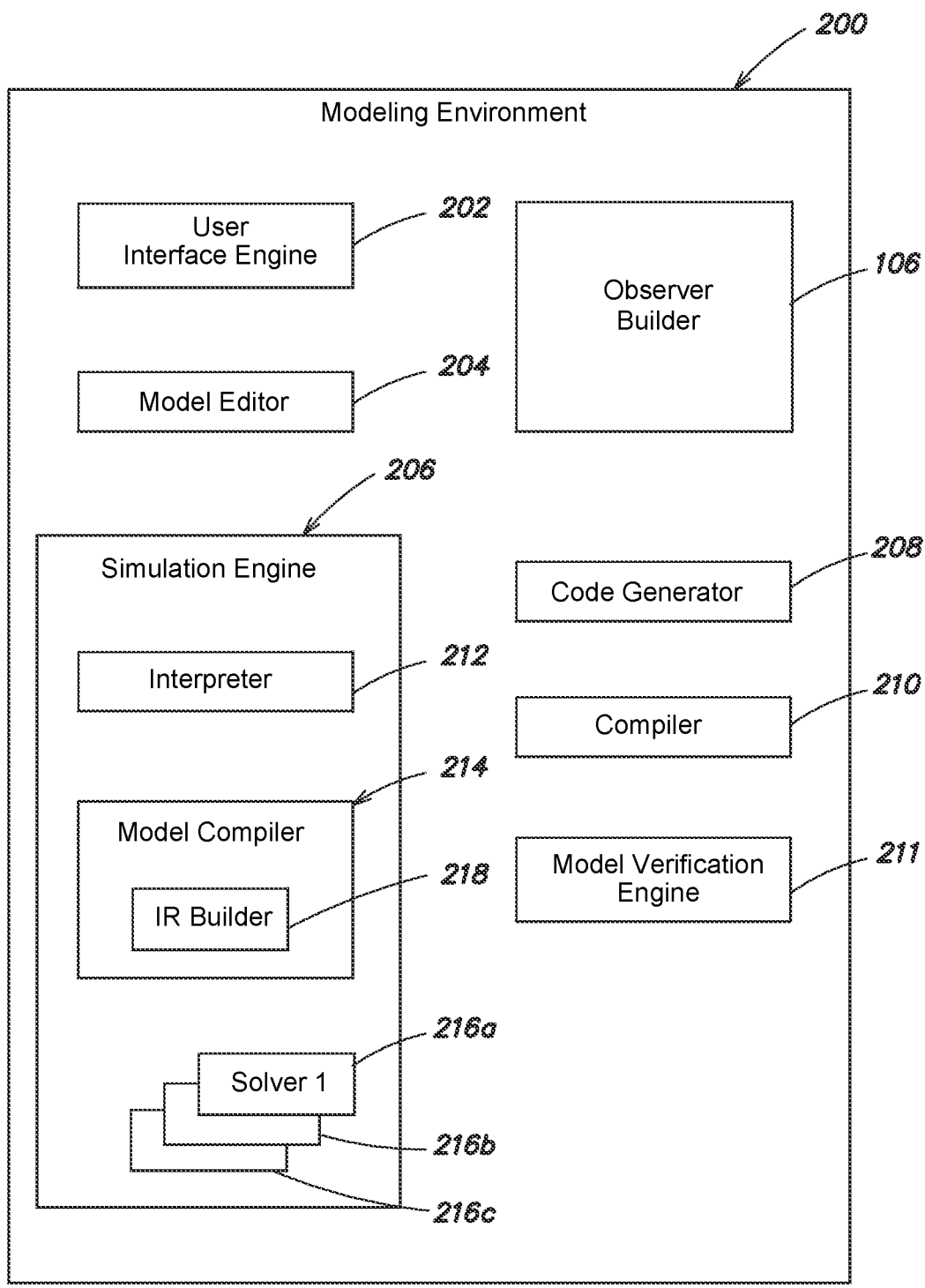
FIG. 2 is a schematic diagram of an example modeling environment in accordance with one or more embodiments.

FIG. 2 is a schematic diagram of an example modeling environment 200 in accordance with an embodiment. The modeling environment 200 may include a User Interface (UI) engine 202, a model editor 204, a simulation engine 206, the observer builder 106, a code generator 208, a compiler 210, and a model verification engine 211. The UI engine 202 may create and present one or more User Interfaces (UIs), such as Graphical User Interfaces (GUIs) and/or Command Line Interfaces (CLIs), on a display of a workstation, terminal, or other data processing device. The UIs may be operated by a user to initiate various model-related tasks, such as opening, constructing, editing, running, and saving models. The model editor 204 may perform selected operations, such as open, construct, edit, run, and save, in response to UI events generated from user inputs.

The simulation engine 206 may include an interpreter 212, a model compiler 214, and one or more solvers, such as solvers 216a-c. The model compiler 214 may include one or more Intermediate Representation (IR) builders, such as IR builder 218. The simulation engine 206 may execute, e.g., compile and run or interpret, computer-generated simulation models using one or more of the solvers 216a-c. Exemplary solvers include one or more fixed-step continuous solvers, which may utilize integration techniques based on Euler's Method or Heun's Method, and one or more variable-step solvers, which may be based on the Runge-Kutta and Dormand-Prince pair.

The selected solver(s) may evaluate the model over a simulation time, which may begin at start time, e.g., 0.0 seconds, and stop at an end time, e.g., 10.0 seconds. A solver may approximate the behavior of a model being executed at time t+dt based on the behavior of the model from the start time, $t_0$, to time t. The quantity dt may be the step size determined by the solver, and the interval from t to t+dt may be referred to as a major time step. The solver 216 may need to evaluate the model at multiple times between major time steps to increase the accuracy of the evaluation at time t+dt. These intermediate times steps may be referred to as minor time steps.

The code generator 208 may automatically generate code, such as source or object code, for a model or portion thereof automatically. For example, the code generator 208 may generate code for the model 101, a component 110, an observer 112, etc. The generated code may be in form suitable for execution outside of the modeling environment 200, and may be referred to as standalone code. The compiler 210 may compile the generated source code to produce an executable that may be deployed on a target platform for execution, such as an embedded system.

The model verification engine 211 may use formal methods to identify design errors in a model, such as dead logic, integer overflow, division by zero, and violations of design properties and assertions. When an error is discovered, the model verification engine 211 may generate test vectors that reproduce the error during simulation of the model.

It should be understood that the modeling environment 200 of FIG. 2 is for illustrative purposes only, and that other modeling environments having additional, fewer or other modules may be utilized. For example, the modeling environment 200 may include a differencing engine for comparing two models and identifying the differences between them, a merge engine for merging two models, etc.

In some embodiments, the observer builder 106 and/or one or more of the parts thereof may be implemented through one or more software modules or libraries containing program instructions pertaining to the methods described herein. The software modules may be stored in a memory, such as a main memory, a persistent memory and/or a computer readable media, of a workstation, server, or other data processing machine or device, and executed by one or more processors. Other computer readable media may also be used to store and execute these program instructions, such as non-transitory computer readable media, including optical, magnetic, or magneto-optical media. In another embodiment, the observer builder 106 and/or one or more of the parts thereof may comprise hardware registers and combinatorial logic configured and arranged to produce sequential logic circuits that implement the methods described herein. In alternative embodiments, various combinations of software and hardware, including firmware, may be utilized to implement the described methods.

In some embodiments, the observer builder 106 and/or one or more parts thereof may be separate from the modeling environment 200. In such cases, the observer builder 106 may communicate with the modeling environment 200 via a bus or network, e.g., through local procedure calls (LPCs), remote procedure calls (RPCs), an Application Programming Interface (API), or another communication or interface technology.

The modeling environment 200 may be a high-level modeling application program. Suitable high-level modeling application programs include the MATLAB® algorithm development environment and the Simulink® model-based design environment from The MathWorks, Inc. of Natick, Mass., as well as the Simscape physical modeling system and the Stateflow® state chart tool also from The MathWorks, Inc., the MapleSim physical modeling and simulation tool from Waterloo Maple Inc. of Waterloo, Ontario, Canada, the LabVIEW virtual instrument programming system and the NI MatrixX model-based design product from National Instruments Corp. of Austin, Tex., the Keysight VEE graphical programming environment from Keysight Technologies, Inc. of Santa Clara, Calif., the System Studio model-based signal processing algorithm design and analysis tool and the SPW signal processing algorithm tool from Synopsys, Inc. of Mountain View, Calif., a Unified Modeling Language (UML) system, a Systems Modeling Language (SysML) system, and the System Generator system from Xilinx, Inc. of San Jose, Calif. Models created in the high-level modeling environment 200 may be expressed at a level of abstraction that contain less implementation detail, and thus operate at a higher level than certain programming languages, such as the C, C++, C #, and SystemC programming languages.

Those skilled in the art will understand that the MATLAB algorithm development environment is a math-oriented, textual programming environment for digital signal processing (DSP) design, among other uses. The Simulink model-based design environment is a block diagram based design environment for modeling and simulating dynamic systems, among other uses. The MATLAB and Simulink environments provide a number of high-level features that facilitate algorithm development and exploration, and support model-based design, including dynamic typing, array-based operations, data type inferencing, sample time inferencing, and execution order inferencing, among others.

In some embodiments, a programming language, such as the C, C++, C #, and SystemC, programming languages, among others, may be used to create one or more models or portions thereof. These programming languages may be considered to be at lower levels of abstraction as compared to the language of the modeling environment.

Models constructed in the modeling environment 200 may include textual models, graphical models, and combinations of graphical and textual models. A model, when executed, may simulate, e.g., approximate the operation of, a system, such as a natural or man-made system. A model may be considered to be a form of source program, and may implement and/or represent one or more algorithms and/or procedures. Exemplary systems include weather systems, financial systems, plants, controllers for factory automation, electronic control units (ECUs), anti-lock braking systems (ABS), flight controllers, communication systems, etc. A model may be executed in order to simulate the behavior of the system being modeled, and the execution of a model by and/or within the modeling environment 200 may be referred to as simulating or running the model.

In some embodiments, a model may be a time based block diagram. A time based block diagram may include, for example, model elements, such as blocks, connected by lines, e.g., arrows, that may represent signal values written and/or read by the model elements. A signal is a time varying quantity that may have a value at all points in time during execution of a model, for example at each simulation or time step of the model's iterative execution. A signal may have a number of attributes, such as signal name, data type, numeric type, dimensionality, complexity, sample mode, e.g., sample-based or frame-based, and sample time. The model elements may themselves consist of elemental dynamic systems, such as a differential equation system, e.g., to specify continuous-time behavior, a difference equation system, e.g., to specify discrete-time behavior, an algebraic equation system, e.g., to specify constraints, a state transition system, e.g., to specify finite state machine behavior, an event based system, e.g., to specify discrete event behavior, etc. The connections may specify input/output relations, execution dependencies, variables, e.g., to specify information shared between model elements, physical connections, e.g., to specify electrical wires, pipes with volume flow, rigid mechanical connections, etc., algorithms, e.g., to be applied to an input, an output, a value, etc., or the like.

In a time based block diagram, ports may be associated with model elements. A relationship between two ports may be depicted as a line, e.g., a connector line, between the two ports. Lines may also, or alternatively, be connected to other lines, for example by creating branch points. A port may be defined by its function, such as an input port, an output port, an enable port, a trigger port, a function-call port, a publish port, a subscribe port, an exception port, an error port, a physics port, an entity flow port, a data flow port, a control flow port, etc.

Relationships between model elements may be causal and/or non-causal. For example, a model may include a continuous-time integration block that may be causally related to a data logging block by depicting a connector line to connect an output port of the continuous-time integration block to an input port of the data logging model element. Further, during execution of the model, the value stored by the continuous-time integrator may change as the current time of the execution progresses. The value of the state of the continuous-time integrator block may be available on the output port and the connection with the input port of the data logging model element may make this value available to the data logging block.

In some implementations, a model element may include or otherwise correspond to a non-causal modeling function or operation. An example of a non-causal modeling function may include a function, operation, or equation that may be executed in different fashions depending on one or more inputs, circumstances, and/or conditions. A non-causal modeling function or operation may include a function, operation, or equation that does not have a predetermined causality.

The modeling environment 200 may implement a graphical programming language having a syntax and semantics, and models may be constructed according to the syntax and semantics defined by the modeling environment 200.

Figure 3A:
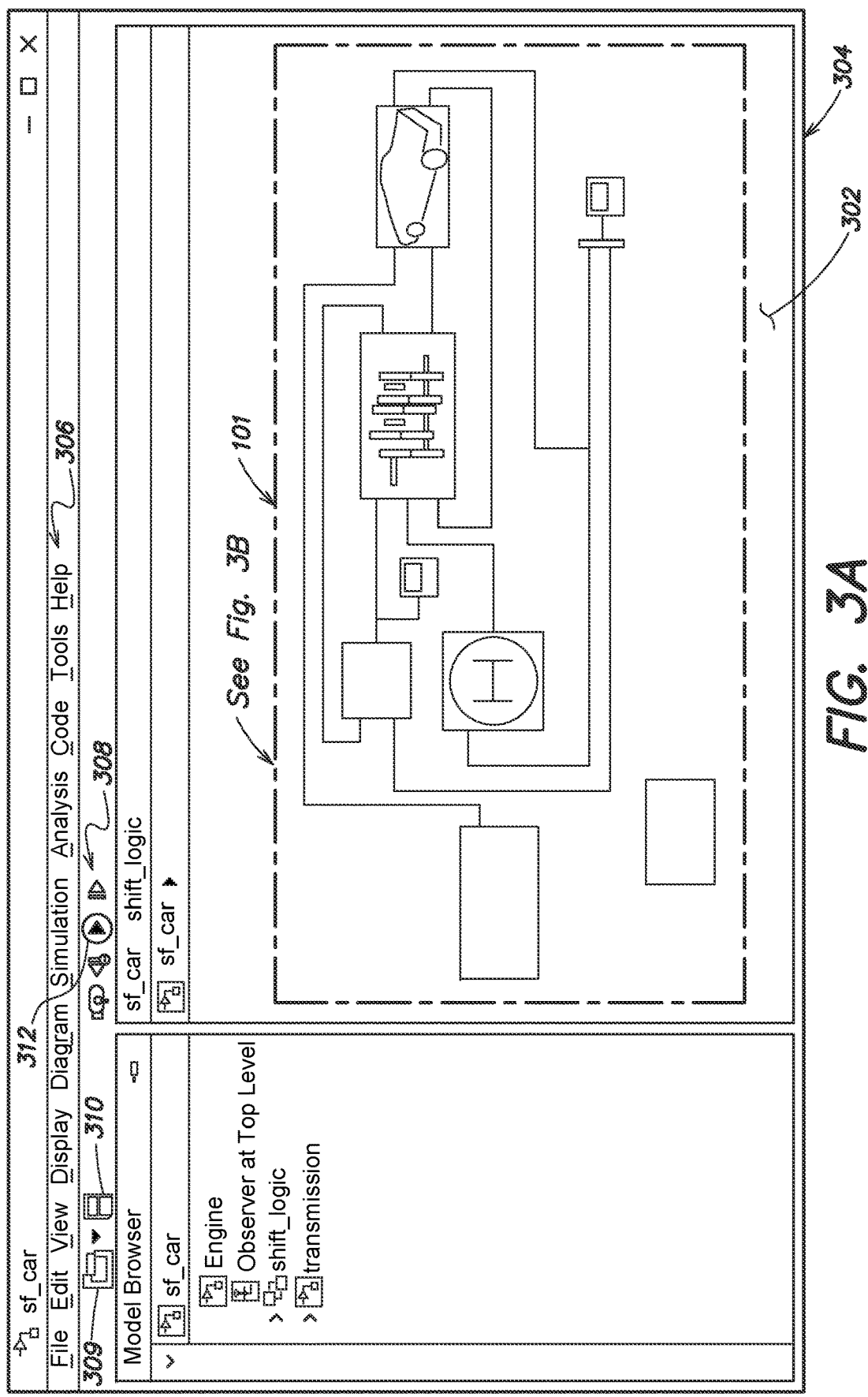
FIGS. 3A-B are partial views of a schematic illustration of an example model in accordance with one or more embodiments.
Figure 3B:
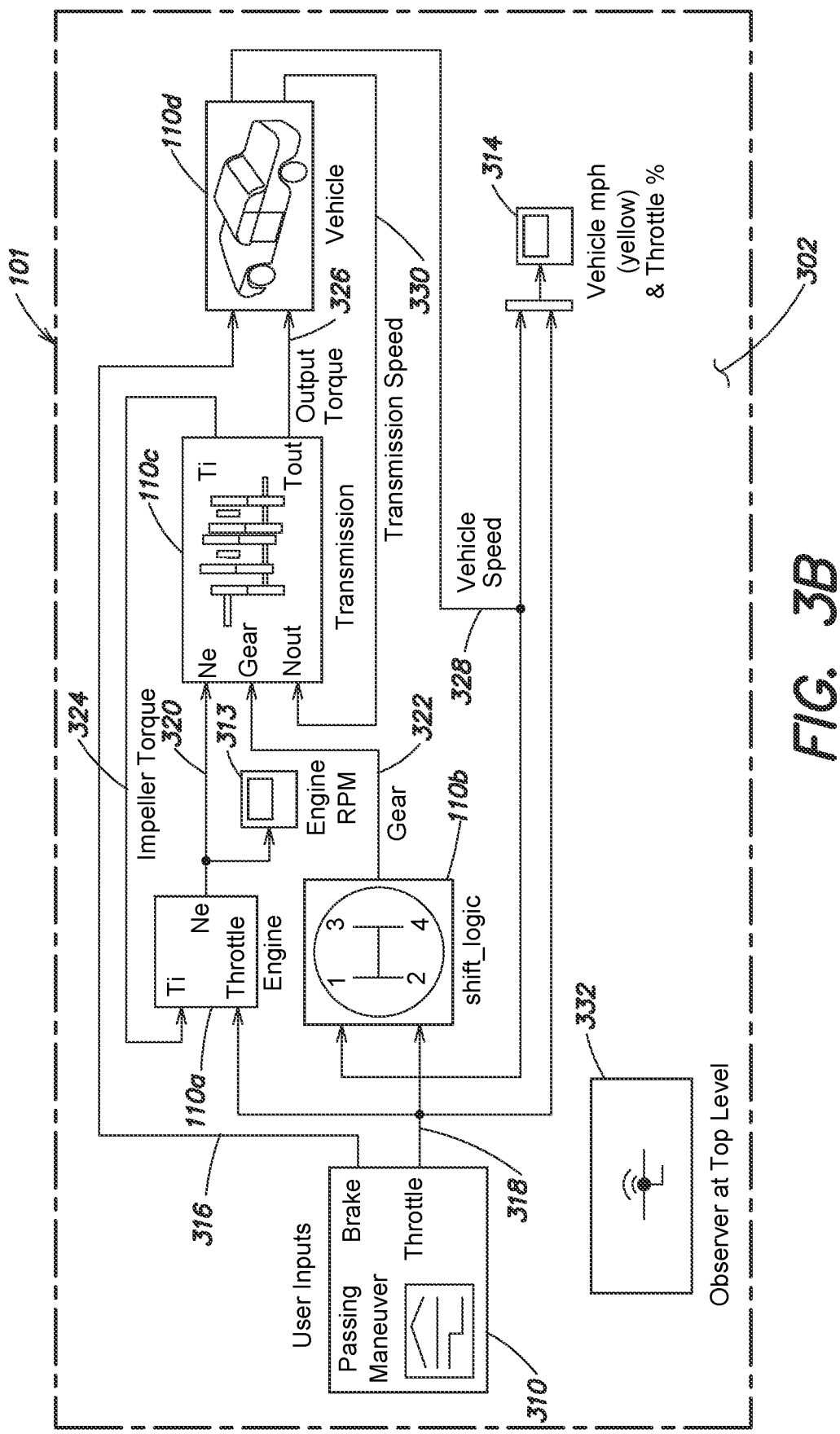

FIGS. 3A-B are partial views of a schematic illustration of the model 101 in accordance with an embodiment. The model 101, which includes four components 110*a-d* named 'Engine', 'shift_logic', 'transmission', and 'vehicle', respectively, may be opened in a model editor, and presented on a canvas 302 of a model editor window 304. The model editor window 304 may be created by the UI engine 202, and presented on a display of a data processing device. The model editor window 304 may include graphical affordances allowing a user to open, construct, edit, run, and save the model 101. In addition to the canvas 302, the model editor window 304 may include other graphical affordances or window elements (widgets), such as a menu bar 306 and a toolbar 308. The toolbar 308 may include a plurality of buttons representing commonly used commands, such as an Open button 309, a Save button, 310 and a Run button 312. In response to a UI event trigger, e.g., the user selecting the Run button 312, the simulation engine 206 may execute the model 101.

Alternatively or additionally, the UI engine 202 may present one or more Command Line Interfaces (CLIs), and one or more text-based commands may be entered in the CLI, e.g., by the user, in order to run a model or to perform other operations.

The modeling environment 200 may include one or more libraries of model element types, and the UI engine 202 may display one or more palettes presenting the various types of model elements, such as blocks, that may be selected and used to construct or revise a model. A user may select a desired model element type from a palette, and cause the model editor window 204 to add an instance of that model element type to the canvas 302. The user also may cause the model editor window 204 to establish relationships among the model elements, for example by linking selected model elements using connection elements. The connection elements may be represented on the canvas 302 through graphical affordances, such as wires, arrows, etc. In some embodiments, some relationships among model elements may not be visually displayed through graphical affordances. At least some model elements may represent dynamic systems, computations, functions, operations, data stores, events, states, state transitions, etc., and connection elements may represent data, control, signals, events, mathematical relationships, state transitions, physical connections, etc. In some embodiments, a group of model elements may be organized into a subsystem or other component, and a group of states, state charts, and/or state transition tables may be organized into a subchart or other component. Components, including custom-created components, may also be saved and stored in a library for re-use in the same or in other models.

The Engine component 110a may model a car engine, the shift_logic component 110b may model a gear shift, the transmission component 110c may model a car transmission, and the Vehicle component 110d may model a car. The model 101 may further include a Signal Builder block 310 named 'User Inputs', and two Scope blocks 312 and 314 named 'engine RPM' and 'vehicle mpg (yellow) & throttle %', respectively. The Signal Builder block 310 may produce a Brake signal, which may be read by the Vehicle component 110d, as indicated by arrow 316, and a Throttle signal, which may be read by the Engine component 110a and the shift_logic component 110b, as indicated by arrow 318. The Engine component 110a may produce an engine speed signal named 'Ne', as indicated by arrow 320. The shift_logic component 110b may produce a gear signal, as indicated by arrow 322. The transmission component 110c may produce an impeller torque signal as indicated by arrow 324 and an output torque signal as indicated by arrow 326. The vehicle component 110d may produce a vehicle speed signal as indicated by arrow 328 and a transmission speed signal as indicated by arrow 330.

The model 101 may include multiple hierarchical levels. FIGS. 3A-B may represent a top hierarchical level view of the model 101, and the components 110a-d may represent additional, e.g., lower hierarchical levels of the model 101. The behavior of the model 101 may need to meet one or more requirements, for example to accurately simulate the car being modeled. To determine whether these requirements are satisfied, the observer builder 106 may add one or more observers to the model 101. In some embodiments, observers may be added at particular hierarchical levels of the model 101. An observer added to one hierarchical level may have access to information, such as signals, data, control, events, state, etc., defined at that hierarchical level and below. For example, information may be inherited down the hierarchy. Another observer added to a different hierarchical level may have access to the information at this other hierarchical level and below.

In some embodiments, the observer builder 106 may add observers in response to user input. For example, the UI engine 202 may present one or more graphical affordances for directing the observer builder 106 to add an observer at a particular hierarchical level of the model 101. An exemplary graphical affordance includes a context menu that may be presented by the UI engine 202 in response to UI events triggered by user input, such as a right mouse click in an empty or blank portion of the canvas 302. The context menu may present commands available to be performed. The particular commands that are presented may depend on the particular context in which the context menu was opened. For example, if the context menu was opened in the top-level of the model, commands available to be performed on the top-level of the model may be presented. If the context menu was opened in a component, commands available to be performed on that component may be presented.

An available command presented in the context menu may be named 'Observer'. If the 'Observer' command is selected, e.g., by the user, the observer builder 106 may add an observer in the hierarchal level of the model 101 in which the context menu was opened, such as the model's top-level. In response to adding an observer to the top-level of the model 101, an observer block, such as observer block 332 named 'Observer at Top Level', may be added to the top level of the model 101. In some embodiments, the observer block 332 may be configured to access information, such as one or more of the signals, of the model 101. For example, the UI engine 202 may present a configuration window or other graphical affordance for the observer block 332, e.g., in response to user input, such as selection of the observer block 332 with a predetermined user input, such as a right mouse click. The configuration window for the observer block 332 may include a list of the signals or other information that can be accessed by the observer block 332, and the user may select one or more of these signals or other information, thereby configuring the observer block 332 to provide access within the verification space 104 to those selected signals or other information. Suppose for example that the user selects the gear signal 332, the output torque signal 326, the vehicle speed signal 328, and the transmission speed signal 330. In some embodiments, the observer builder 106 may configure the observer block 332 with observer port elements, and may assign the selected signals or other information to respective ones of the observer port elements.

In some embodiments, an observer block, such as the observer block 332, may reference and/or be associated with a model, e.g., an observer model, a subsystem, e.g., an observer subsystem, or one or more model elements.

FIG. 4 is a schematic illustration of an example of the observer block 332 as opened in a new model editor window 400, and presented on a canvas 401. The observer block 332 includes observer port elements 402a-d. The observer port element 402a named 'Observer Port' provides access to the gear signal 322 of the model 101. The observer port element 402b named 'Observer Port1' provides access to the vehicle speed signal 328. The observer port element 402c named 'Observer Port2' provides access to the transmission speed signal 330. The observer port element 402d named 'Observer Port3' provides access to the output torque signal 326.

The list of signals or other information that can be accessed by the observer block 332 may be generated or derived from a dependency graph constructed for the model 101. For example, the model analyzer 114 may analyze the model 101 or a portion thereof to determine the model's structure, such as the model elements, components, connections, variables, etc., included in the model 101. The model analyzer 114 may construct a graph, such as a topology graph, for the model 101. The topology graph may include information about the model elements and components included in the model 101, and the signal, data, control, event, or message dependencies among the model elements and components. In some embodiments, the topology graph may be in the form of a dependency graph. The dependency graph may include nodes corresponding to model elements of the model 101, and edges corresponding to the connections and/or dependencies among the model elements. The model analyzer 114 may determine the model's structure by tracing the connections through the model 101, for example backward starting at the model's top-level outputs and/or forward starting at the model's top-level inputs. The dependency graph may be implemented in one or more data structures, such as a linked list, and stored in computer memory, such as volatile or persistent memory.

As initially created, the observer, as represented by the observer block 332, may have limited functionality or may have no functionality. The user may specify custom defined functionality for the observer, for example by adding verification logic to the observer, as indicated by a component 404 named 'Vehicle V&V Logic'. The Vehicle V&V Logic component 404 may include model elements configured to apply assessments or other verification and validation operations to the signals provided by the observer port elements 402a-d. In some embodiments, the Vehicle V&V Logic component 404 may be implemented as a subsystem block. In some embodiments, the observer builder 106 may include templates that provide a skeleton as a starting point for observer functionality. An observer may be added in response to a UI event, such as a user selecting one of these templates. The user may then fill-out the template via the GUI to complete the observer's functionality. The UI engine 202 may utilize one or more graphical affordances to designate the model editor window 400 and/or the canvas as being the validation space 104. For example, the UI engine 202 may include a badge 406 on the canvas 401.

Figure 5:
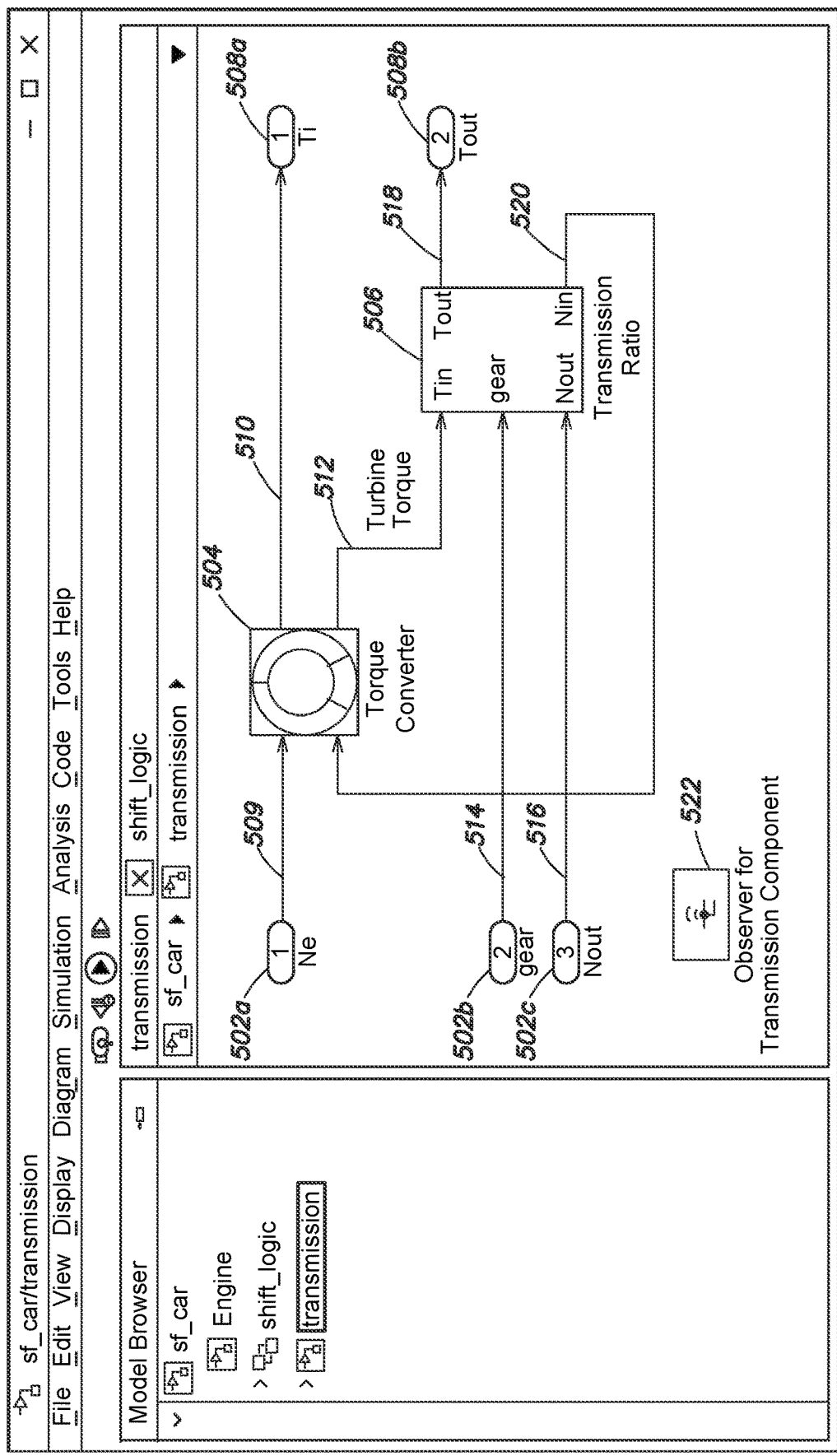
FIG. 5 is a schematic illustration of an example component of the model of FIGS. 3A-B in accordance with one or more embodiments.

As noted, observers may be added to different hierarchical levels of the model 101, and linked to those levels, e.g., to the component corresponding to the respective hierarchical level. FIG. 5 is a schematic illustration of the transmission component 110c as opened in a new model editor window 500. The transmission component 110c includes three Inport blocks 502a-c that receive the engine speed (Ne) signal 320, the gear (gear) signal 322, and the transmission speed (Nout) signals, respectively. The transmission component 110c also includes two components 504 and 506 named 'Torque Converter', and 'transmission ratio', respectively. The transmission component 110c further includes two Outport blocks 508a, 508b that provide the impeller torque (Ti) and the output torque (Tout) signals, respectively. The engine speed (Ne) signal is read by the Torque Converter component 504 as indicated by arrow 509. The Torque Converter component 504 produces the impeller torque (Ti) signal as indicated at arrow 510 and Outport block 508a. The Torque Converter component 504 also may produce a signal 512 named 'turbine torque' (Tin), which may be read by the transmission ratio component 506. The gear and the transmission speed (Nout) signals may be read by the transmission ratio component 506 as indicated by arrows 514 and 516. The transmission ratio component 506 may produce the output torque signal as indicated by arrow 518 and Outport block 508b. The transmission ratio component 506 also may produce a signal as indicated by arrow 520, which may be read by the Torque Converter component 504. Portions of the transmission component 110c may be configured to have values for their attributes determined by inheritance, e.g., from other model elements or components. For example, attributes, such as data type, data complexity, sample mode, and sample time or rate, may be inherited. Furthermore, the order of execution of the model elements that form the transmission component 110c may depend on which model elements are connected to the transmission component 110c.

The operation of the transmission component 110c may need to meet one or more requirements, for example to ensure it mimics operation of a car's transmission to an acceptable degree of accuracy. To determine whether these requirements are satisfied, the observer builder 106 may add one or more observers to the hierarchical level represented by the transmission component 110c, such as an observer block 522 named 'Observer for Transmission Component'. The observer builder 106 may add the observer block 522 to the editor window 500 in which the transmission component 110c is opened in response to user input.

The modeling environment 200 may be configured to include an observer block type, and may instantiate instances of observer blocks from this block type. The observer block 522 may be configured to access information, such as data, control, signals, states, messages, events, etc., included in the hierarchical level represented by the transmission component 110c. For example, the UI engine 202 may present a properties page for the observer block 522, and the properties page may include a list of the information, such as signals in the design space, accessible by the observer block 522 in the verification space. The user may select some of this information, such as one or more signals, via a GUI, thereby configuring the observer block 522 to provide access to the one or more selected signals in the verification space. In this manner, an observer port element may be linked or associated to a component from which signals or other information in the design space are accessed within the verification space. The observer builder 106 may obtain this list of information by analyzing the model 101 and/or a topology or dependency graph for the model 101. Suppose for example that the user selects the gear signal 514, the turbine torque signal 512, and the output torque signal 518. In some embodiments, the observer builder 106 may configure the observer block 518 with observer port elements for the selected signals. The observer port elements may operate as virtual test points providing signals or other information from the design space into the verification space.

Figure 6:
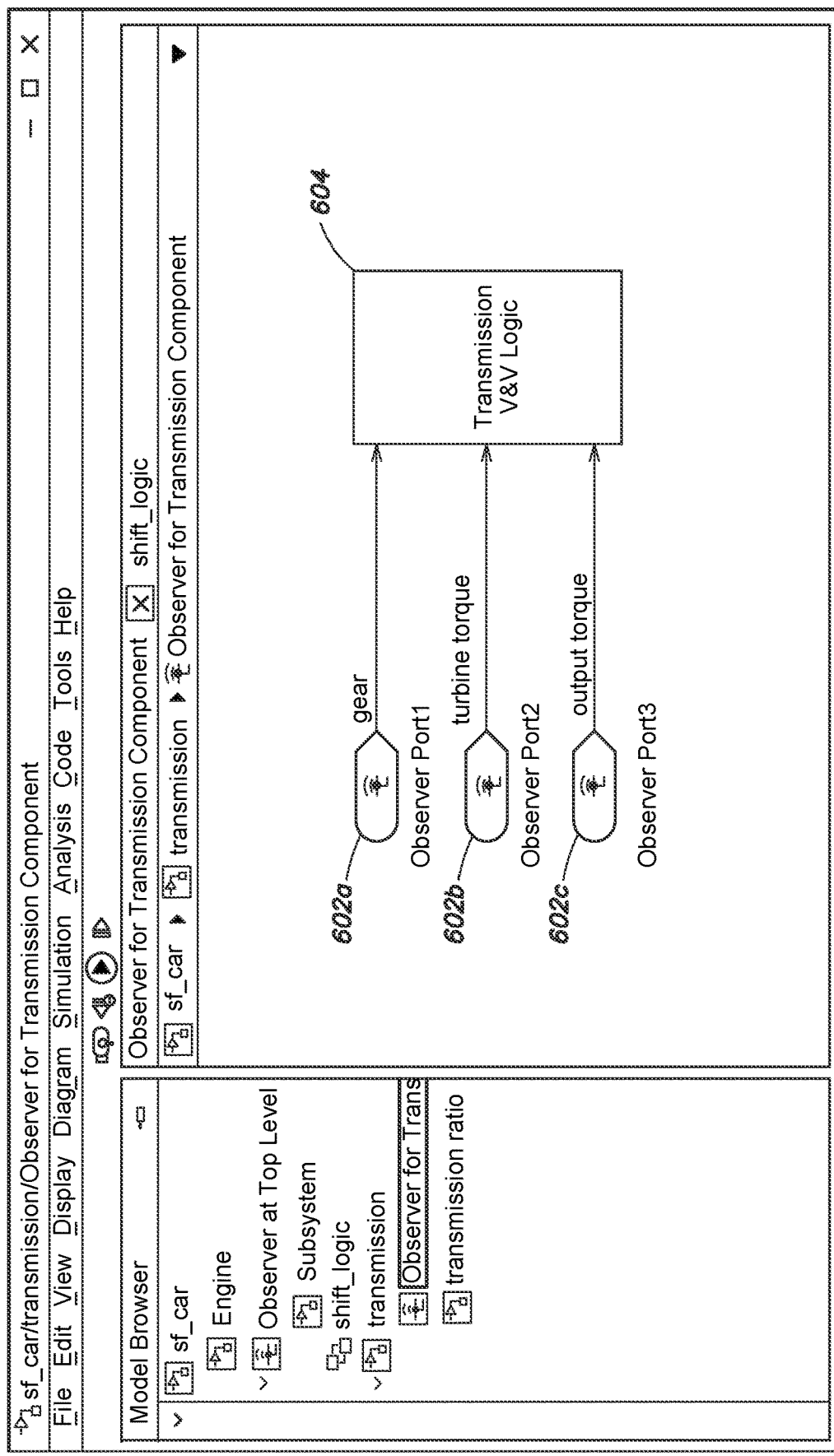
FIG. 6 is a schematic illustration of an example observer in accordance with one or more embodiments.

FIG. 6 is a schematic illustration of an example of the observer block 518 as opened in a new model editor window 600. The observer block 518 includes observer port elements 602a-c. The observer port element 602a named 'Observer Port1' provides access to the gear signal 514 of the transmission component 110c. The observer port element 602b named 'Observer Port2' provides access to the turbine torque signal 512. The observer port element 602c named 'Observer Port3' provides access to the output torque signal 518.

In addition to the observer port elements 602a-c, the observer block 522 may include a component 604 named 'Transmission V&V Logic'. The Transmission V&V Logic component 604 may include model elements configured to apply assessments or other verification and validation operations to the signals provided by the observer port elements 602a-c. The Transmission V&V Logic component 604 may be implemented as a subsystem block. Model elements included in the observer block 332 may have one or more attributes, such as data type, data complexity, sample mode, and sample time or rate, set to particular values.

The model 101 including the observers 112a-c may be executed. Even though the observers 112a-c are linked to the components 110a-c, values of attributes set at the observers 112a-c, such as within the observer block 332, are not propagated to the components 110a-c. For example, attributes of the observers may be private or contained within the verification space, and thus remain inaccessible to the design space, so as to prevent the creation of computational artifacts during model execution. In some embodiments, by virtue of the partitioning of the model 101 into the design space 102 and the verification space 104, the simulation engine 206 may treat the design space 102 and the verification space 104 as separate, independent models for purposes of execution. For example, they may each be separately compiled, linked, and executed.

Figure 7:
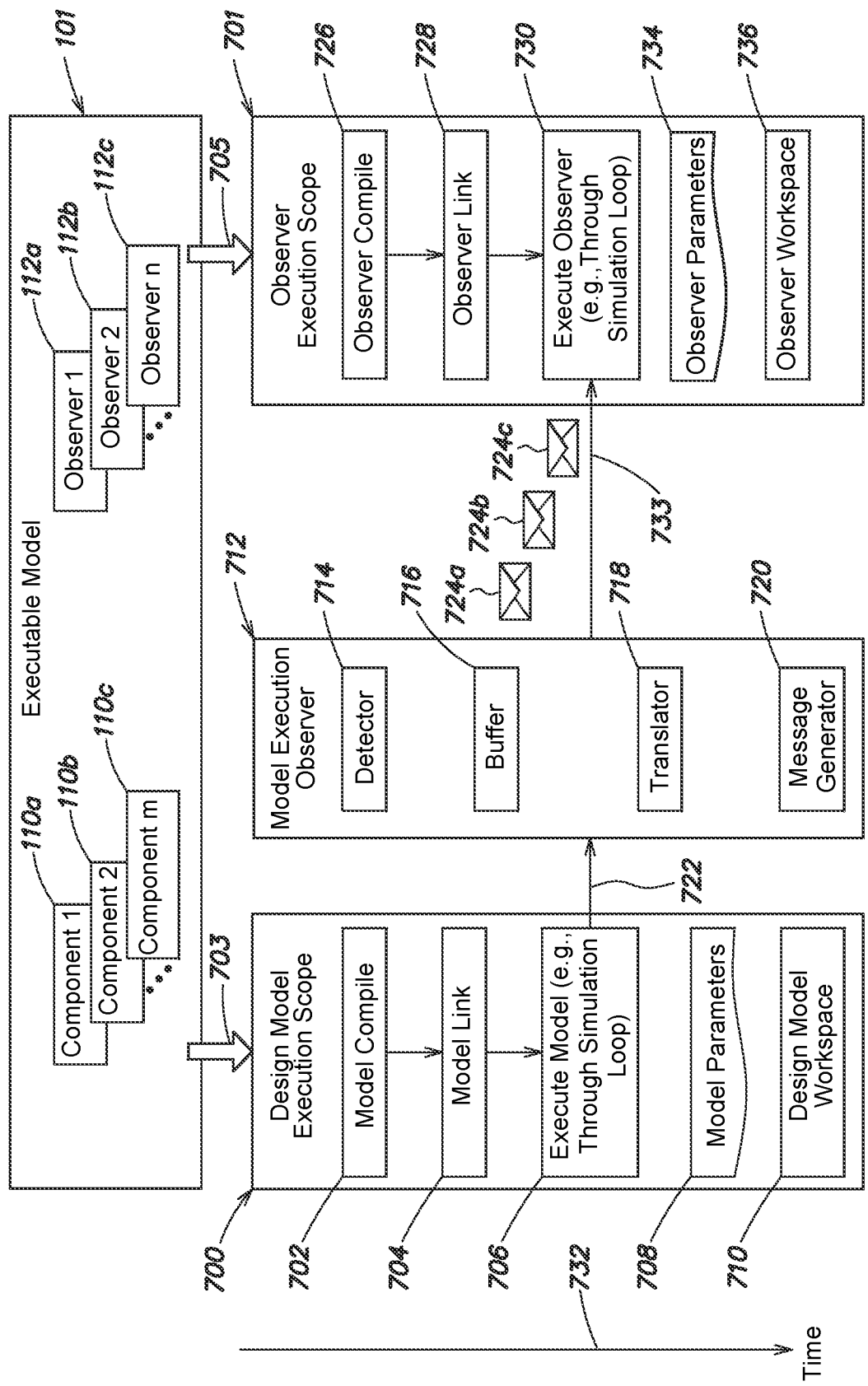
FIG. 7 is a schematic illustration of an example execution flow of a model including an observer in accordance with one or more embodiments.

FIG. 7 is a schematic illustration of an example execution flow of the executable model 101 including the observers 112a-c. In some embodiments, the modeling environment 200 may establish multiple, separate execution scopes for the model 101. For example, it may establish a design model execution scope 700 and an observer execution scope 701. Furthermore, even though the components 110a-c and the observers 112a-c are included in the model 101, the observer builder 106 (or the modeling environment 200) may assign the components to the design model execution scope 700 for execution, as indicated by arrow 703, and the observers 112a-c to the observer execution scope 701 for execution, as indicated by arrow 705. In this way, the simulation engine 206 may execute the components 110a-c separately from the observers 112a-c. The simulation time of an observer may be kept separate from the simulation time of a design model to ensure that the computational accuracy of the design model is not affected by execution of the observer. In some embodiments, the design space 102 (FIG. 1) may be realized by the design model execution scope 700, and the verification space 104 may be realized by the observer execution scope 701. For example, the design space 102 and the verification space 104 may be separated during execution within their respective execution scopes, but remain unified during editing within the modeling environment 200. Furthermore, observers 112 within the verification space 104 can view information, e.g., signals, variables, data, control, parameters, messages, events, function calls, etc., generated within the design space 102.

The simulation engine 206 may first generate execution instructions for the portion of the model 101 included in the design space 102. The generation of execution instructions, and the simulation of a model may be carried out through a plurality of stages, such as a model compile stage 702, a model link stage 704, and an execution stage 706. Model execution may involve processing input data and generating output data. In an embodiment, execution of the portion of the model 101 included in the design space 102 may be carried out over a time span, e.g., a simulation time, which may be user specified or machine specified. The simulation time is a logical execution time, and may begin at a simulation start time and end at a simulation end time. At successive points in time between the simulation start and end times, which points in time may be called simulation time steps, model data, such as block inputs, block outputs, e.g., signals, block states, states of state charts, states of state machines, entity values, token values, workspace variables, data dictionary variables, function calls, and block parameters of the portion of the model 101 included in the design space 102 may be computed. The simulation engine 206 and/or solver 216 may make model data available to model elements, e.g., blocks, during execution. For example, the simulation engine 206 and/or solver 216 may set the block output computed by one block, e.g., a Gain block, as the block input of another block, e.g., a Scope block.

In addition, intrinsic execution events may be generated by the simulation engine 206 and/or the solver 216 during execution of a model. Intrinsic execution events may be intrinsic to the simulation engine 206 and/or solver 216 meaning they are not made available to or otherwise accessible by model elements, e.g., blocks, during execution of a model. That is, the simulation engine 206 and/or the solver 216 may not expose or reveal intrinsic execution events, for example to model elements. Intrinsic execution events may be generated as part of the execution of a model in response to the occurrence of particular conditions. Exemplary intrinsic execution events, at least some of which may be referred to as exceptions, include the computation of a value that is a not a number (NaN) value, the occurrence of a divide-by-zero operation, the computation of a value of infinity (inf), variable overflow, change to a tunable parameter, failure of the solver to converge to a solution, block sorted order, method execution list, and the detection of a variable, such as a signal, crossing zero. A NaN value may be a numeric data type defined by the modeling environment 200 for use when an operation returns an undefined numeric result, such as division by zero. A variable overflow may occur if the simulation engine 206 computes an ideal value for the variable, e.g., a signal, and the range of the variable's data type is not large enough to accommodate the ideal value. For example, if the ideal value computed for a variable is 200, and its data type is signed 8-bit integer (int8), an overflow execution event may occur since the maximum value that int8 can represent is 127. A tunable parameter refers to a global or block parameter whose value may be changed during initialization or during later stages of execution of the model. The value of a tunable parameter may be changed programmatically or through user input, e.g., through a graphical affordance, such as a dial, slider, data entry box, etc. The sizes of the time steps may be fixed or may vary, and may be determined by the particular solver 216 used in the execution of the portion of the model 101 included in the design space 102. Execution instructions may be generated for the entire simulation time.

It should be understood that the above listing of intrinsic execution events is exemplary, and that the simulation engine 206 and/or solvers 216 may issue other intrinsic execution events, including other intrinsic execution events, during execution of a model.

In addition, a model may include one or more state diagram models having states, conditions for transitions among the states, and activations performed while a given state is active. Execution of a state diagram model may be driven by events that occur outside or inside the state diagram model. An event may trigger an action to be executed. An action may include a function call, a broadcast event, a variable assignment, a state transition evaluation, etc. Furthermore, the action may be executed as part of a transition from one state to another, or based on a status of a state. A transition may have a condition action or a transition action. A condition action may be executed as soon as the condition is evaluated to be true but before the transition takes place. A transition action may be executed after the transition takes place. In some embodiments, an observer may be configured to monitor one or more of discrete state activations, state transitions, state transition actions, state transition conditions, and discrete state actions of a state diagram included in a model. For example, an observer port may be configured to observe and count the number of transitions during one event epoch, the number of state entry, during, or exit actions performed during an event epoch, the execution of inner transitions, the execution of history states, transitions across state hierarchies, etc.

An exemplary state diagram modeling system is described in U.S. Pat. No. 8,364,456 for Conditionally Executed States to Raghavan et al., which is hereby incorporated by reference in its entirety. An exemplary state diagram modeling system is the Stateflow® simulation modeling environment from The MathWorks, Inc.

Model Compilation Phase

The model compile and link stages 702, 704 may be performed by the model compiler 214 of the simulation engine 206. A compile stage may mark the start of execution of the portion of the model 101 included in the design space 102, and may involve preparing data structures and evaluating parameters, configuring and propagating model element characteristics, determining model element connectivity, and performing model element reduction and model element insertion. The preparation of data structures and the evaluation of parameters may result in the creation and initialization of one or more data structures for use in the compile stage 702. For the elements of the portion of the model 101 included in the design space 102, a method may force a model element to evaluate all of its parameters, and this method may be called for the model's elements. If there are any unresolved parameters, execution and/or compilation errors may be thrown. During the configuration and propagation of model element and port/signal characteristics, the compiled attributes (such as data dimensions, data types, complexity, sample modes, and sample time) of each model element and/or port/signal may be setup on the basis of the corresponding behaviors and the attributes of model elements and/or port/signal that are connected to the given model element and/or port/signal, which connections may be graphically represented on the canvas depicting the model through lines, arrows or other connectors. The attribute setup may be performed through a process during which model element behaviors "ripple through" the model from one model element to the next following signal, state, physical, message or other connectivity among model elements.

This process is referred to as inferencing, an implementation of which is propagation. In the case of a model element that has explicitly specified its model element (or port) behaviors, propagation helps ensure that the attributes of the model element (or port) are compatible with the attributes of the model elements (or ports) connected to it. If not, a warning or an error may be issued. Secondly, in many cases, model elements (or ports) are implemented to be compatible with a wide range of attributes. Such model elements (or ports) may adapt their behavior in accordance with the attributes of the model elements (or ports) connected to them. The exact implementation behavior of the model element may be chosen on the basis of the model in which the model element finds itself. However, values of attributes set at the observers 112a-c may be blocked from propagating to the model elements included in the portion of the model 101 in the design space 102, for example due to the partitioning of the model 101 into the design space 102 and the verification space 104. Attributes of the verification space 104 may not be propagated, e.g., distributed, to model elements in the design space 102, so as to prevent altering the computational accuracy of the components 110 in the design space 102.

Included in the compilation step may be other aspects such as validating that all rate-transitions yield deterministic results, and that the appropriate rate transition blocks and/or delay blocks are being used. The compilation step also may determine actual model element connectivity. For example, virtual blocks, such as subsystem, Inport, and Outport blocks, among others, may play no semantic role in the execution of a model. In this step, the virtual blocks may be optimized away, e.g., removed, and the remaining non-virtual blocks may be reconnected to each other appropriately. This compiled version of the portion of the model 101 included in the design space 102 with actual model element connections may be used from this point forward in the execution process. The way in which model elements are interconnected in the portion of the model 101 included in the design space 102 does not necessarily define the order in which the equations (e.g., included in methods) corresponding to the individual model elements will be solved (executed). These equations may include outputs equations, derivatives equations and update equations.

Model element sample times may also be determined during the compilation stage. A model element's sample time may be set explicitly, e.g., by setting a SampleTime parameter of the model element, or it may be determined in an implicit manner based on the model element's type or its context within the model. The SampleTime parameter may be a vector $[T_s, T_o]$ where $T_s$ is the sampling period and $T_o$ is the initial time offset.

The selected solver 112 may determine the size of the simulation time steps for the simulation of the portion of the model 101 included in the design space 102, and these simulation time steps may be selected to correspond with the sample times of the model elements of the portion of the model 101 included in the design space 102. When a simulation time step matches the sample time for a model element, a sample time hit occurs, and the model element is scheduled for execution during that simulation step.

Execution lists for the model elements of the portion of the model 101 included in the design space 102 may be generated. For example, the solvers 216a-c may include or access one or more schedulers that may generate execution lists for the blocks of the model 101, such as a block sorted order list and a method execution list may be generated. The block sorted order may identify the order in which to invoke block methods during simulation of the model 101. The schedulers may utilize one or more algorithms for generating the block sorted order and method execution lists. For example, a static scheduler may use the Rate Monotonic Scheduling (RMS), Earliest Deadline First Scheduling, Static Cyclic Scheduling, Round Robin Scheduling, or Deadline Monotonic Scheduling. A dynamic scheduler may use an event calendar to schedule future events, such as timeouts and alarms.

Link Phase

In the link stage 704, memory may be allocated and initialized for storing run-time information for model elements of the portion of the model 101 included in the design space 102.

During the model compile and/or link phases 702, 704, one or more in-memory representations, such as intermediate representations (IRs), of the portion of the model 101 included in the design space 102 may be generated, e.g., by the IR builder 218. The IRs may be implemented as graphs, such as a data, control, call or data/control/call flow graphs, that include a plurality of nodes and edges. The nodes may represent the model elements and components of the model 101, and the edges may represent connections, such as signals, state transitions, messages, events, defined within the portion of the model 101 included in the design space 102. Special nodes, called network instance components (NICs), may be used to provide hierarchy in the IR by abstractly representing subsystems or other virtual blocks of the portion of the model 101 included in the design space 102. The IR may include a plurality of hierarchically arranged levels. For example, there may be a top-level of IR and one or more of the components of the top-level IR may be a particular type or form of in-memory representation. For example, one or more components of the IR may be a Control Flow Graph (CFG), Data Flow Graph (DFG), Control Data Flow Graph (CDFG), program structure tree (PST), abstract syntax tree (AST), a netlist, etc. A CDFG may capture the control flow as well as the data flow of the portion of the model 101 included in the design space 102 through data dependency and control dependency edges. The model compiler 214 may apply one or more optimization techniques to an IR resulting in the creation of additional IRs. The IRs may be stored in memory, such as main memory, of a data processing device.

Code Generation and Model Execution Phase

Following the model compilation and link stages, code may or may not be generated for the portion of the model 101 included in the design space 102. If code is generated, the portion of the model 101 included in the design space 102 may be executed through an accelerated execution mode in which the portion of the model 101 included in the design space 102, or portions of it, is translated into either software modules or hardware descriptions, which is broadly referred to herein as code. If this stage is performed, then the stages that follow use the generated code during the execution of the portion of the model 101 included in the design space 102. If code is not generated, the portion of the model 101 included in the design space 102 may execute in an interpretive mode in which the compiled and linked version of the portion of the model 101 included in the design space 102 may be directly utilized to execute the portion of the model 101 included in the design space 102 over the simulation time. Upon reaching the model execution stage 706, the simulation engine 206 may use a simulation loop to execute block methods in a pre-defined order upon a sample hit to produce the system responses as they change with time.

If the portion of the model 101 included in the design space 102 is a single rate model, execution of the portion of the model 101 included in the design space 102 may occur in a single task. If the portion of the model 101 included in the design space 102 is a multi-rate model, the simulation engine 206 may utilize a separate task for each rate.

When executing the portion of the model 101 assigned to the design model 765 execution scope 700, e.g., the components 110*a-c*, the simulation engine 206 may utilize values set for one or more model-level parameters as indicated at 708. The simulation engine 206 may store and utilize values at a design model workspace as indicated at 710.

In some embodiments, a model execution observer 712 may be provided. The model execution observer 712 may observe model data, such as block inputs, block 770 outputs, e.g., signals, states of state charts, states of state machines, entity values, token values, workspace variables, data dictionary variables, function calls, model events, and block parameters, during execution of the components 110*a-c* in the design model execution scope 700. The model execution observer 712 may also observe intrinsic execution events generated by the simulation engine 206 and/or the solver 216 during execution of the components 110*a-c* in the design model execution scope 700. The model execution observer 712 may include a detector 714, a buffer 716, a translator 718, and a message generator 720. The detector 714 may monitor the values of model data, such as signals (or other information), that have been associated with the observer port elements of the observers 112*a-c*, as indicated by arrow 722. The detector 714 may also listen for intrinsic execution events occurring during execution of the components 110*a-c*, as also indicated by arrow 722. In some embodiments, the simulation engine 206 and the solvers 216*a-c* may be configured to expose intrinsic execution events through an Application Programming Interface (API). Through the API, clients, such as the model execution observer 712, may now access what had been internal, e.g., intrinsic execution events of the simulation engine 206 and/or the solvers 216*a-c*. For example, the detector 714 may access selected intrinsic execution events by communicating with the simulation engine 206 and/or the solvers 216*a-c* through this API. The detector 714 may use the API to request notification from the simulation engine 206 and/or the solvers 216*a-c* when certain intrinsic execution events occur during execution of a model. For example, the detector 714 may register with the simulation engine 206 and/or the solvers 216*a-c* as a listener of the occurrence of intrinsic execution events, and the simulation engine 206 and/or the solvers 216*a-c* may issue notifications regarding the occurrence of the selected intrinsic execution events to the detector 714.

The model execution observer 712 may store the values of the model data, such as signals (or other information), and the intrinsic execution events in the buffer 716. The model execution observer 712 may also store in the buffer 716 the simulation time step at which the respective model data was computed by the simulation engine 206. Furthermore, the model execution observer 712 may store initial or default values for the model data in the buffer 716. Information indicating the mapping of model data and/or intrinsic execution events to observers and/or observer port elements may also be included in the buffer 716.

The translator 718 may package the values and/or the intrinsic execution events into a form that is compatible for use within the observer execution scope 701. Exemplary transformations include concatenation, aggregation, drop all but first/last, drop all but highest/lowest, etc. The message generator 720 may generate one or more messages, such as messages 724*a-c*, whose payloads contain the observed values and/or the intrinsic execution events, for example as packaged by the translator 718.

In other implementations, the simulation engine 206 may log values for the signals (or other information) and/or the intrinsic execution events mapped to the observer port elements of the observers 112*a-c* to the buffer 716, during execution of the portion of the model 101 included in the design space 102. The buffer 716 may be a double buffer. The buffer 716 may be a circular buffer.

As illustrated in FIG. 7, the simulation engine 206 may also execute the observers 112*a-c*, and execution of the observers 112*a-c* may be separate from the execution of the portion of the model 101 included in the design space 102. Like the portion of the model 101 included in the design space 102, execution of the observers 112*a-c* may proceed through a plurality of stages including an observer compile stage 726, an observer link stage 728, and an execute observer stage 730, which may include similar procedures as described above. Execution of the observers 112*a-c* may follow, e.g., occur after, execution of the portion of the model 101 included in the design space 102, as indicated by physical time line 732. For example, upon completing execution of the portion of the model 101 included in the design space 102, the next operation or action taken by the simulation engine 206 may be execution of the observers 112*a-c*. In some embodiments, one or more of the observer compile 726 and the observer link 728 stages may occur in parallel with the execution of the portion of the model 101 included in the design space 102, while the execution stage 730 for the observers 112*a-c* may follow execution of the portion of the model 101 included in the design space 102. Execution of the portion of the model 101 in the design space 102 may be scheduled asynchronous to the execution of the observers 112 in the verification space 104, e.g., using the buffer 716 to align information from the design model execution scope to the observer execution scope.

As described, the modeling environment 200 may perform the compile, link, and simulation loop stages separately for the portion of the model 101 included in the design space 102 and for the observers 112a-c. For example, the stages may be performed for the portion of the model 101 included in the design space 102 first, followed by performance of the stages for the observers 112a-c. During the execution stage 730 for the observers 112a-c, the messages 724a-c may be accessed by the simulation engine 206 and/or solver 216, as indicated by arrow 733, and the information in the payloads may be read out and utilized. For example, input and/or output values of the components 110a-c as computed during execution of the portion of the model 101 included in the design space 102 and/or intrinsic execution events, such as exceptions, generated during execution of the portion of the model 101 included in the design space 102 may be included in the payloads, and these values may be read and utilized during the simulation loop stage 730 of the observers 112a-c.

In some embodiments, the simulation engine 206 may align the simulation time steps for which the values of the signals (or other information) were computed by the portion of the model 101 included in the design space 102 with the simulation time steps of the observers 112a-c. For example, the same solver 216 may be used to execute the portion of the model 101 included in the design space 102 and the observers 112a-c. In some embodiments, a different solver 216 may be used by the simulation engine 206 when executing the observers 112a-c as compared to the solver 216 used when executing the components 110a-c. Whether the same or different solvers are used, the simulation time steps determined when executing the components 110a-c may not exactly match the simulation time steps determined when executing the observers 112a-c. In some embodiments, one or more solvers 216, such as a continuous solver, may subdivide the simulation time span over which a model is executed into major and minor time steps. A minor time step may represent a subdivision of the major time step. The solver 216 may produce a result at each major time step. The solver 216 may use results at the minor time steps to improve the accuracy of the result at the major time step. The simulation engine 206 may align major time steps between the portion of the model 101 included in the design space 102 and the observers 112a-c. In some embodiments, the simulation engine 206 may not align minor time steps between the model 101 and the observers 112a-c.

Furthermore, even if the simulation engine 206 runs the observers 112 in such a way that a given time step matches the execution of the components 110, the values computed for the components 110 during that given time step may not be in a form expected or usable by the simulation engine 206 during execution of the observers 112. As described, the translator 718 may translate, e.g., package, the values of signals (or other information) and/or intrinsic execution events in a form suitable for use by the simulation engine 206 during execution of the observers 112.

As with the portion of the model 101 included in the design space 102, if a given observer 112 is a single rate model, execution of the observer 112 may occur in a single task. If a given observer 112 is multi-rate, the simulation engine 206 may utilize a separate task for each rate. If the portion of the model 101 included in the design space 102 and the observers 112a-c operate at the same rate, the simulation engine 206 may still utilize separate tasks for the execution of the portion of the model 101 included in the design space 102 and the observers 112a-c.

When executing the observers 112a-c, which are assigned to the observer execution scope 701, the simulation engine 206 may utilize values set for one or more model-level parameters as indicated at observer parameters 734. The simulation engine 206 may store and utilize values at an observer workspace as indicated at 736. The observer parameters 734 and the observer workspace 736 may be different and separate from the model parameters 708 and the design model workspace 710 utilized during execution of the components 110a-c.

The multiple observers 112a-c associated with the model 101 may be batch processed by the simulation engine 206, for example in the same or in different tasks. In some embodiments, multiple observer execution scopes may be established for executing the observers 112-a-c, for example one observer execution scope per observer.

In some embodiments, one or more of the observers 112 may have different operation modes. For example, an observer may have one operation mode in which the observer is activated and executed, and presents one or more verification results, e.g., on a display. An observer may also include another operation mode in which the observer is activated and executed, but does not present verification results, e.g., on the display. An observer may have a further operation mode in which the observer is not executed. In other operation modes, execution of an observer may be conditionally triggered or conditionally enabled. For example, an observer may be provided with a control input. For conditionally triggered operation, the simulation engine 206 may execute the observer 112 when the control input matches a selected trigger event. Examples of trigger events include rising, falling, and either. For a rising trigger event, the simulation engine 206 executes the observer 112 when the control signal rises from a negative or zero value to a positive value or to zero if the initial value is negative. For a falling trigger event, the simulation engine 206 executes the observer 112 when the control signal falls from a positive or zero value to a negative value or to zero if the initial value is positive. For an either trigger event, the simulation engine 206 executes the observer 112 when the control signal is either rising or falling. For conditionally enabled operation, the simulation engine 206 may only execute the observer 112 when the control signal has a positive value. Values for the control signal for the conditionally triggered and conditionally enabled observers 112 may be defined within the portion of the model 101 included within the design space 102 or within the observer 112.

Iteration

Figure 18:
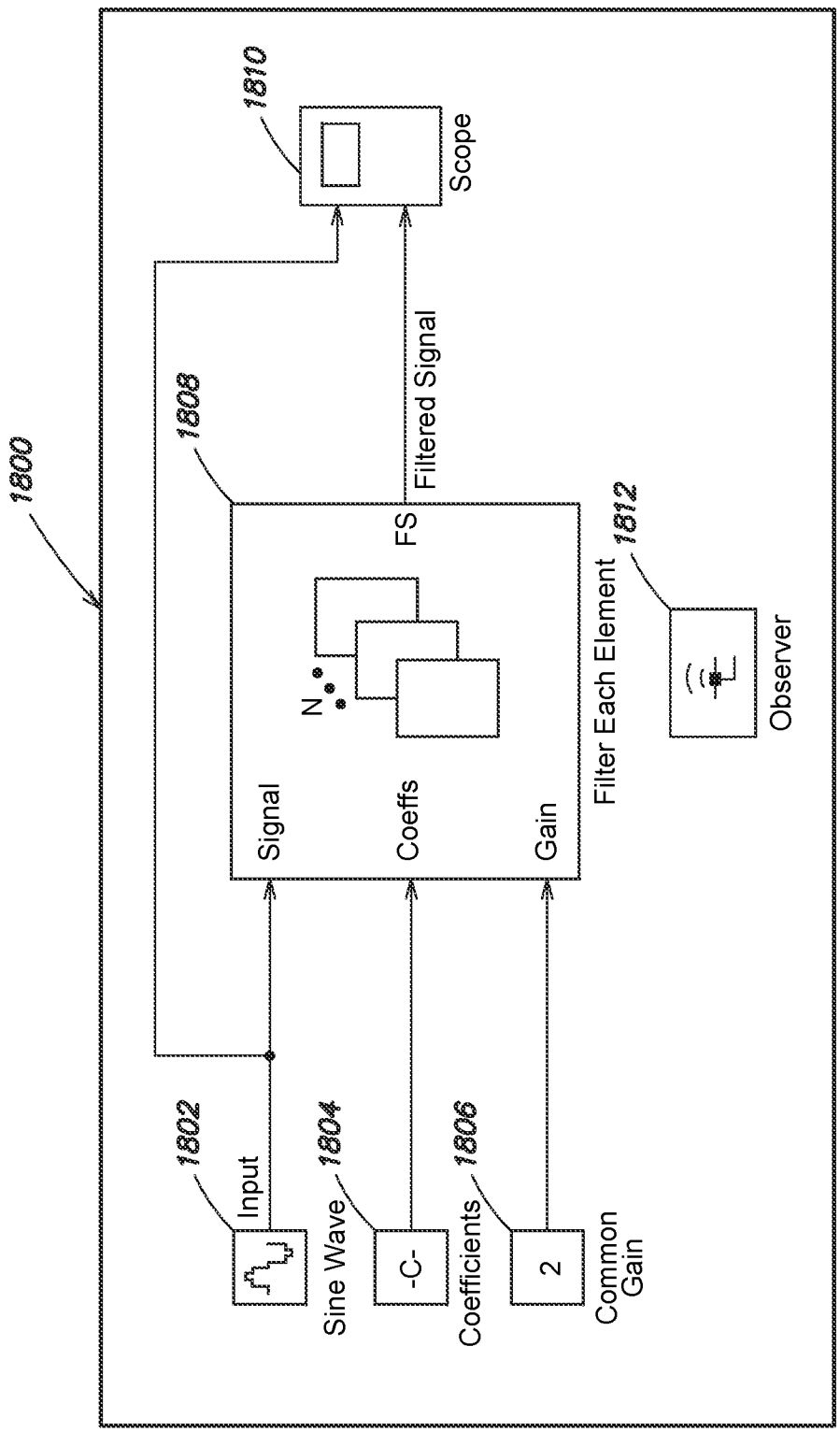
FIG. 18 is a schematic illustration of an example model in accordance with one or more embodiments.

FIG. 18 is a schematic illustration of an example model 1800 in accordance with one or more embodiments. The model 1800 includes a Sine Wave block 1802 named 'Sine Wave' that sources a sine wave signal, two Constant blocks 1804 and 1806 named 'Coefficients' and 'Common Gain' that source constant values, a For Each subsystem 1808 named 'Filter Each Element', and a Scope block 1810. A For Each subsystem, such as the For Each subsystem 1808, may contain a set of model elements, e.g., blocks, that define an algorithm. At each simulation time step at which a For Each subsystem is executed, it receives an input signal that includes multiple elements. The For Each subsystem repeats execution of the algorithm on each element of the input signal during that simulation time step and concatenates the results. The model 1800 further includes an Observer block 1812.

Figure 19:
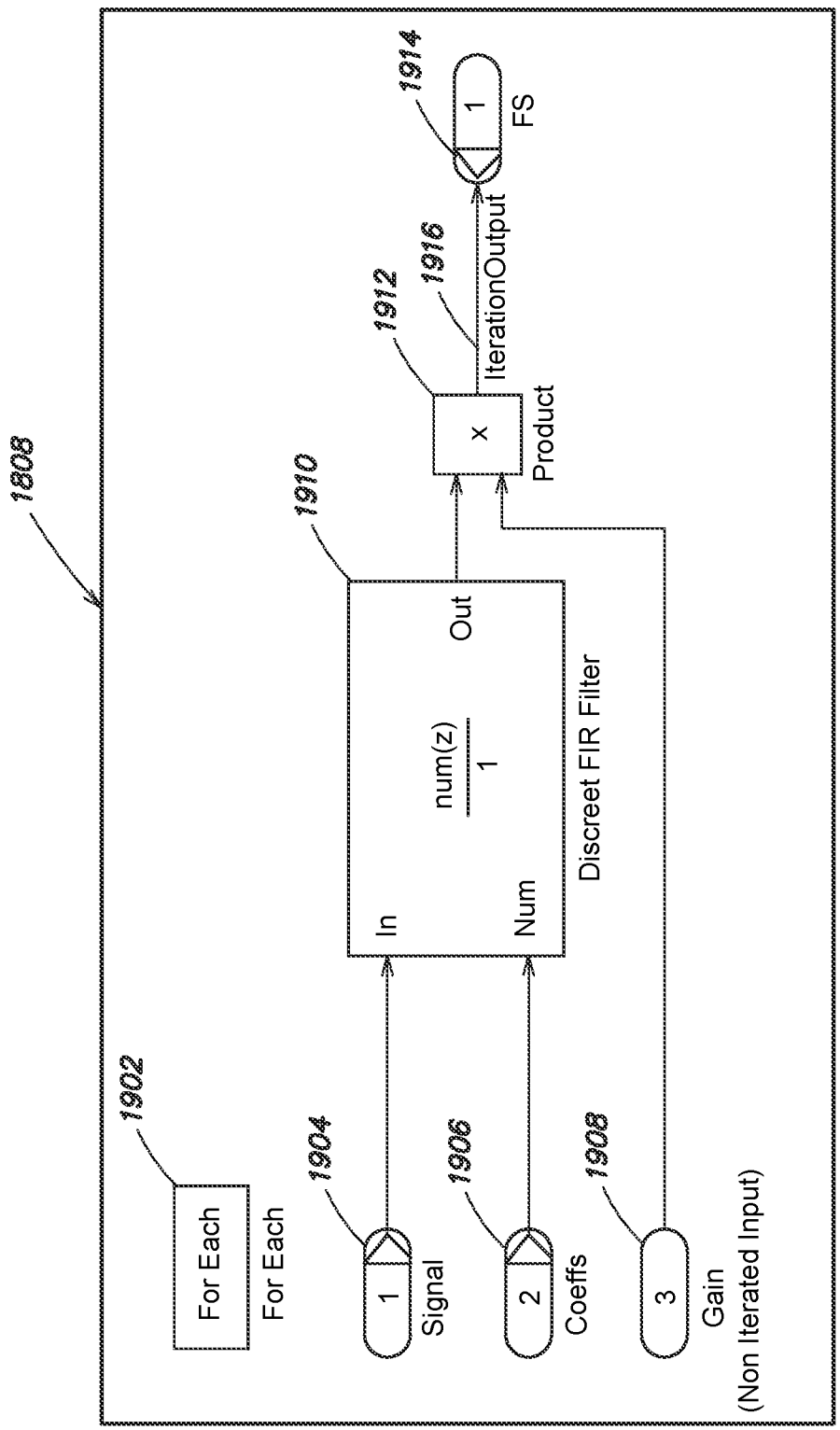
FIG. 19 is a schematic illustration of a subsystem included in the example model of FIG. 18 in accordance with one or more embodiments.

FIG. 19 is a schematic illustration of the For Each subsystem 1808 as opened to show its contents. The For Each subsystem 1808 includes a For Each configuration block 1902, two iterated Inport blocks 1904 and 1906 named 'Signal' and 'Coeffs', a non-iterated Inport block 1908 named 'Gain', a Discrete Filter block 1910 named 'Discrete FIR Filter', a Product block 1912, and an iterated Outport block 1914 named 'FS'. The output of the Product block 1912 is a signal as represented by arrow 1916 named 'IterationOuput'.

Figure 20:
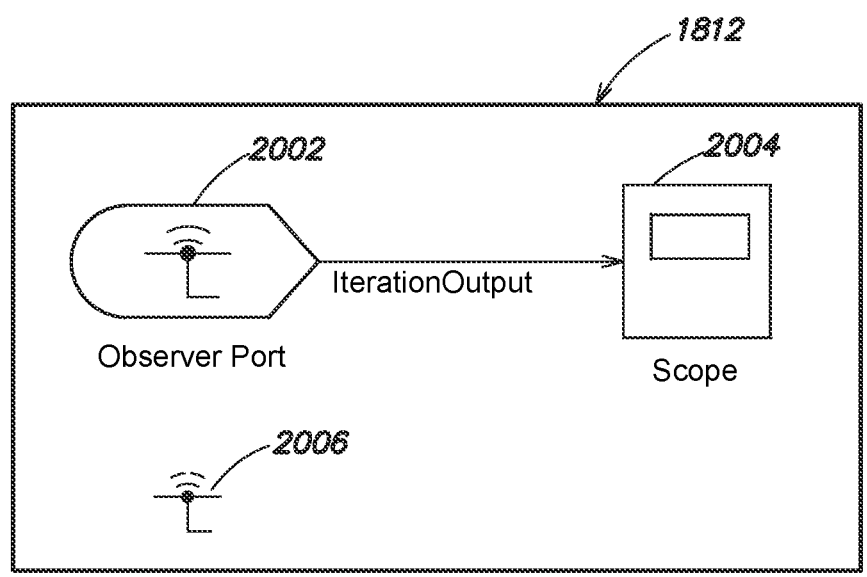
FIG. 20 is a schematic illustration of an example observer included in the example model of FIG. 18 in accordance with one or more embodiments.

FIG. 20 is a schematic illustration of the Observer block 1812 as opened to show its contents. The Observer block 1812 includes an Observer Port element 2002 and a Scope block 2004. The Observer Port element 2002 may be associated with the IterationOutput signal 1916 of the For Each subsystem 1808. The Observer block 1812 may include one or more graphical affordances, such as a badge 2006. The appearance of the badge 2006 may indicate, e.g., to the user, that the subsystem being visibly presented is an Observer.

The model 1800, the For Each subsystem 1808, and the Observer block 1812 as presented in FIGS. 18, 19, and 20 may be displayed in one or more model editor windows generated by the UI engine 202, and displayed by a data processing device, such as a workstation, a laptop computer, a tablet computer, a terminal device, etc.

During execution of the model 1800, the For Each subsystem 1808 may run multiple, e.g., three, times at every major simulation time step. Each time the For Each subsystem 1808 executes during a simulation time step may be an iteration of the For Each subsystem 1808. During execution of the Observer block 1812, the Observer Port element 2002 and the Scope block 2004 run once every major simulation time step. Furthermore, unlike the For Each subsystem 1808, the Observer Port element 2002 may not iterate multiple times during a simulation time step. Instead, at each simulation time step, the Observer Port element 2002 may read and output the current value of the signal (or other information) associated with the Observer Port element 2002, e.g., the IterationOutput signal 1916.

Suppose, for a given simulation time step of the model 1800, that the three values computed by the Product block 1912, e.g., the IterationOutput signal 1916, are 10, 20, and 30. Following the simulation time step of the model 1800, the simulation engine 206 may run a simulation time step of the Observer 1812, e.g., a matching simulation time step for the Observer 1812. In the absence of any translation step, the Observer Port element 2002 may only obtain the last value of the IterationOutput signal 1916, e.g., 30, during this matching simulation time step. However, the detector 714 of the model execution observer 712 may observe all three values generated during the given simulation time step, e.g., 10, 20, and 30, and may store those values in the buffer 716. Furthermore, the translator 718 may concatenate the three values and generate a vector of three elements. The message generator 720 may generate a message 724 that includes a payload containing the three-element vector.

Figure 21:
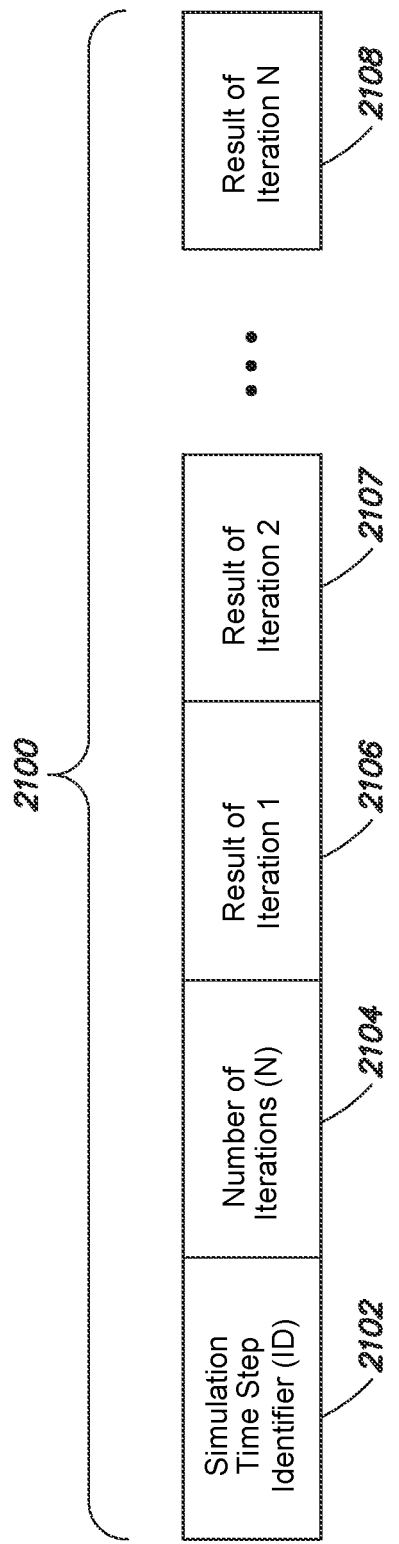
FIG. 21 is a schematic illustration of an example message in accordance with one or more embodiments.

FIG. 21 is a schematic illustration of an example message 2100 generated by the message generator 720 in accordance with one or more embodiments. The message 2100 may be generated for one simulation time step of the model 1800. The message 2100 may include a plurality of fields containing information. For example, the message 2100 may include a field 2102 that contains an identifier (ID) of the simulation time step, a field 2104 that contains the number of iterations (N) performed during the identified simulation time step, and fields 2106-2108 containing the result from each iteration, e.g., the value of the IterationOutput signal 1916. The fields 2106-2108 may be implemented in the form of a vector or array data type having multiple elements. In some implementations, the message 2100 may be encoded, e.g., using the type-length-value (TLV) encoding scheme for data and/or inter-process communication.

It should be understood that FIG. 21 is intended for illustrative purposes only and that other message formats, encoding schemes, data communication techniques, and/or inter-process communication protocols may be used. For example, in some embodiments, the message may only include the vector represented by the fields 2106-2108.

During execution of the Observer block 1812 for the simulation time step matching the simulation time step at which the three values 10, 20, and 30 were generated, the simulation engine 206 and/or solver 216 may access the message 2100 and provide the three-element vector to the Observer Port element 2002 as the value for the IterationOutput signal 1916 at that simulation time step. Verification and validation logic contained in the Observer block 1812, such as the Scope block 2004, may process the three-element vector. By packaging the values computed at each iteration of the For Each subsystem 1808, the translator 718 may thus prevent all but the last computed value from being lost to the Observer Port element 2002.

For a model element that runs multiple times during a given simulation time step, such as the For Each subsystem, the translator 718 may be configured, as its default behavior, to concatenate the values computed at each iteration. In some embodiments, this default behavior may be overridden. For example, a user may specify custom translation behavior to be performed in connection with the values for the observed signal, e.g., the IterationOutput signal 1916. Exemplary custom translation behaviors include keep the highest/lowest value, keep the first two values, keep the last two values, keep the highest/lowest two values, sum the available values, etc. The translator 718 may implement this custom translation behavior and load the defined values for the IterationOuput signal 1916 in the payload of the message 724 for use during the matching simulation time step for the Observer block 1812. Also, a message may be generated when a certain number of values are available, which may take more than one simulation time step to generate.

It should be understood that the process of aggregating values produced during iterations may be used with other iteration type components and/or model elements.

Conditional Execution

The modeling environment 200 may support one or more conditionally executed model elements or structures. Exemplary conditionally executed model elements include the Function Call subsystem, the Triggered subsystem, the Enabled subsystem, the Simulink Function subsystem, the Initialize subsystem, the Reset subsystem, and the Terminate subsystem included in the Simulink® model-based design environment.

Suppose for example that the model 1800 included a Function Call subsystem instead of the For Each subsystem 1808. Execution of a Function Call subsystem is triggered by an external function call input to the subsystem. During a given simulation time step, multiple function calls may be issued to a Function Call subsystem, and the Function Call subsystem will be executed in response to each function call. The number of function calls issued to a Function Call subsystem during any given simulation time step is variable, e.g., it may be called zero, one, or more times. While a Function Call subsystem may execute multiple times during a given simulation time producing multiple values for a signal computed by the Function Call subsystem, an Observer port element configured to observe that signal may be run once during a matching simulation time step. In the absence of a translation step, the Observer Port element may only obtain the last value of the signal during a simulation time step matching the simulation time step at which the Function Call subsystem computed multiple values for the signal.

In some embodiments, the detector 714 of the model execution observer 712 may observe all values of a signal computed by a Function Call subsystem in response to multiple function calls during a given simulation time step. The values generated during the given simulation time step may be stored in the buffer 716, and the translator 718 may concatenate the values and generate a vector or array whose elements are the values. The order in which these elements are concatenated may be based on the order in which they were generated, for example the order in which the function calls were executed. The message generator 720 may generate a message 724 that includes a payload containing the vector or array. The message 724 may also identify the simulation time step at which the multiple values were computed by the Function Call subsystem. During execution of the Observer block for the simulation time step matching the simulation time step at which the Function Call subsystem was called multiple times, the simulation engine 206 may access this message 724 and provide the vector or array to the Observer Port element as the value for the signal computed by the Function Call subsystem at that simulation time step. Verification and validation logic contained in the Observer block may process the vector or array. By packaging the values computed for each call to the Function Call subsystem, the translator 718 may thus prevent all but the last computed value from being lost to the Observer Port element observing that signal.

For a model element that runs a variable number of times during a given simulation time step, such as a Function Call subsystem, the translator 718 may be configured to concatenate the values computed at each iteration as its default behavior. This default behavior, however, may be overridden. For example, a user may specify custom translation behavior to be performed in connection with the values for the observed signal, e.g., a signal computed by a Function Call subsystem. The translator 718 may implement this custom translation behavior and load the defined values for the signal computed by the Function Call subsystem in the payload of the message 724 for use during the matching simulation time step for the respective Observer block.

Multiple Callers

Figure 22:
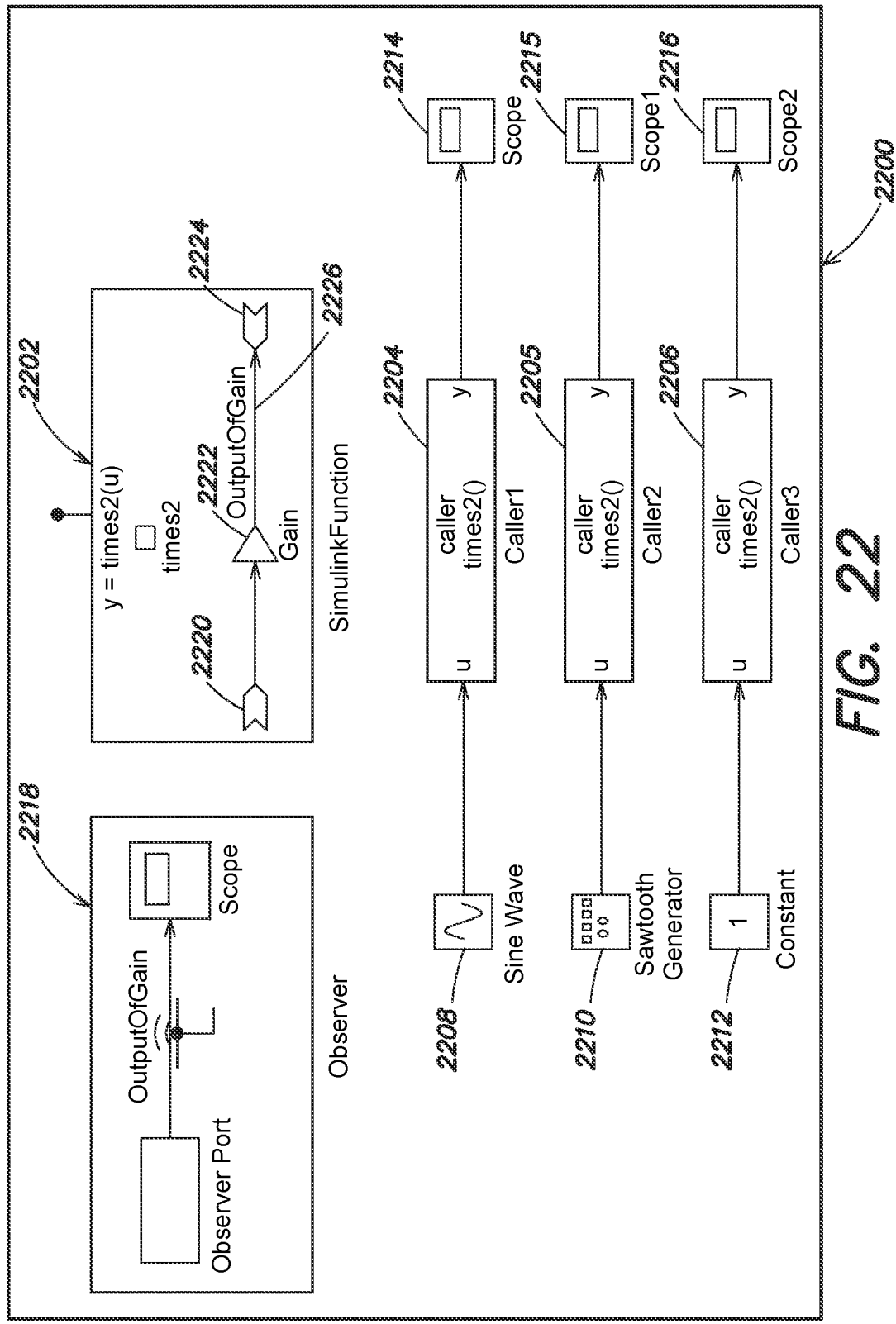
FIG. 22 is a schematic illustration of an example model in accordance with one or more embodiments.

FIG. 22 is a schematic illustration of an example model 2200 in accordance with one or more embodiments. The model 2200 includes a Simulink Function subsystem 2202 named 'SimulinkFunction, three Function Caller blocks 2204-2206 named 'Caller1', Caller2', and 'Caller3', a Sine Wave source block 2208 named 'Sine Wave', a Signal Generator source block 2210 named 'Sawtooth Generator', a Constant source block 2212 named 'Constant', and three Scope blocks 2214-2216. Each of the Function Caller blocks 2204-2206 is configured to conditionally call the Simulink Function subsystem 2202 during execution of the model 2200. The model 2200 also includes an Observer block 2218. The Simulink Function subsystem 2202 contains an input argument port 2220, a Gain block 2222, and an output argument port 2224. The output of the Gain block 2222 is a signal as represented by arrow 2226 named 'OutputOfGain'.

Figure 23:
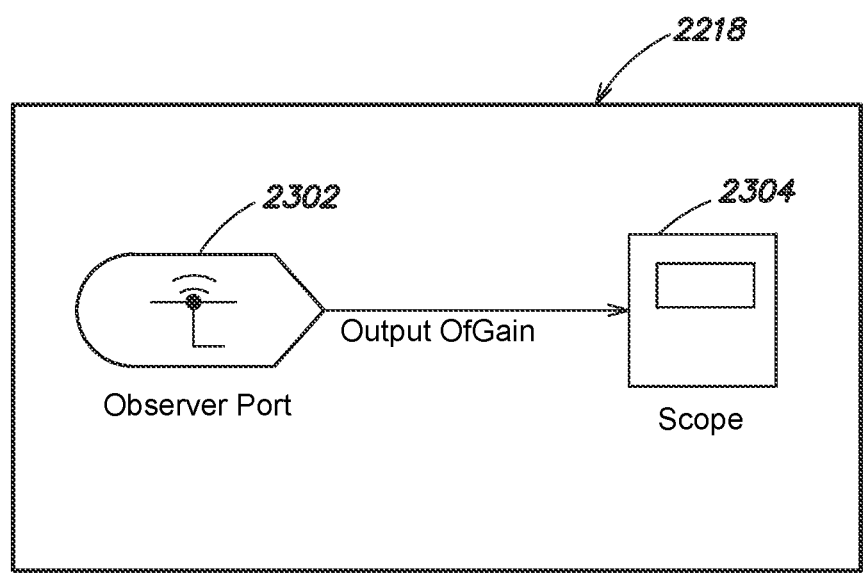
FIG. 23 is a schematic illustration of an observer in accordance with one or more embodiments.

FIG. 23 is a schematic illustration of the Observer block 2218 as opened to show its contents. The Observer block 2218 includes an Observer Port element 2302 and a Scope block 2304. The Observer Port element 2302 may be associated with the OutputOfGain signal 2226 of the Simulink Function subsystem 2202.

In any given simulation time step during execution of the model 2202 each of the Function Caller blocks 2204-2206 may call the Simulink Function subsystem 2202 zero, one, or more times. The Simulink Function subsystem 2202 may thus compute a variable number of values for the OutputOfGain signal 2226 in any given simulation time step. The Observer Port element 2302, however, may run once during a simulation time step, and thus only obtain the last computed value for the OutputOfGain signal 2226 in the absence of a translation step. The detector 714 of the model execution observer 712 may observe all values generated by the Simulink Function subsystem 2202 as well as the identity of the Function Caller block 2204-2206 that called the Simulink Function subsystem 2202 during a given simulation time step. The detector 714 may store the information in the buffer 716, and concatenate the results into a vector or array. The message generator 720 may generate a message 724 that includes a payload containing the identity of the caller and the result computed during each call to the Simulink Function subsystem 2202 for a given simulation time step.

Figure 24:
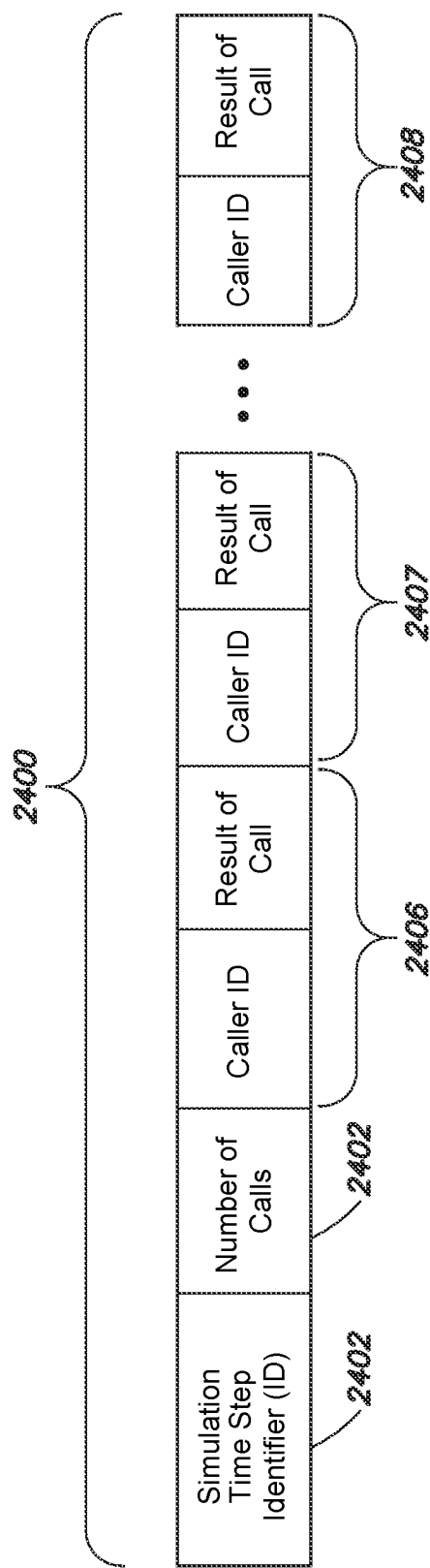
FIG. 24 is a schematic illustration of an example message in accordance with one or more embodiments.

FIG. 24 is a schematic illustration of an example message 2400 generated by the message generator 720 in accordance with one or more embodiments. The message 2400 may be generated for one simulation time step of the model 2200. The message 2400 may include a plurality of fields containing information. For example, the message 2400 may include a field 2402 that contains an identifier (ID) of the simulation time step. The message 2400 also may include a field 2404 containing the number of times that the Simulink Function subsystem 2202 was called during the identified simulation time step. For each call to the Simulink Function subsystem 2202, the message 2400 may include a pair of fields that contain an identifier of the caller of the function and the results computed as a result of that call. For example, the message 2400 may include three pairs of fields 2406-2408.

During execution of the Observer block 2218 for the simulation time step matching the simulation time step at which the Simulink Function subsystem 2202 was called multiple times, the simulation engine 206 may access this message 2400 and provide the caller IDs and the results of the calls to the Observer Port element 2302 at that simulation time step. Verification and validation logic contained in Observer block 2218, such as the Scope block 2304, may process this information. By packaging the values computed for each call to the Simulink Function subsystem 2202, the translator 718 may thus prevent all but the last computed value from being lost to the Observer Port element 2302.

It should be understood that FIG. 24 is meant for illustrative purposes only, and that other message formats, encoding schemes, data communication techniques, and/or inter-process communication protocols may be used. For example, in some embodiments, the message may only include the pairs of fields 2406-2408.

Intrinsic Execution Events

As described, one or more types of intrinsic execution events may be generated by the simulation engine 206 and/or the solver 216 during execution of a model. In some embodiments, these events may be thrown, e.g., issued, during a simulation time step. In accordance with an embodiment, an observer may be configured to listen for such intrinsic execution events and to apply verification and validation logic to those intrinsic execution events.

Figure 25:
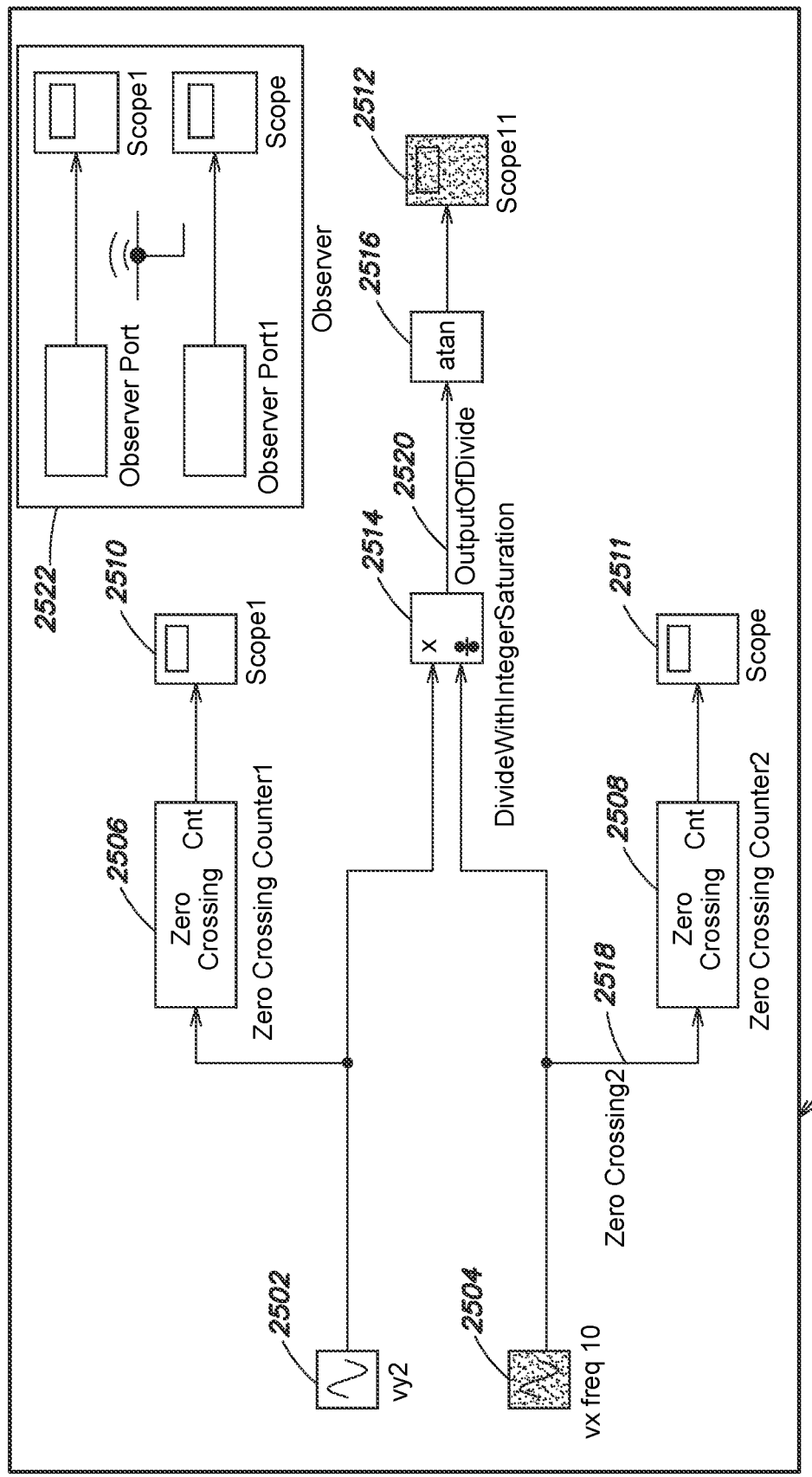
FIG. 25 is a schematic illustration of an example model in accordance with one or more embodiments.

FIG. 25 is a schematic illustration of an example model 2500 in accordance with one or more embodiments. The model 2500 may include two Sine Wave source blocks 2502 and 2504 named 'vy2' and 'vx freq 10', two Zero Crossing blocks 2506 and 2508 named 'Zero Crossing Counter1' and Zero Crossing Counter2', three Scope blocks 2510-2512 named 'Scope1', Scope', and 'Scope11', a Product block 2514 named 'DivideWithIntegerSaturation', and a Trigonometry block 2516 that applies an a tan function. The output of the Sine Wave block 2504, which is an input to the Zero Crossing Block 2508, is a signal named 'zeroCrossing2' as indicated by an arrow 2518. The output of the Product block 2514 is a signal named 'OutputOfDivide' as indicated by an arrow 2520. The model 2500 also includes an Observer block 2522.

Figure 26:
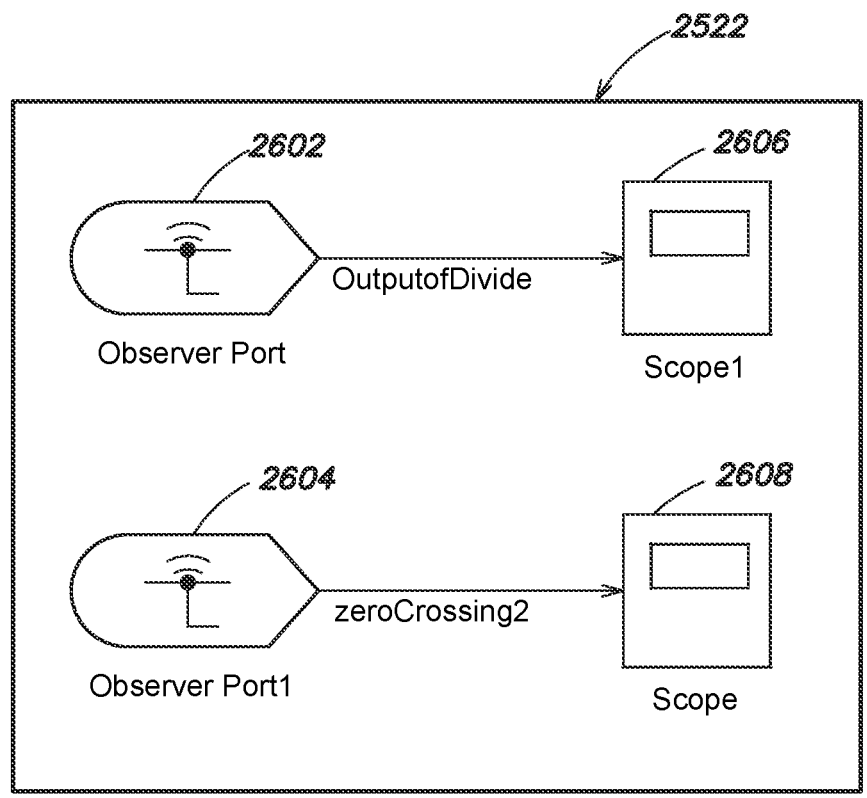
FIG. 26 is a schematic illustration of an observer in accordance with one or more embodiments.

FIG. 26 is a schematic illustration of the Observer block 2522 of the model 2500 as opened to show its contents. The Observer block 2522 includes two Observer port elements 2602 and 2604 and two Scope blocks 2606 and 2608. The Observer port element 2602 may be configured to observe whether a divide-by-zero execution event occurs for the OutputOfDivide signal 2520, and the Observer port element 2604 may be configured to observe the zero crossing execution event of the zeroCrossing2 signal 2518.

During execution of the model 2500, execution of the Product block 2514 may result in a divide-by-zero computation at a given simulation time step. The simulation engine 206 may issue an execution event in response to that occurrence, e.g., a divide-by-zero execution event. The execution engine 206 may capture and store the simulation state (simstate) of the model 2500 at the simulation time step for example when the divide-by-zero execution event occurred, for example in the buffer 716. The simstate of a model may represent all or some portion of the information associated with a snapshot of the simulation of the model where the snapshot is taken at one or more simulation time steps. This information may include the values computed for model data, e.g., signals, block parameters, chart states, the continuous and discrete states of the model elements included in the model, the simulation time step, the simulation time, and the simulation start time. The simstate may include previous state values, previous simulation time state output values, and current time step input values. The simstate may only include information corresponding to the design execution space, and not the verification execution space.

The execution engine 206 may notify via the API all clients that requested notification of divide-by-zero events, e.g., during initialization of the model 2500. For example, the execution engine 206 may notify the detector 714 by sending a pointer to the detector 714 that points to the captured simstate. The translator 718 may translate the captured simstate into a form usable by the Observer port element 2602 of the Observer block 2522. For example, if the output of the Observer port element 2602 is a composite signal or included in a composite signal, the translator 718 may translate the simstate to match the composite signal format. Exemplary composite signals include the virtual bus and nonvirtual bus of the Simulink® model-based design environment. The message generator 720 may generate one or more messages 724 that include the simstate or a portion thereof, e.g., as translated by the translator 718.

Figure 27:
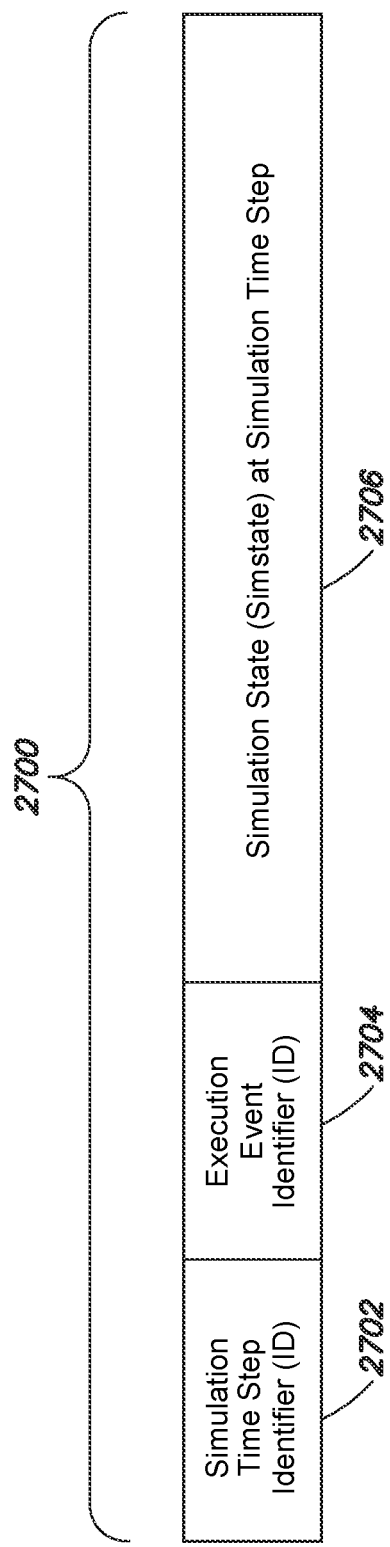
FIG. 27 is a schematic illustration of an example message in accordance with one or more embodiments.

FIG. 27 is a schematic illustration of an example message 2700 generated by the message generator 720 in accordance with one or more embodiments. The message 2700 may be generated for the divide-by-zero execution event. The message 2700 may include a plurality of fields containing information. For example, the message 2700 may include a field 2702 that contains an identifier (ID) of the simulation time step when the divide by-zero execution event occurred. The message 2700 also may include a field 2704 containing an execution event identifier (ID) for a divide-by-zero execution event. The message 2700 may further include one or more fields, such as field 2706, containing the simulation state (simstate) of the model 2500 or a portion thereof when the NaN execution event occurred.

During execution of the Observer block 2522, the message 2700 may be accessed by the simulation engine 206, for example at a simulation time step matching the simulation time step when the divide-by-zero execution event occurred. The simstate may be output by the Observer port element 2602. Verification and validation logic contained in the Observer block 2522, such as the Scope block 2606, may process the simstate.

In other embodiments, the model execution observer 712 may capture the simstate or other information. In some embodiments, only a portion of the simstate may be captured, and the portion translated and loaded into a message payload.

During execution of the model 2500, the zeroCrossing2 signal 2518 may cross zero. For example, at one simulation time step the value of the signal may be −1 and at a next simulation time step the value may be 1. The simulation engine 206 may issue an execution event in response to that occurrence, e.g., a Zero Crossing execution event. The detector 714 may be configured to listen for such intrinsic execution events, e.g., on behalf of the Observer port element 2604. The detector 714 may capture the simstate of the model 2500 at the simulation time step when the Zero Crossing execution event occurred, and store the simstate in the buffer 716. The message generator 720 may generate one or more messages 724 that include the occurrence of the Zero Crossing execution event and the simstate. In some embodiments, the detector 714 may capture 1180 the simstate at a simulation time in between the two simulation time steps where the zero crossing indicator function was at zero, for example within a root-finding tolerance. Furthermore, the observer block may execute at a simulation time where the design part of the model did not execute.

During execution of the Observer block 2522, the message may be accessed by 1185 the simulation engine 206, for example at a simulation time step matching the simulation time step when the Zero Crossing execution event occurred. The simstate may be output by the Observer port element 2604. Verification and validation logic contained in the Observer block 2522, such as the Scope block 2608, may process the simstate. For example, the simstate may be used to reproduce a failure or an exception.

The detector 714 may listen for other intrinsic execution events issued by the simulation engine 206 and/or solver 216 during execution of the model 2500, e.g., on behalf of other Observer blocks and/or Observer port elements. For example, the detector 714 may listen for divide by zero intrinsic execution events, the computation of infinity (inf) intrinsic execution events, overflow intrinsic execution events (e.g., based on the datatype of a signal), nonterminating event iteration in a state machine, execution of a model construct with error-prone semantics (e.g., semantics to resolve nondeterministic functionality), events with shadowing transitions, or a change to a tunable parameter execution event, among others. The detector 714 may capture the simstate when these other intrinsic execution events occur, and the simstate may be provided to respective Observer port elements during execution of the Observer block 2522, e.g., through one or more messages 724.

In some embodiments, information besides simstate may be provided in response to the occurrence of an execution event being observed. For example, in some embodiments, a running count may be kept of Zero Crossing events, the current count value may be provided at each occurrence of a Zero Crossing event.

In other embodiments, an Observer port element may be configured to observe intrinsic execution events occurring anywhere in a model, rather than occurring at a specified block, signal, state, parameter, etc. In this case, the detector 714 may listen for the indicated execution event wherever it may occur in the model. The occurrence of each such execution event and the model's simstate at that simulation time step (or other information) may be reported to the respective Observer port element, e.g., through one or more messages 724. Exemplary model-level intrinsic execution events include solver convergence iterations exceeding an upper bound, real-time execution constraints exceeding a predetermined temporal budget, etc. In some embodiments, an Observer port element may be configured to observe a part of a model in a design execution context and not a part in a verification execution context.

Fault Injection

In some embodiments, signals (or other model information) may be monitored during execution of a model to determine when a predefined fault condition occurs, such as hydraulic pressure failures and/or actuator position failures of a model simulating an aircraft elevator control system, and/or a fault is injected in a model, e.g., in response to a triggering event. In some embodiments, fault conditions and/or faults may be represented by model data, such as signals, produced during model execution. Observer port elements may be configured to observe the occurrence of such fault conditions and/or the triggering events for fault injection. The detector 714 may listen for such events during execution of the model. When they occur, the detector 714 may mark the simulation time step, and capture the model's simstate or a portion thereof. This information may be stored in the buffer 716. The message generator 720 may generate one or more messages whose payloads contain this information, e.g., the identity of the simulation time step, the fault condition occurrence and/or fault injection triggering event, and the model's simstate or portion thereof. The payloads of the one or more messages may be accessed by the simulation engine 206 during execution of an Observer block, and the simstate and/or other information may be provided by an Observer port element to verification and validation logic contained within the Observer block. The simstate or portion thereof may be translated or transformed before being provided to the Observer port element.

In some embodiments, data other than a fault may be injected into a model, e.g., by an injector, and an Observer port element of an Observer block may be associated with that injector and may monitor the triggering of the injection of the data into the model, among other model behavior, and the model's simstate or a portion thereof may be captured.

Additional Example Models

Figure 8A:
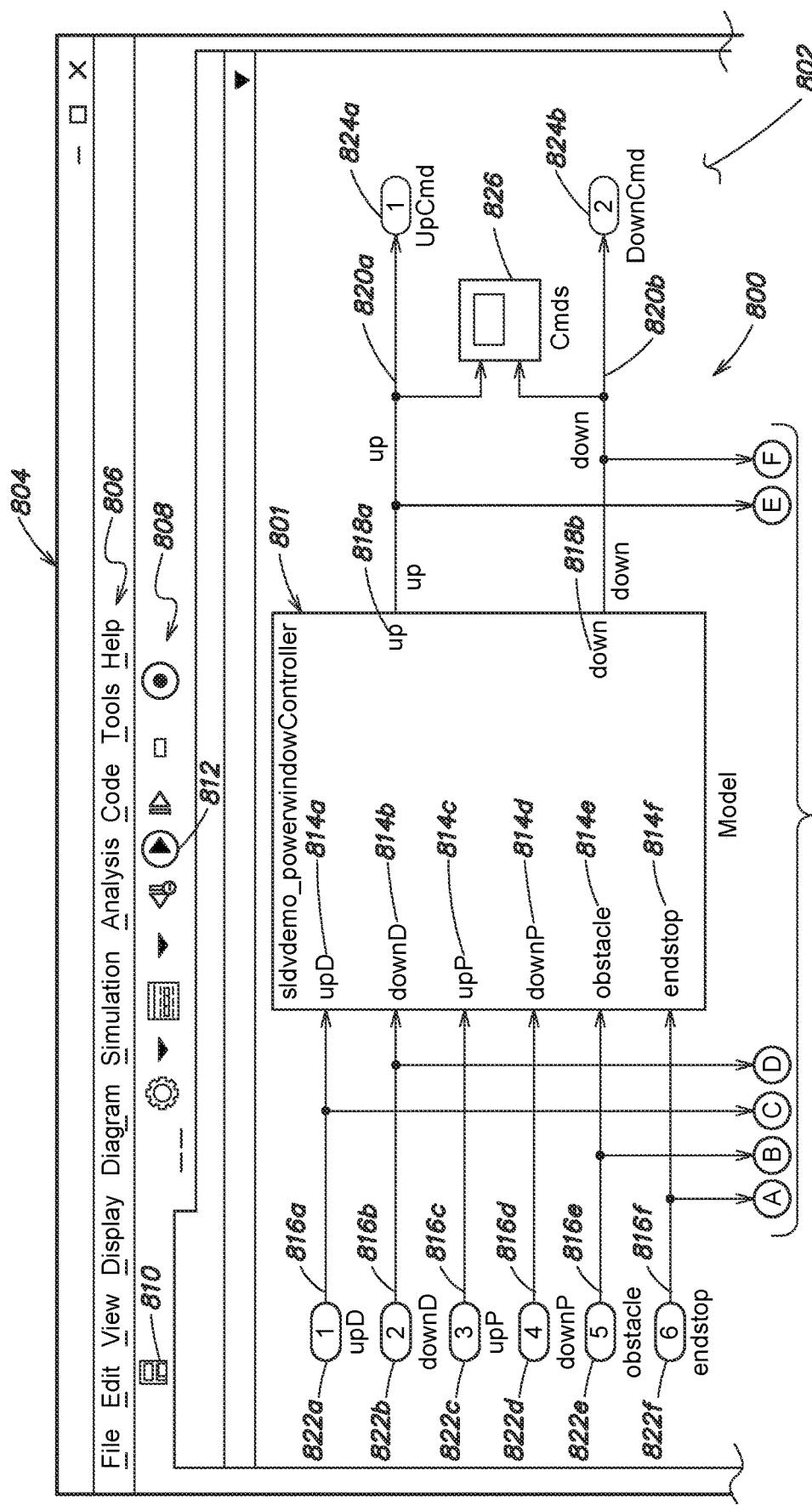
FIGS. 8A-B are partial views of a schematic illustration of an example model in accordance with one or more embodiments.
Figure 8B:
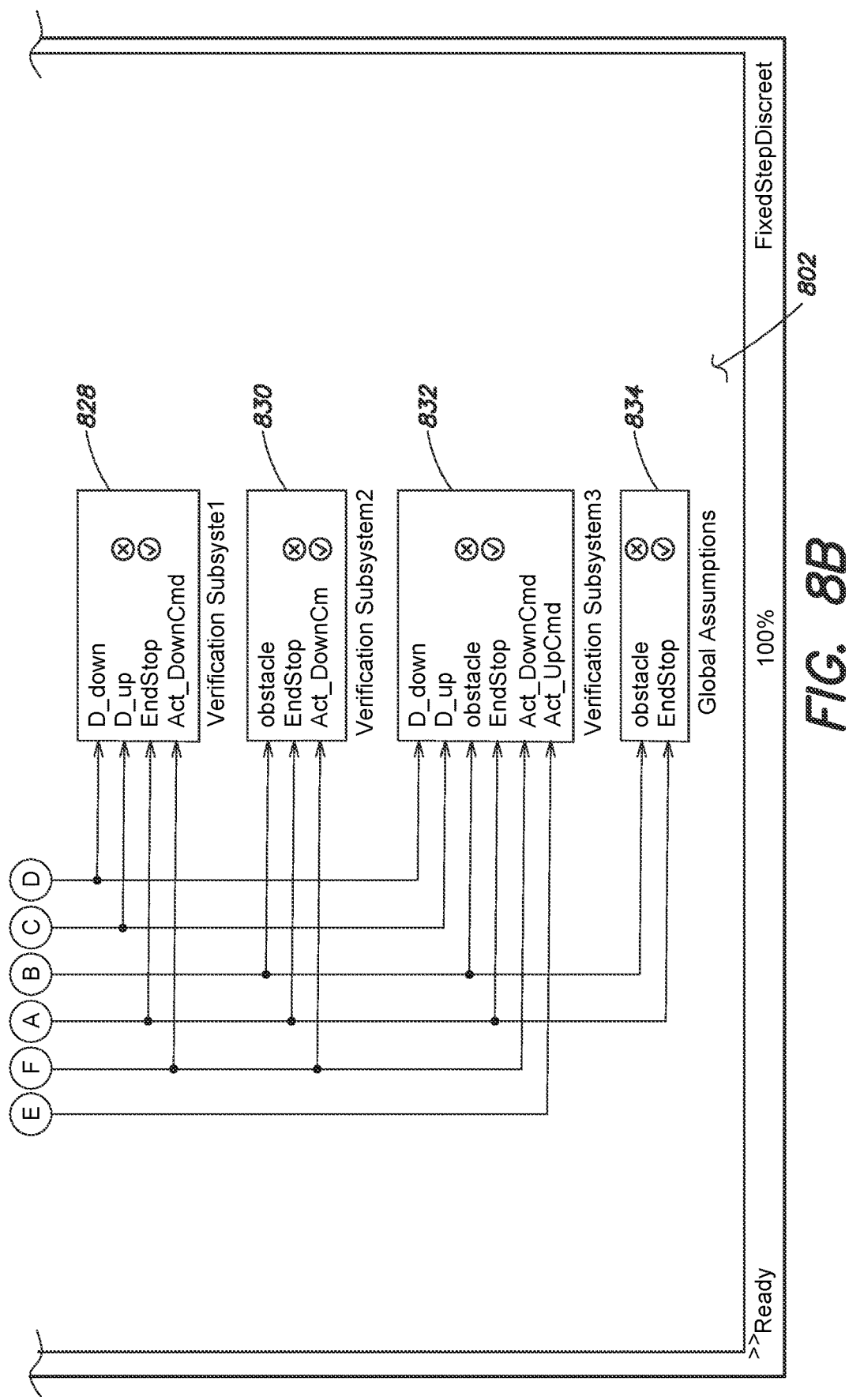

FIGS. 8A-B are partial views of a schematic illustration of an example model 800 in accordance with one or more embodiments. The model 800 includes a component 801 and is presented on a canvas 802 of a model editor window 804 that includes a menu bar 806 and a toolbar 808. The toolbar 808 includes a Save button 810 and a Run button 812. The component 801 may model a power window controller for a car that responds to input commands from a driver and passenger, and produces motor control commands for moving the window up or down. The controller may also respond to the presence of an obstacle in the window, and may respond to reaching the end of the window frame in either the up or down directions.

The component 801 may include input ports at which input commands and other data, which may be in the form of signals, are received. For example, the component 801 may include a first input port 814a for receiving an up command signal from a driver (upD) as indicated by arrow 816a, a second input port 814b for receiving a down command signal from the driver (downD) as indicated by arrow 816b, a third input port 814c for receiving an up command signal from the passenger (upP) as indicated by arrow 816c, a fourth input port 814d for receiving a down command signal from the passenger (downP) as indicated by arrow 816d, a fifth input port 814e for receiving a signal indicating the presence of an obstacle (obstacle) as indicated by arrow 816e, and a sixth input port 814f for receiving a signal indicating the window has reached the end of the window frame (endstop) as indicated by arrow 816f. The component 801 also may include output ports at which output commands or other data, which may also be in the form of signals, are provided. For example, the component 801 may include a first output port 818a for providing an up command signal as indicated by arrow 820a, and a second output port 818b for providing a down command signal as indicated by arrow 820b. The up and down command signals may be used to control an electric motor that moves the window.

The operation of the component 801, which represents power window controller, may need to meet one or more requirements. A first requirement may specify: When the driver presses the down button and up is not pressed at the same time, then the controller must issue the down command, unless endstop has been reached. A second requirement may specify: Whenever an obstacle is detected, then the controller must issue the down command for one second. A third requirement may specify: If the driver presses the down button for less than one second, then the controller must issue the down command as long as endstop has not been reached or the driver presses the up button.

To determine whether these requirements are satisfied, verification logic may be added to the model 800, and connected to the component 801. During execution of the model 800, the verification logic may test whether the component 801 meets the specified requirements. For example, model elements providing sample input values may be added 1280 and connected to the component 801. For example, six Inport blocks 822a-e may be connected to the input ports 814a-e of the component 801, as indicated by the arrows 816a-f. In addition, two Outport blocks 824a-b, and a Scope block 826 may be connected to the output ports 818a-b of the component 801, as indicated by the arrows 820a-b. In addition, one or more verification subsystems may be connected to at least some of the inputs of the component 801 and/or one or more outputs of the component 801. For example, a first verification subsystem 828 may test the first requirement, a second verification subsystem 830 may test the second requirement, and a third verification subsystem 832 may test the third requirement.

The component 801 may be an open system. Accordingly, a global assumptions subsystem 834 may be added to the model 800 to place constraints on the component 801 when determining whether the requirements are met. The global assumptions subsystem 834 may ensure that the obstacle and the endstop inputs never become true at the same time, and that the obstacle does not occur multiple times within the following 1-second interval.

The component 801, the first, second, and third verification subsystems 828, 830, 832, and the global assumptions subsystem 836 may all be located in a design space. Because they are all located in the same design space, attributes, such as signal attributes defined by the first, second, and third verification subsystems 828, 830, 832, and the Global Assumptions subsystem 836 could potentially be propagated to the component 801, thereby possibly altering the behavior of the component 801.

Conversion of Verification Subsystem to Observer

The observer builder 106 may convert an existing verification subsystem located in the model 800 into an observer. Suppose for example, that the user wants to convert the second verification subsystem 830 into an observer. The user may select the second verification subsystem 830, e.g., with a mouse action, generating one or more UI events. In response, the UI engine 202 may present a context menu that includes commands available for the selected subsystem. One of the available commands may be called 'Create Observer'. The user may select the 'Create Observer' command. In response, the observer builder 106 may convert the second verification subsystem 830 into an observer within a verification space.

Figure 9:
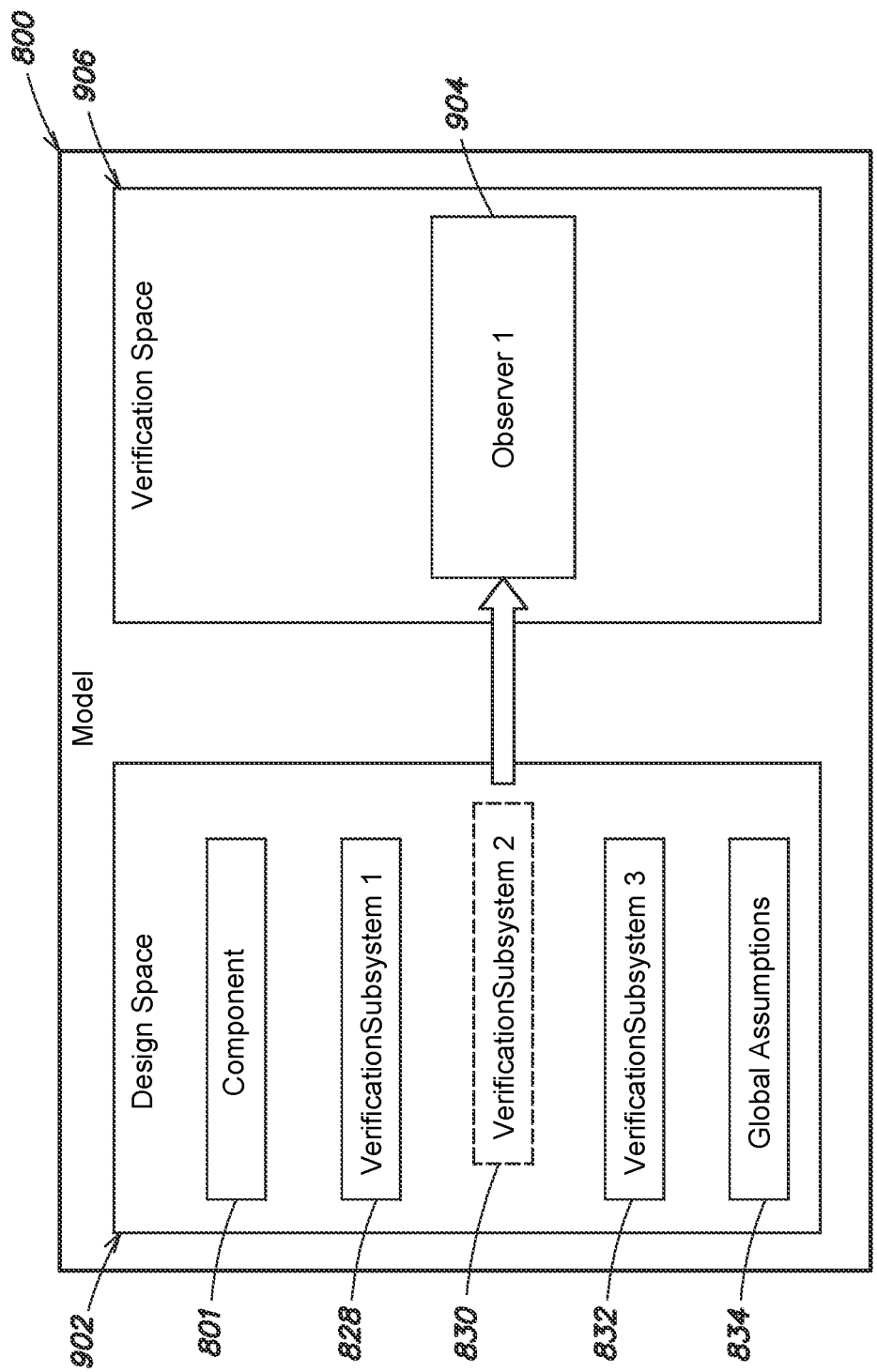
FIGS. 9 and 10 are schematic illustrations of an example conversion of a verification subsystem of a model into an observer in accordance with one or more embodiments.
Figure 10:
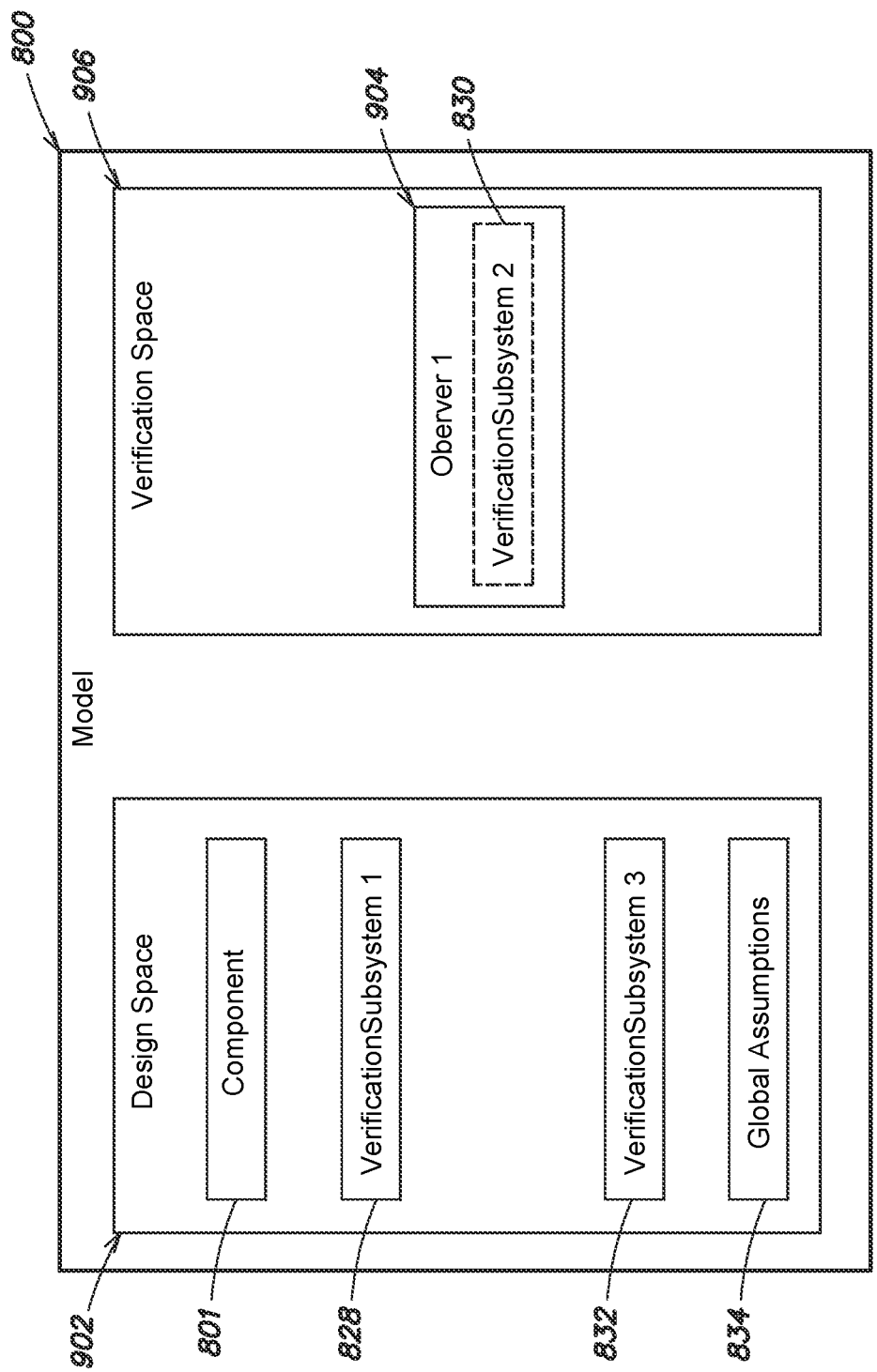

FIGS. 9 and 10 are schematic illustrations showing the conversion of a verification subsystem of the model 800 into an observer in accordance with an embodiment. The observer builder 106 may partition the model into a design space 902 and a verification space 906. The verification space 906 may be separate from the design space 902. The component 801, the first, second, and third verification subsystems 828, 830, 832, and the Global Assumptions subsystem 834 may all be placed and thus contained within the design space 902. The observer builder 106 may convert the second verification subsystem 830 into an observer 904 named 'Observer 1' for example by moving the second verification subsystem 830 from the design space 902 to the verification space 906, as illustrated by arrow 908. The observer builder 106 may also automatically remove all graphical connections within the design space 902 between the component 801 and the second verification subsystem 830, as part of the conversion of the second verification subsystem 830 into the observer 904. Nonetheless, even though the second verification subsystem 830 is converted into the observer 904, and placed in the verification space 906, the observer 904 may access, e.g., obtain, information, such as signal values, from the component 801 without modifying any of the attributes of the component 801, which might otherwise cause a change in the component's behavior during execution.

To convert the second verification subsystem 830 into the observer 904, the observer builder 106 may analyze a topology or dependency graph for the model 800. The observer builder 106 may identify the signals or other information accessed by the second verification subsystem 830 when it was part of the model 800 through its analysis of the dependency graph. The observer builder 106 may include observer port elements in the observer 904 for each signal of the model 800 identified as being accessed by the second verification subsystem 830.

Figure 11:
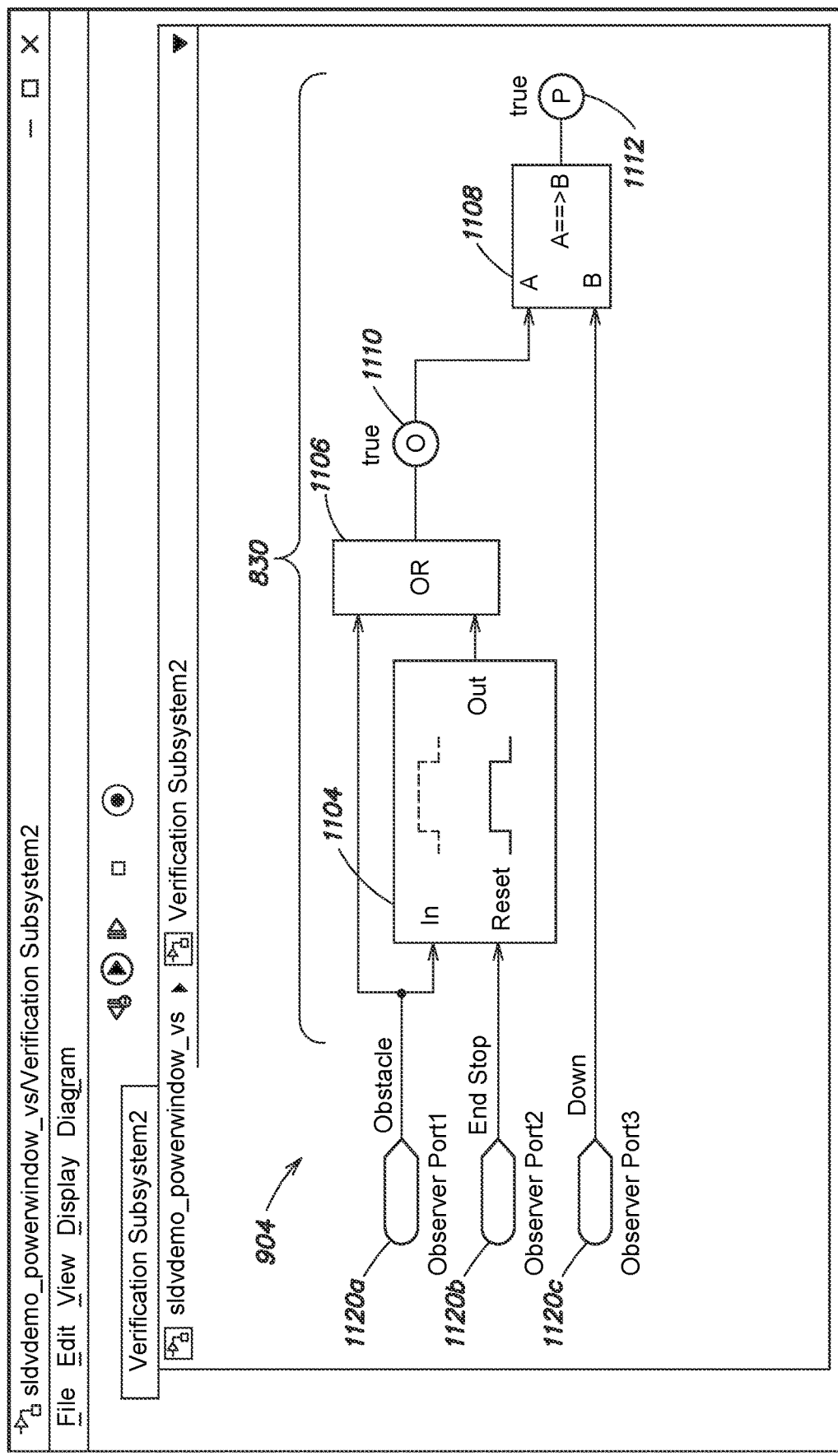
FIG. 11 is a schematic illustration of an example observer in accordance with one or more embodiments.

FIG. 11 is a schematic illustration of the observer 904 of FIGS. 9 and 10 in accordance with an embodiment. The observer 904 may include three observer port elements 1102a-c. The observer port element 1102a may provide access within the verification space 906 to the obstacle signal as represented by the arrow 808e of the model 800. The observer port element 1102b may provide access within the verification space 906 to the endstop signal as represented by the arrow 816 of the model 800. The observer port element 1102c may provide access within the verification space 906 to the down command signal as represented by the arrow 820b of the model 800. The UI engine 202 may present the observer 904 in a model editor window 1100, which may be presented on a display of a data processing device.

The obstacle, endstop, and down command signals corresponding to the observer port elements 1102a-c may be made accessible to the verification logic or functionality of the second verification subsystem 830 within the observer 904. For example, the functionality of the second verification subsystem 830 as now included in the observer 904 may include a detector block 1104, which may detect a fixed number of consecutive time steps, e.g., one, where the input signal is true, and outputs True for a specified duration, e.g., four time steps. The functionality of the second verification subsystem 830 also may include a logical OR block 1106, and a verifier block 1108 that outputs false when its first input is True and its second input is False, and otherwise outputs True. The functionality of the second verification subsystem 830 also may include a test objective block 1110 on the output of the OR block 1106. The test objective block 1110 may cause the test case generator 120 (FIG. 1) or the model verification engine 211 (FIG. 2) to generate one or more test cases that achieves the value specified by the test objective block, e.g., True, for at least one time step during a test case simulation. The functionality of the second verification subsystem 830 also may include a proof objective block 1112 at the output of the verifier block 1108. If output of the verifier block 1108 deviates from the value specified by the proof objective block 1112, e.g., True, a property violation may occur.

Referring to FIGS. 8A-B, the second verification subsystem 830 receives the obstacle and end stop input signals provided to the component 801, and the down command output signal generated by the component 801. The observer 904 also includes observer port element blocks 1102a-c that makes these signals from the design space 902 available within the observer 904, even though the observer 904 is in a different space, e.g., the verification space 906, than the design space 902. For example, the observer port blocks 1102 provide signals that correspond to the obstacle, end stop, and down command signals.

Following the conversion of the second verification subsystem 830 to the observer 904, the observer builder 106 may delete the second verification subsystem 830 from the model 800.

In some embodiments, one or more of the other verification subsystems 828, 832 and/or the Global Assumptions 834 of the model 800 also may be converted to one or more observers. For example, the verification subsystem 828 may be converted to the observer 904. The verification subsystem 832 and the Global Assumptions 834 may be converted to another observer.

Figure 12:
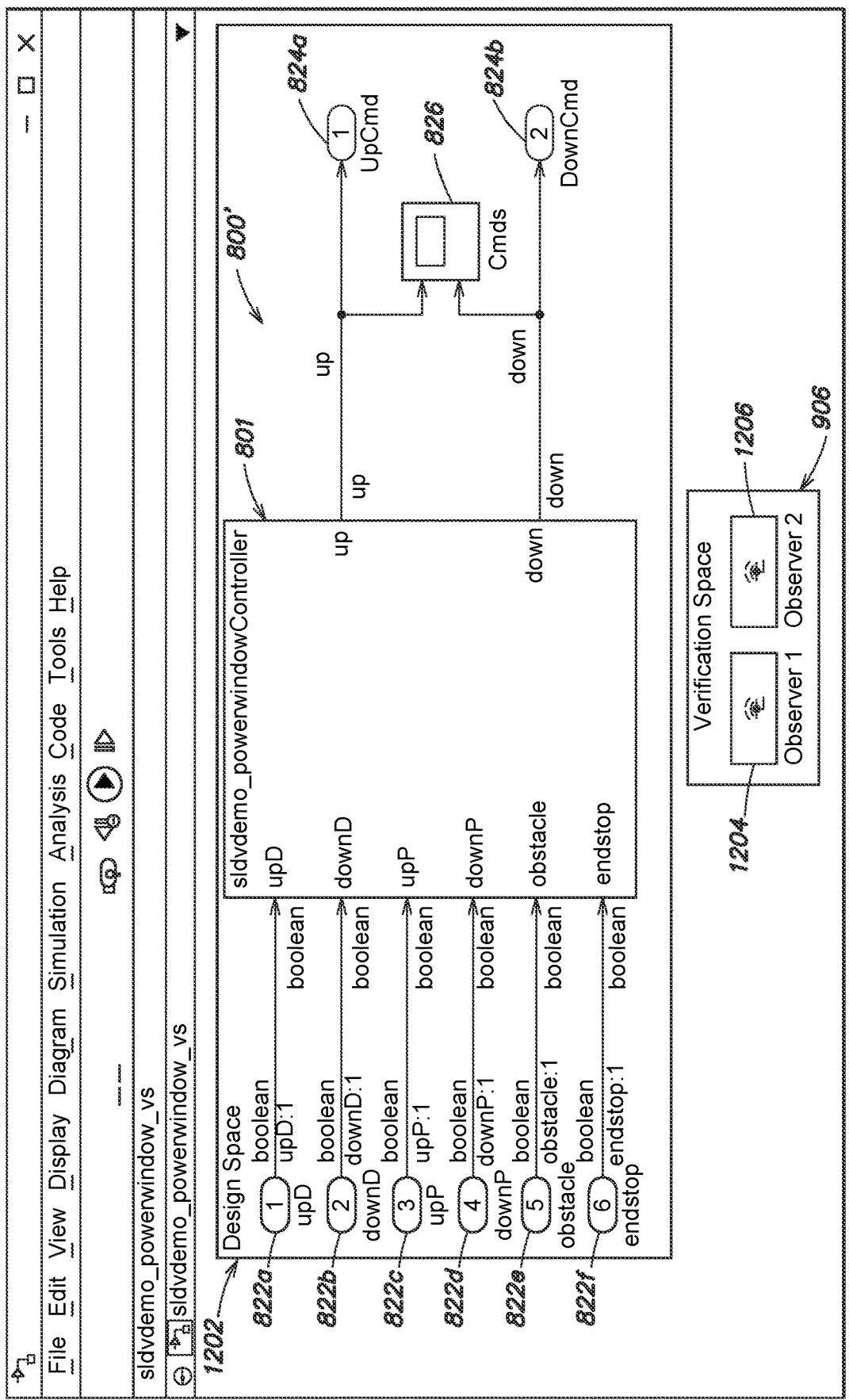
FIG. 12 is a schematic illustration of the model of FIGS. 8A-B following the conversion of verification subsystems into observers in accordance with one or more embodiments.

FIG. 12 is a schematic illustration of a revised version the model of FIGS. 8A-B following the conversion of all of the verification subsystems to observers in accordance with an embodiment. The revised model 800' may include the component 801, the six Inport blocks 822a-e, the two Outport blocks 824a-b, and the Scope block 826 in a design space 1202. The revised model 800' also may include two observer blocks 1204 and 1206 in the verification space 906. The observer block 1204 may include observer port elements for accessing particular signals of the revised model 800' and the functionality of the first and second verification subsystem 828 and 830. The observer block 1206 may include observer port elements for accessing particular signals of the revised model 800' and the functionality of the third verification subsystem 832 and the Global Assumptions 834. As indicated, the observer constructor 118 may delete the verification subsystem blocks 828, 830, and 832 and the Global Assumptions block 834 from the revised model 800'. That is, the verification subsystem blocks 828, 830, and 832 and the Global Assumptions block 834 are not present in the revised model 800'.

Conversion of Observer to Verification Subsystem

In some embodiments, the observer builder 106 may convert an observer to a verification subsystem or other component of a model, and may include the verification subsystem or other component in the design space of the model. For example, a user may call up a context menu for an observer, which may include a command called 'Convert to subsystem'. The model analyzer 114 may analyze the observer port elements of the respective observer to determine the signals of the portion of the model in the design space being observed. The observer builder 106 may insert a new subsystem block into the model, and place the model elements that make up the verification functionality included in the observer into this subsystem block. The observer builder 106 may also link the newly added verification subsystem to the signals of the portion of the model in the design space that were being observed through the observer port elements. For example, the observer builder 106 may place connection elements, e.g., arrows or wires, between the newly added verification subsystem and existing model elements and/or components of the model. The observer may be deleted. The newly added verification subsystem, moreover, may not include any observer port elements.

Synchronization

In some embodiments, the synchronization engine 122 may detect changes to a component, and update the respective observer to remain synchronized with the component. For example, to the extent inputs or outputs of a given component are added or removed, the synchronization engine 122 may automatically update the observer linked to that component to provide access to newly added inputs or outputs or to remove prior access to removed inputs or outputs. For example, in response to the addition of a new input or output of a component and selection, e.g., by a user, of the new signal represented by that new input or output, the observer constructor 118 may add an observer port element providing access to the new signal to the observer. In response to the removal of an input or output, the observer constructor 118 may delete observer port elements associated with the signals for the removed input or output from the observer.

In some embodiments, the synchronization engine 122 may monitor and detect changes to a topology or dependency graph. The synchronization engine 122 may update an observer in response to such changes.

In some embodiments, the modeling environment 200 may save an observer to a library, for example in response to a user selecting a Save or Save As command for the observer. The observer as saved may include the observer port elements and verification functionality of the observer being saved. Thereafter, an instance of the saved observer may be created from the library, and linked to another component in the same or in a different model. An observer thus may be reused across various components or models. The different instances of the observer may verify different components or models. The synchronization engine 122 may synchronize each instance of the observer with the respective component or model being observed by that instance. In some embodiments, the instances of the observers created from the observer saved to the library may be dynamically linked. Accordingly, changes to a first instance of such an observer may be propagated to the other instances of the observer in the same or other models. For example, if the functionality of one instance of the observer is changed, the change in functionality may be propagated to the other instances of the observer.

Flow Diagram

Figure 13A:
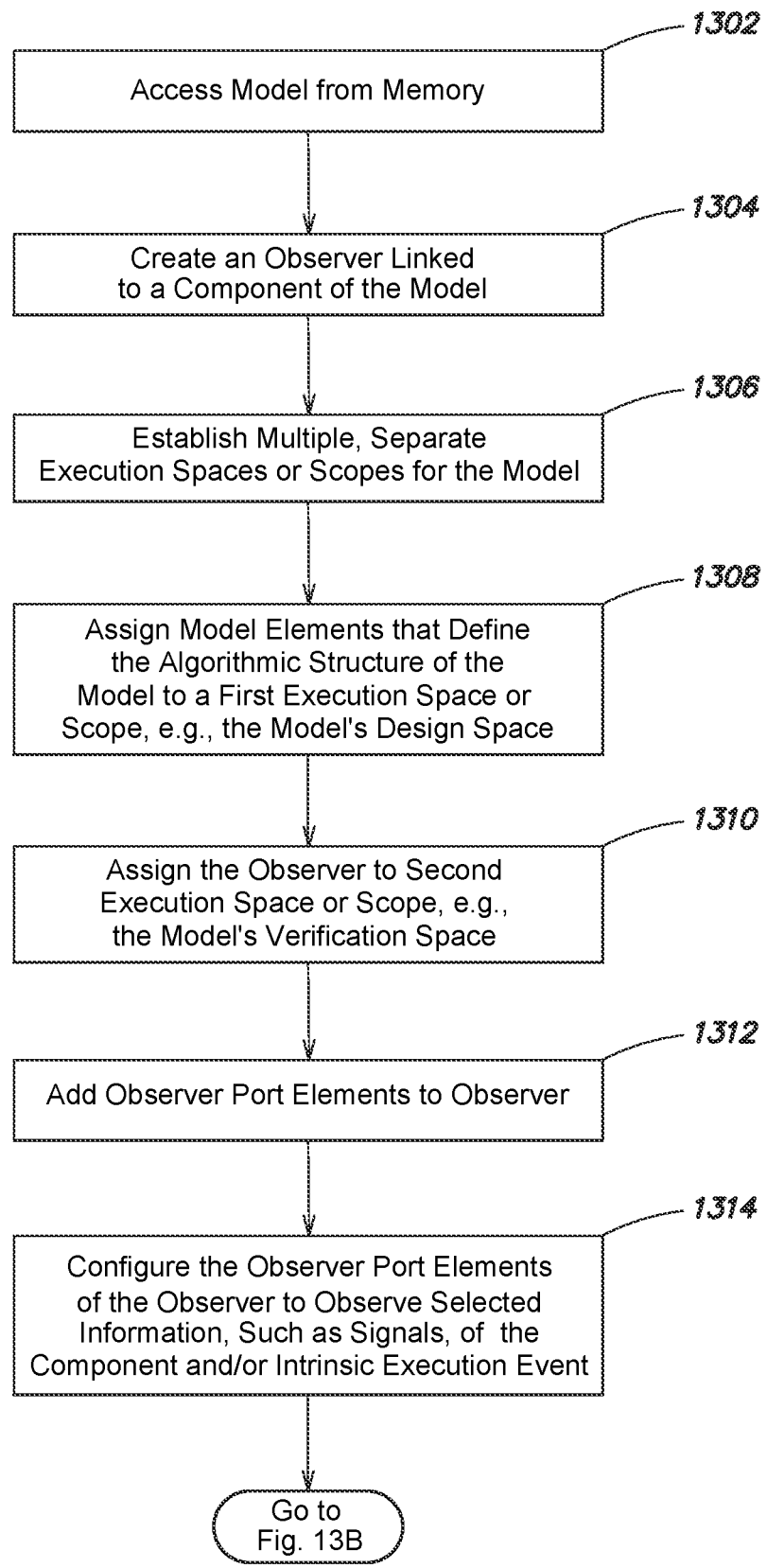
FIGS. 13A-13E are partial views of a flow diagram of an example method in accordance with one or more embodiments.
Figure 13B:
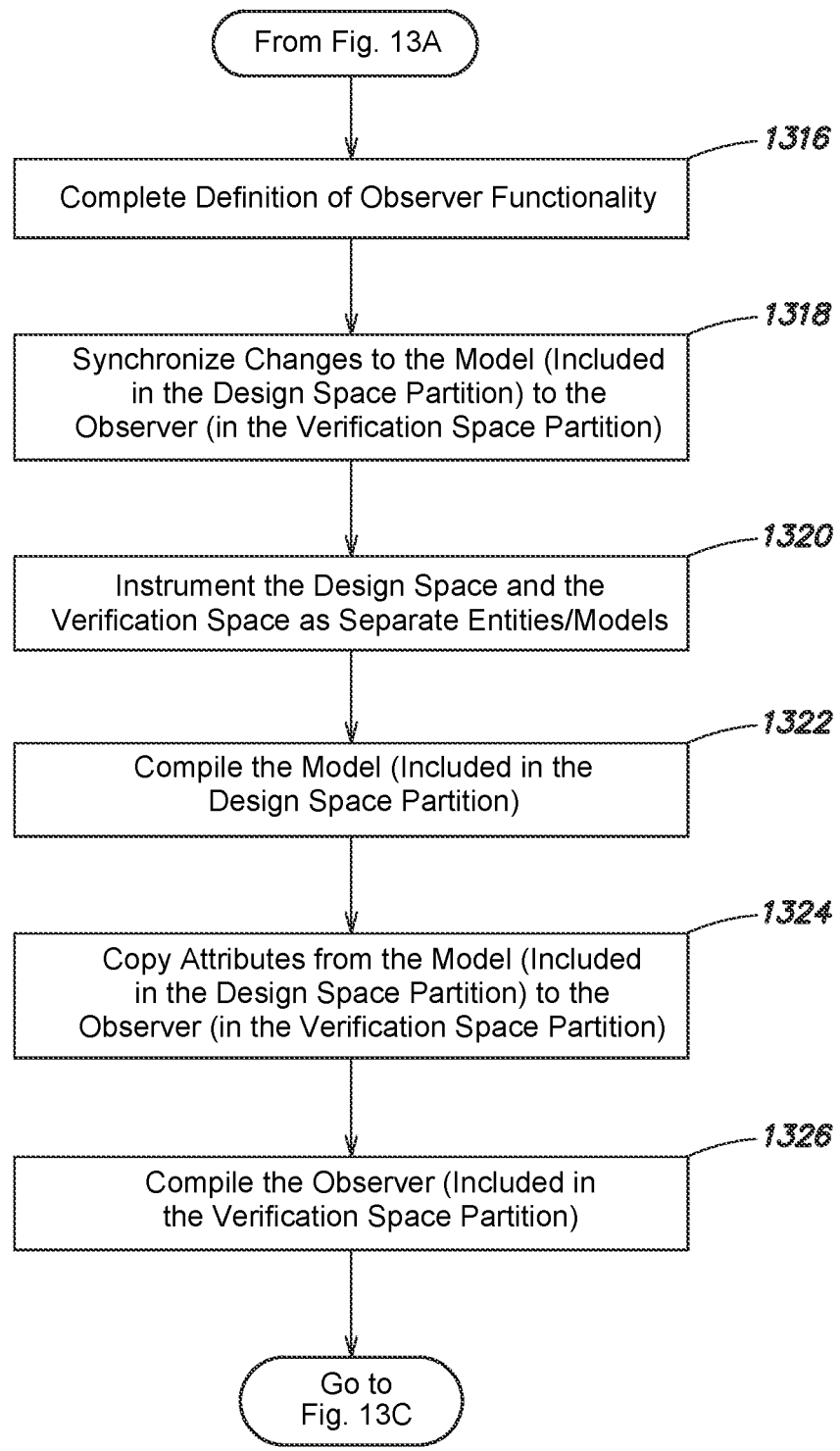
Figure 13C:
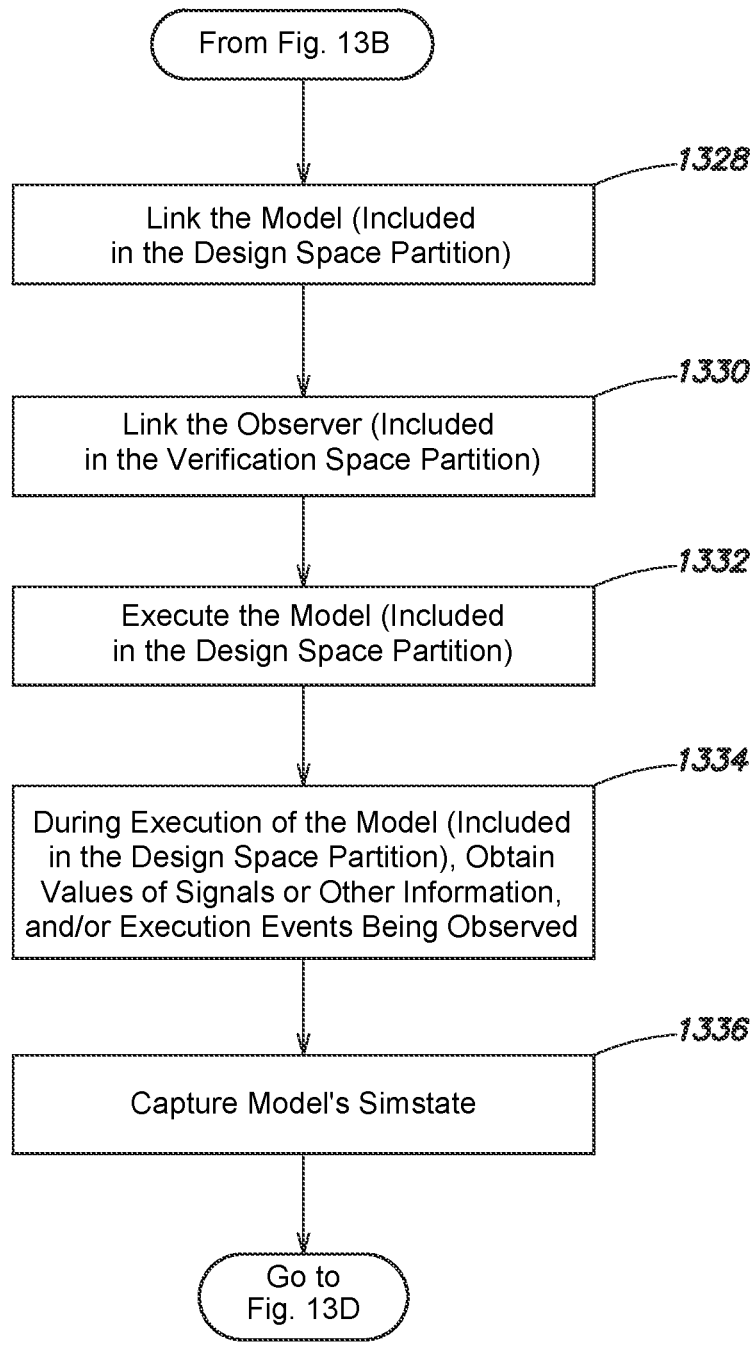

FIGS. 13A-13E are partial views of a flow diagram of an example method in accordance with an embodiment. The modeling environment 200, which may include the observer builder 106, may access a model, which may be stored in computer memory, as indicated at step 1302. The modeling environment 200 may open the model in a model editor window. The observer builder 106 may receive a command, e.g., from a user, to construct an observer for a selected component of the model. In response, the observer builder 106 may create an observer and link it to the selected component of the model, as indicated at step 1304. The observer builder 106 may establish one or more spaces for executing the observer that are separate from spaces established for executing the model, as indicated at step 1306. These separate spaces may not be visually depicted in a presentation of the model. Instead, the observer may be visually presented in a same area as the model's components and model elements, for example in the same model editor window or other screen region. In some embodiments, the observer builder 106 may partition the model into a verification space or scope in which the observer may be executed, and a design space or scope in which the model may be executed. These separate execution scopes for the observer and for the model may be maintained by the observer 106 and/or by the modeling environment 200, for example under the direction of the observer builder 106. The modeling environment 200 and/or observer builder 106 may assign or include the model elements and components defining the algorithmic structure of the model, such as the procedure performed by the model, to the design space or scope for execution, as indicated at step 1308. The observer builder 106 may assign or include the created observer to the verification scope for execution, as indicated at step 1310. The observer builder 106 may add one or more observer port elements to the observer, as indicated at step 1312. The observer builder 106 may configure, e.g., in response to user input, the observer port elements of the observer to observe, e.g., provide access to, model data, such as one or more signals, of the algorithmic part of the model, e.g., the portion of the model in the design space, and/or one or more intrinsic execution events, as indicated at step 1314. For example, the observer builder 106 may assign the particular model data or execution event to the observer port element. The observer builder 106 also may complete the definition of the observer's functionality, for example in response to user input, as indicated at step 1316 (FIG. 13B). The synchronization engine 122 may detect changes to the model and/or the component, such as the definition of new signals, variables, or parameters and changes to the interface of the component, and may synchronize the observer to these detected changes, as indicated at step 1318.

Figure 13D:
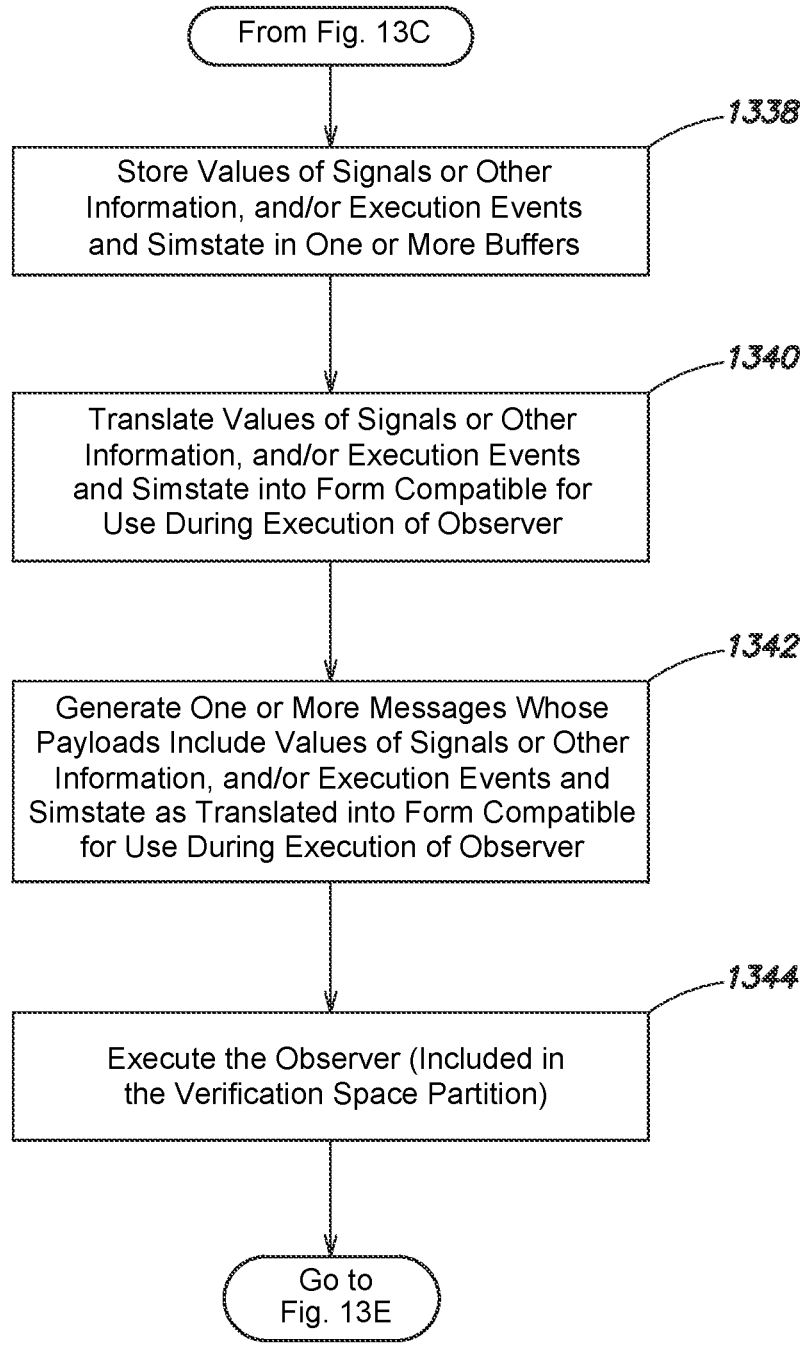

In some embodiments, the observer builder 106 may implement the design space and the verification space as separate entities, for example as separate models, as indicated at step 1320. The simulation engine 206 may compile that portion of the model included in the design space, as indicated at step 1322. The observer builder 106 may copy attributes from the model, as included in the design space, to the observer included in the verification space, as indicated at step 1324. Exemplary attributes include data types, sample times, sample modes, units, dimensions, and complexity. The simulation engine 206 may compile the observer, as indicated at step 1326. The simulation engine 206 also may link the portion of the model included in the design space, and the observer, as included in the verification space, as indicated at steps 1328 (FIG. 13C) and 1330. The simulation engine 206 may execute the compiled and linked portion of the model included in the design space, as indicated at step 1332. During execution of the portion of the model included in the design space, values of model data, such as signals or other information, and/or intrinsic execution events of interest may be captured and stored at one or more buffers, as indicated at step 1334. For example, the simulation engine 206 and/or solver 216 may be configured to expose model data and intrinsic execution events through one or more APIs, and the model execution observer 712 may utilize the one or more APIs to obtain, e.g., get, values of model data and/or intrinsic execution events. An exemplary API for obtaining model data is the block run-time interface of the Simulink® model-based design environment. In at least some cases, the model's simstate may be captured, as indicated at step 1336. The model execution observer 712 may store values of signals (or other information) and/or intrinsic execution events and simstate in the buffer 716, as indicated at step 1338 (FIG. 13D).

The translator 718 may translate the values of the signals (or other information) and/or the intrinsic execution events and simstate into a form that is compatible for use during execution of the observer, as indicated at step 1340. The message generator 720 may generate one or more messages 724 having payloads containing the values of the signals (or other information) and/or the intrinsic execution events and simstate as translated, as indicated at step 1342.

Figure 13E:
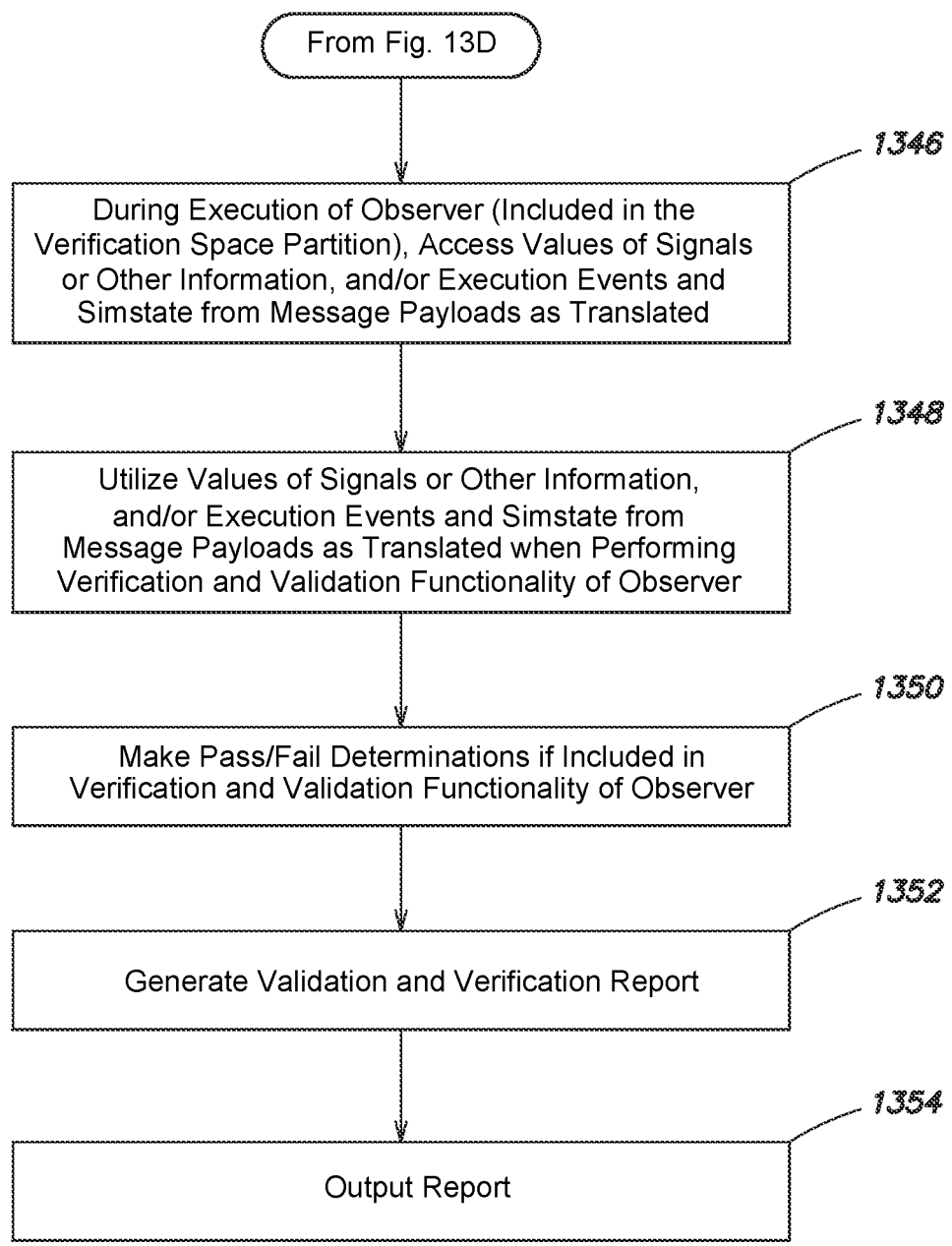

The simulation engine 206 may execute the compiled and linked observer, as indicated at step 1344. During execution of the observer, the simulation engine 206 may access and read values for the signals (or other information) and/or intrinsic execution events and simstate from the one or more messages and/or the buffer 716, as indicated at step 1346 (FIG. 13E). The simulation engine 206 may utilize the retrieved values in the execution of the observer, as indicated at step 1348. Execution of the observer may result in verification and validation operations being performed based on the functionality of the observer, as also indicated at step 1348. The observer may make pass/fail determinations, if such functionality is included in the observer, as indicated at step 1350. The report generator 124 may generate one or more reports that include validation and verification data generated during execution of the observer, as indicated at step 1352, and may output the one or more reports, for example on a display, printer, or other output device, as indicated at step 1354.

The observer builder 106 (or the simulation engine 206) may configure the verification space 104 to have the same execution semantics as the design space 102. For example, both the verification space 104 and the design space 102 may execute over a simulation time, and the simulation engine 206 may determine a sample rate at which an observer port of an observer is executed. The sample rate determined for the observer port, however, may differ from the sample rate of the signal being observed by the observer port, or an intrinsic event observed by an observer port may occur at a simulation time that does not correspond to a sample time hit of the observer port. In such cases, the translator 718 may reconcile these differences, e.g., using one or more approaches. For example, the translator 718 may buffer values of the signal and replay them at the sample rate of the observer port, apply a zero order hold operation on the signal, apply zero padding to the signal values, emitting just the latest value of the signal at a next sample time hit of the observer port, or aggregating signal values and emitting them at a sample time hit of the observer port, among other options.

In some implementations, the observer builder 106 (or the simulation engine 206) may utilize different execution semantics to run the verification space 104 and the design space 102. Exemplary execution semantics include continuous-time behavior, discretetime behavior, a finite state machine behavior, and a discrete event behavior. The translator 718 may also reconcile these differences in execution semantics between the verification space 104 and the design space 102.

Suppose, for example, that the design space 102 is executed in continuous time and the verification space 104 is executed in discrete time. An observer may read a signal from the design space 102 given that the time steps at which the design space 102 is executed are a superset of the time steps in which the verification space 104 (and thus the observer) are executed. Suppose that the design space 102 is executed in discrete time and the verification space 104 is executed in continuous time. In this case, the translator 718 may determine one or more of the time steps at which the design space 102 is not executed. The translator 718 may use an interpolation technique to approximate the value of a signal at a particular time step at which the design space 102 was not executed. Exemplary interpolation functions include gridded interpolation functions, such as the interp1, interp2, interp3, intern, griddedInterpolant, pchip, spline, ppval, mkpp, unmkpp, padecoef, and interpft MATLAB functions, and scattered interpolation functions, such as the griddata, griddatan, and scatteredInterpolant MATLAB functions.

Algebraic Loops

In some embodiments, a model may include an algebraic loop, and a solver may attempt to solve the algebraic loop during execution of the model. For example, the solver may start with an initial or seed value for a variable in the algebraic loop. The solver may then perform a search by iteratively computing the values for all values of the algebraic loop, and adjusting the variable with the initial value to move closer to a value that is consistent with the loop relations. In some embodiments, an observer port element may be configured to observe such intermediate values determined at one or more of the iterations performed by the solver.

A system for solving algebraic loops is described in U.S. Pat. No. 7,599,823 for Automated Approach to Resolving Artificial Algebraic Loops, which is hereby incorporated by reference in its entirety.

Other Embodiments

Figure 14:
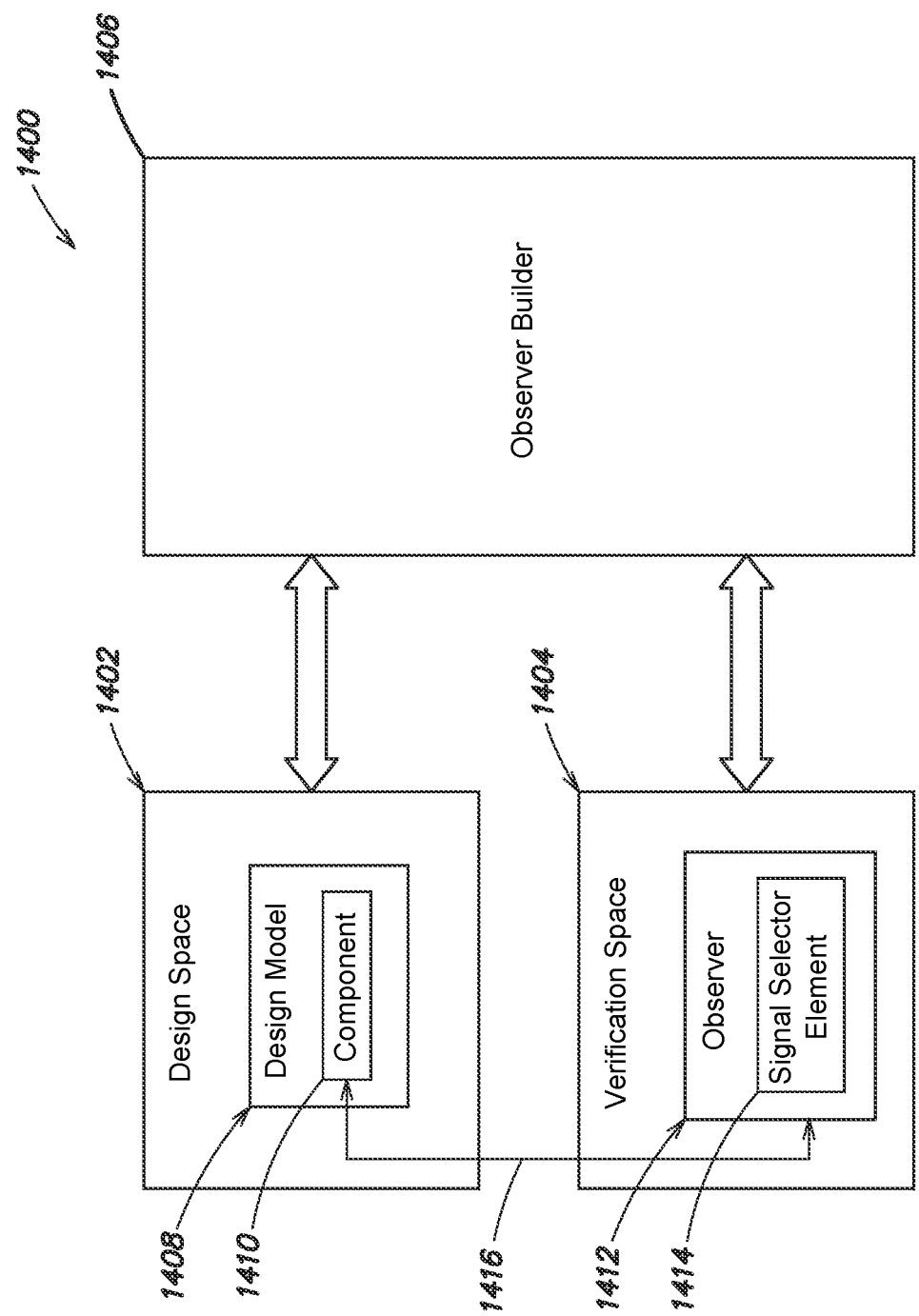
FIG. 14 is a schematic illustration of an example model verification environment in accordance with one or more embodiments.

It should be understood that the present disclosure may be implemented in other ways. For example, FIG. 14 is a schematic illustration of an alternative model verification environment 1400 in accordance with an embodiment. The model verification environment 1400 may include a design space 1402, a verification space 1404, and an observer builder 1406. The design space 1402 may host a model 1408, which may be referred to as a design model. The design model 1408 may be opened or created in the design space 1402. The design model 1408 may include a plurality of components, such as a component 1410. The verification space 1404 may include an observer 1412. In some embodiments, the design space 1402 and the verification space 1404 may be separate modeling spaces supported by one or more modeling programs or environments, such as the modeling environment 200 (FIG. 2). The observer builder 1406 may include similar modules as the observer builder 106 (FIG. 1).

The observer builder 1406 may define a new type of model element, and may add an instance 1414 of this new model element type within the observer 1412. The new model element type may be referred to as a signal selector element type. The signal selector element 1414 may be configured to permit the observer 1412 to observe selected information, such as signals, of the component 1410 and/or design model 1408. For example, the signal selector element 1414 may retrieve values from the design space 1402, such as values of signals generated by the component 1410 under observation, and may make those values accessible to the observer 1414 within the verification space 1404, as indicated by arrow 1416. The observer builder 1406 may identify available values from the design space 1402, such as signals, data, parameters, and properties, and selected values may be accessed by the observer 1412 via the signal selector element 1414. The selected values may be utilized to perform verification operations within the observer 1412.

Figure 15:
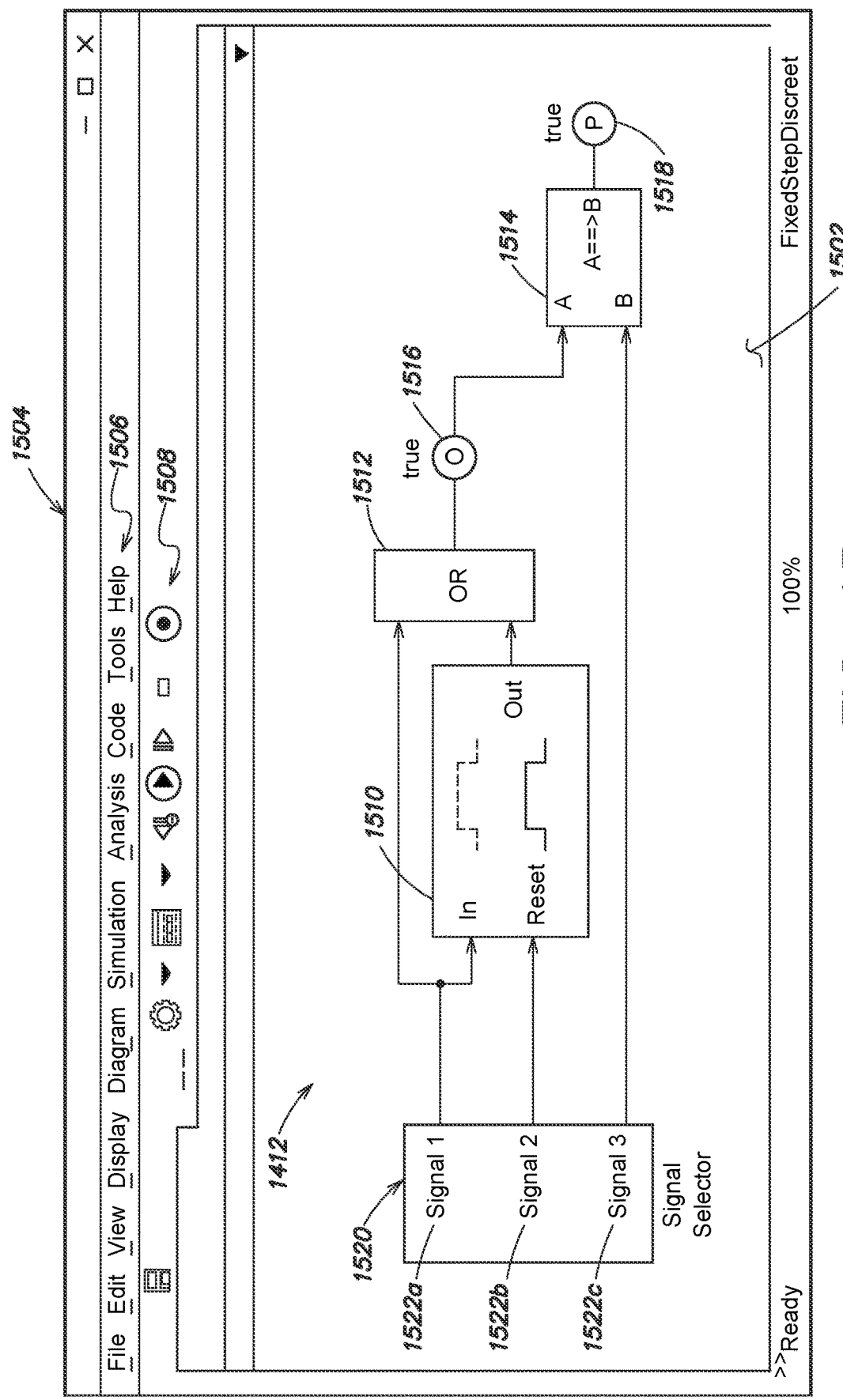
FIG. 15 is a schematic illustration of an example observer in accordance with one or more embodiments.

FIG. 15 is a schematic illustration of the observer 1412 in accordance with an embodiment. The observer 1412 may be opened and presented on a canvas 1502 of a model editor window 1504. The model editor window 1504 may include a menu bar 1506 and a toolbar 1508. Initially, the observer 1412, as created by the observer builder 1406, may not include any functionality or just skeleton functionality as defined by a selected template. The functionality of the observer 1412 may be custom defined, e.g., by a user, by adding selected model elements to the observer 1412. Alternatively, the observer builder 1406 may convert a verification or other subsystem into the observer 1412, as described. In an embodiment, the observer 1412 may implement the functionality of the second verification subsystem 830 (FIG. 8B), and thus may be similar to the observer 904 (FIG. 9). For example, the observer 1412 may include a detector block 1510, a logical OR block 1512, a verifier block 1514, a test objective block 1516, and a proof objective block 1518. However, instead of having observer port elements, like the observer 904, the observer builder 1406 may configure the observer 1412 with one signal selector block 1520. The signal selector block 1520 may provide access to information, such as signals of the component 1410 available within the observer 1412, even though the observer 1412 is in a different space, i.e., the verification space 1404, than the design model 1408. For example, the observer builder 1406 may configure the signal selector block 1520 with ports linked to the information, e.g., signals, being observed. The signal selector block 1520 may be configured with three ports 1522a-c providing access to the obstacle command signal as represented by arrow 816e, the end stop command signal as represented by arrow 816f, and the down signal as represented by arrow 820b.

The UI engine 202 may provide one or more graphical affordances, such as configuration windows, through which a user may designate the information, e.g., signals, to be observed by the signal selector block 1520. For example, the configuration window may present information, such as signals, of the design model 1408, and one or more of the signals or other information may be selected, e.g., by a user. In response, the observer builder 1406 may provide respective ports at the signal selector block 1520, thereby providing access to this information to the observer 1412 within the verification space 1404. During execution of the design model 1408, which may following compile and link stages, the simulation engine 206 may log values for the signals or other information identified by the signal selector block 1520 to one or more buffers. In some embodiments, the simulation engine 206 may also store the simulation time step at which the respective signal value was computed by the design model 1408 in the buffer. The simulation engine 206 may store initial or default values for the signals in the buffer. During execution of the observer 1412, which may follow compile and link stages, data from the one or more buffers may be read out and utilized in performing the verification and validation functionality defined for the observer 1412.

Observing Hardware Events and/or Hardware Conditions

As described, the modeling environment 200 may simulate, e.g., run, a simulation model on a data processing device, such as a workstation, desktop computer, laptop computer, etc. In addition, the code generator 208 may automatically generate code, such as source or object code, for a model or portion thereof, such as a component and/or an observer. The compiler 210 may compile the generated code to produce an executable that may be deployed on a target platform, such as an embedded system, for execution. In some embodiments, the observers of the present disclosure may observe one or more hardware events produced by the data processing device on which the model (or portion thereof) is running or by the target platform on which the compiled code is executing. Additionally or alternatively, observers may observe one or more hardware conditions, such as data written to and/or stored at registers and/or memory.

Figure 28:
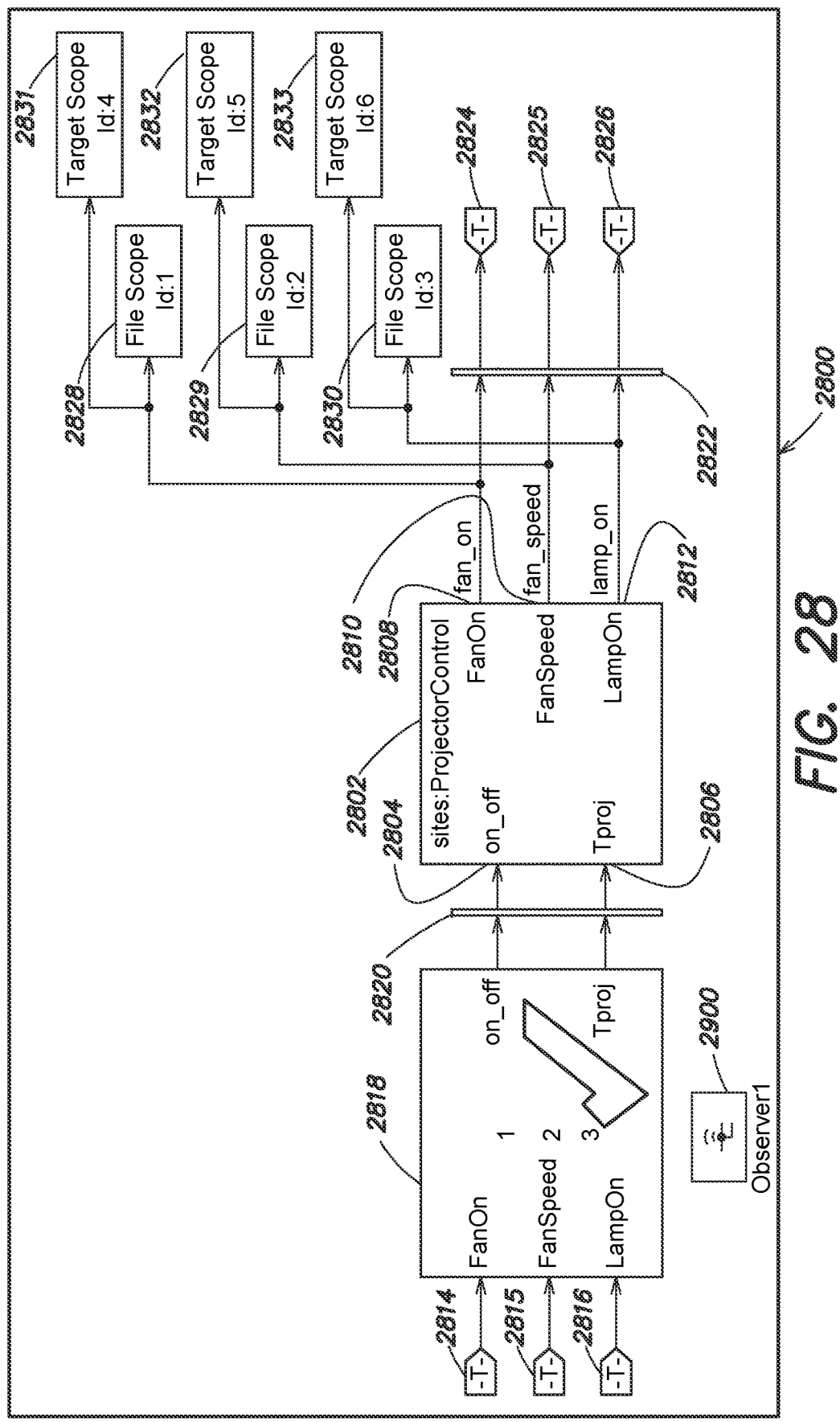
FIG. 28 is a schematic illustration of an example simulation design model in accordance with one or more embodiments.

FIG. 28 is a schematic illustration of an example simulation design model 2800 in accordance with one or more embodiments. The design model 2800 may implement a test harness for testing a component 2802 that models the operation of a controller for a projector. The component 2802, which may be implemented as a model reference block, receives two inputs, e.g., an On/Off signal as indicated at input port 2804 of the component 2802 and a projector temperature (Tproj) signal as indicated at input port 2806 of the component 2802. The component 2802 computes three commands, e.g., a fan on (fan_on) command signal as indicated at output port 2808 named 'TanOn', a fan speed (fan_speed) command signal as indicated at output port 2810 named 'FanSpeed', and a lamp on (lamp_on) command signal as indicated at output port 2812 named 'LampOn'.

The model 2800 further includes three From blocks 2814-2816, a test sequence block 2818, an input conversion subsystem block 2820, an output conversion subsystem block 2822, three GoTo blocks 2824-2826, and six real-time Scope blocks 2828-2833. The test sequence block 2818 may be configured to generate sample input signals associated with one or more simulation testing scenarios for testing the component 2802.

An observer may be associated with the model 2800. For example, an observer block, such as observer block 2900 named 'Observed', may be presented in the same model editor as the model 2800. In some embodiments, the observer block 2900 may be configured to observe one or more hardware events, such as events generated by a data processing device on which the model 2800 is running and/or by a target platform on which code generated for the model 2800 is executing, and/or hardware conditions existing or occurring at the data processing device and/or the target platform.

Figure 29:
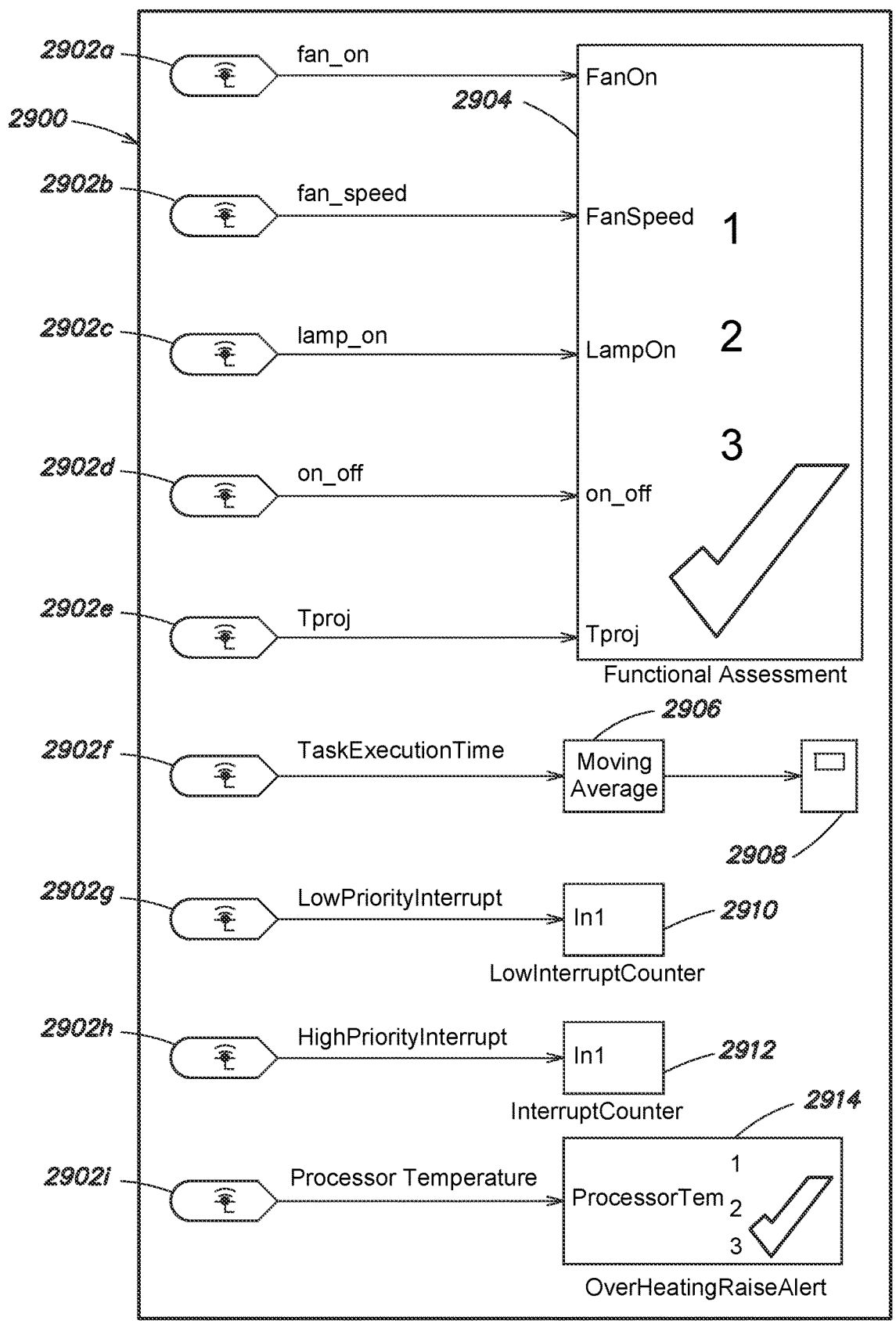
FIG. 29 is a schematic illustration of an example observer in accordance with one or more embodiments.

FIG. 29 is a schematic illustration of an example of the observer block 2900 as opened to show its contents in accordance with one or more embodiments. The observer block 2900 includes nine observer port elements 2902*a-i*. The observer port element 2902*a* provides access to the fan_on output command signal computed by the component 2802. The observer port element 2902*b* provides access to the fan_speed output command signal computed by the component 2802. The observer port element 2902*c* provides access to the lamp_on output command signal computed by the component 2802. The observer port element 2902*d* provides access to the on_off input signal to the component 2802. The observer port element 2902*e* provides access to the Tproj input signal to the component 2802. The signals accessed by the observer port elements 2902*a-e* are provided to a test assessment block 2904 that may be configured to evaluate the signals against respective, predefined test assessments.

The observer port element 2902*f* may provide access to the execution time of one or more tasks defined in code generated for the model 2800 during execution of that code on a target platform. The task execution time accessed by the observer port element 2902*f* may be provided to a block 2906 that computes a moving average and the computed moving average may be provided to a Scope block 2908. The observer port element 2902*g* may provide access to the occurrence of low priority interrupts at the target platform during execution of code generated for the model 2800. The detection of low level interrupts may be provided to a counter block 2910 name 'LowInterruptCounter'. The observer port element 2902*h* may provide access to the occurrence of high priority interrupts at the target platform during execution of code generated for the model 2800. The detection of high level interrupts may be provided to another counter block 2912 name 'InterruptCounter'. The observer port element 2902*i* may access a temperature of a processor on the target platform. The processor temperature may be provided to another test assessment block 2914 that may be configured to evaluate the processor temperature against one or more predefined assessments.

The hardware events or hardware conditions available for observation by an observer may be determined automatically by the observer builder 106, they may be manually specified, e.g., by a user, or they may be determined through a combination of automatic determination and manually specified. For example, the observer builder 106 may include one or more discovery engines that may query the data processing device on which the model 2800 will be run and/or the target platform on which code generated for the model 2800 will execute. The one or more discovery engines may identify at least some if not all hardware events or hardware conditions that can be generated by the data processing device and/or the target platform. Alternatively or additionally, a user may provide the observer builder 106 with the identity of at least some of the hardware events produced by the data processing device or the target platform and/or the hardware conditions existing or occurring at the data processing device or the target platform.

Exemplary hardware events include processor, e.g., CPU, clock rate, CPU overheating, high memory utilization, access to processor registers and/or on-board memory, interrupt signals that may occur on the data processing device and/or the target platform, such as interrupts raised by a Real-Time Operating System (RTOS) running on the target platform, asynchronous events, such as interrupts form input/output (I/O) boards included on or connected to the target platform, interrupt priority level, interrupt service routine (ISR) called by the RTOS in response to an interrupt, and maximum message delay, among others.

Exemplary hardware conditions that may be monitored by an observer include the contents of registers and memory, task execution time of tasks running on the data processing device and/or the target platform, data from sensors connected to the data processing device and/or the target platform, time taken to complete an ISR, the contents of messages and/or packets sent/received by the data processing device and/or target platform and other execution profiling data, e.g., for measuring quality of service. Monitoring of hardware conditions may be performed by observers according to a polling scheme and/or when an observer port associated with a hardware condition executes, e.g., at a sample time hit of the observer port.

An observer may be configured to keep track of how many communication packets have been received by a data processing device or target platform in error, for example of some interval, such as since the last successful communication or an interval of fixed duration.

To observe hardware events or hardware conditions at a target platform, the code generator 208 may generate code for the model 2800 and for the observer associated with the model as represented by the observer block 2900. In some embodiments, the code generator 208 may generate separate code for the model 2800 and for the observer, e.g., the observer block 2900. The observer code may request to be notified, e.g., by the RTOS running on the target platform, of the occurrence of particular hardware events. Code generated for the model 2800 may define one or more tasks, e.g., design model tasks. Similarly, code generated for the observer may define one or more tasks, e.g., observer tasks. The code generator 208 also may generate code for a scheduler that calls the design model tasks and the observer tasks. The scheduler may itself be implemented through one or more tasks, e.g., scheduling tasks. Exemplary schedules implemented by the scheduler code may include first in, first out (FIFO) scheduling also known as first come, first served scheduling, earliest deadline first (EDF) scheduling, round robin scheduling, priority scheduling, etc.

In some embodiments, the generated code may include code for translating hardware events and/or hardware conditions to a form suitable for use by the observers. For example, polling of registers or memory may be determined based on a sample rate associated with an observer port associated with the registers or memory.

In some embodiments, tasks associated with a design model may under different schedulers on the same or on different hardware resources. For example, tasks associated with a design model may run on one processor or on one core of a given processor, while tasks associated with an observer, such as an observer model, may run on another processor or on another core of the given processor. The processors or cores may have their own schedulers or in other embodiments there may not be a scheduler and the tasks may run directly on the hardware resources.

The code generated for the observer may be executed natively on the target platform and thus have access to all hardware events occurring on the target platform. If the target platform receives an external interrupt, for example from an I/O board connected to and/or included in the target platform, the RTOS at the target platform may notify the scheduler task, which in turn may notify the observer task.

Hardware events and/or conditions observed by the observer and/or data computed by an observer based on observed hardware events, such as average task execution time, number of interrupts, level of interrupts, memory utilization, etc. may be provided to a data processing device operating as a monitor. For example, the target platform may be connected to a data processing device, such as a workstation, and operated in a Hardware in the Loop (HIL) manner. The observed hardware events and/or data based on observed hardware events may be presented at a workstation, e.g., on a display of the workstation. In some embodiments, the observer may capture data associated with the occurrence of a hardware event being observed, such as the time of each occurrence of the hardware event and/or simulation state information (or a portion thereof) at the time of each occurrence of the hardware event.

For purposes of explanation, portions of the present disclosure makes reference to model elements, such as blocks, of the Simulink modeling environment from The MathWorks, Inc. This is not intended as limiting and, as noted, it should be understood that the present disclosure may be used with other modeling environments supporting other elements.

Data Processing System

Figure 16:
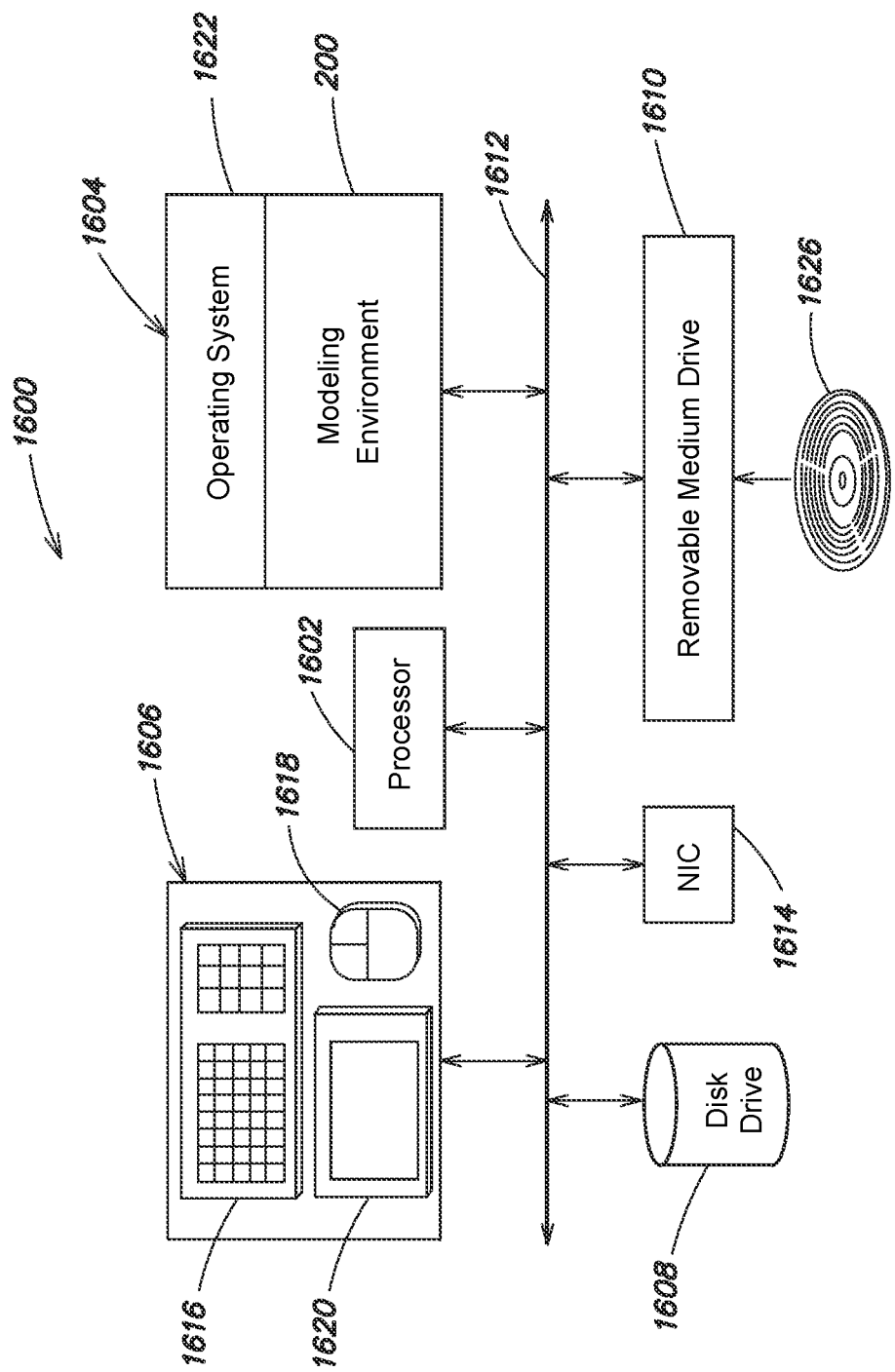
FIG. 16 is a schematic illustration of an example data processing system in accordance with one or more embodiments.

FIG. 16 is a schematic illustration of a computer or data processing system 1600 for implementing an embodiment of the disclosure. The computer system 1600 may include one or more processing elements, such as a processor 1602, a main memory 1604, user input/output (I/O) 1606, a persistent data storage unit, such as a disk drive 1608, and a removable medium drive 1610 that are interconnected by a system bus 1612. The computer system 1600 may also include a communication unit, such as a network interface card (NIC) 1614. The user I/O 1606 may include a keyboard 1616, a pointing device, such as a mouse 1618, and a display 1620. Other user I/O 1606 components include voice or speech command systems, other pointing devices include touchpads and touchscreens, and other output devices besides a display, include a printer, a projector, a touchscreen, etc. Exemplary processing elements include single or multi-core Central Processing Units (CPUs), Graphics Processing Units (GPUs), Field Programmable Gate Arrays (FPGAs), Application Specific Integrated Circuits (ASICs), microprocessors, microcontrollers, etc.

The main memory 1604, which may be a Random Access Memory (RAM), may store a plurality of program libraries or modules, such as an operating system 1622, and one or more application programs that interface to the operating system 1622, such as the modeling environment 200, including the observer builder 106. One or more objects or data structures may also be stored in the main memory 1604, such as the design model 101 and the observer 112, among other data structures.

The removable medium drive 1610 may accept and read a computer readable media 1626, such as a CD, DVD, floppy disk, solid state drive, tape, flash memory or other media. The removable medium drive 1610 may also write to the computer readable media 1626.

Suitable computer systems include personal computers (PCs), workstations, servers, laptops, tablets, palm computers, smart phones, electronic readers, and other portable computing devices, etc. Nonetheless, those skilled in the art will understand that the computer system 1600 of FIG. 16 is intended for illustrative purposes only, and that the present disclosure may be used with other computer systems, data processing systems, or computational devices. The present disclosure may also be used in a networked, e.g., client-server, computer architecture, or a public and/or private cloud computing arrangement. For example, the modeling environment 200 may be hosted on a server, and accessed by a remote client through an application hosting system, such as the Remote Desktop Connection tool from Microsoft Corp.

Suitable operating systems 1622 include the Windows series of operating systems from Microsoft Corp. of Redmond, Wash., the Android and Chrome OS operating systems from Google Inc. of Mountain View, Calif., the Linux operating system, the MAC OS® series of operating systems from Apple Inc. of Cupertino, Calif., and the UNIX® series of operating systems, among others. The operating system 1622 may provide services or functions for other modules, such as allocating memory, organizing data according to a file system, prioritizing requests, etc. The operating system 1622 may run on a virtual machine, which may be provided by the data processing system 1600.

As indicated above, a user or developer, such as an engineer, scientist, programmer, etc., may utilize one or more input devices, such as the keyboard 1616, the mouse 1618, and the display 1620 to operate the modeling environment 200, and construct one or more models, such as the design model 101 and the observers. As discussed, the models may be computational and may have executable semantics. In particular, the models may be simulated or run. In particular, the models may provide one or more of time-based, event-based, state-based, message-based, frequency-based, control-flow based, and dataflow-based execution semantics. The execution of a model may simulate operation of the system that is being designed or evaluated.

Figure 17:
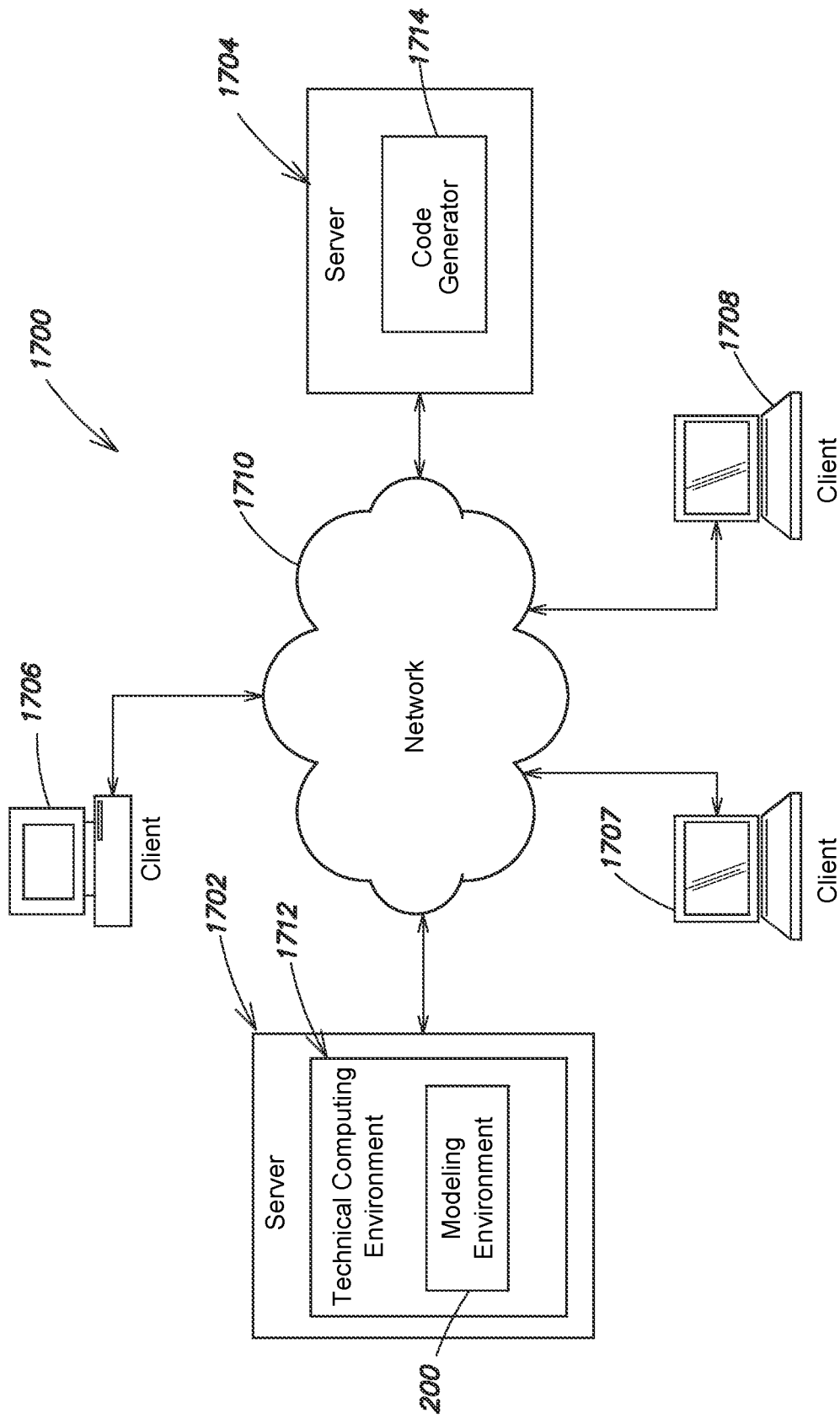
FIG. 17 is a schematic illustration of an example distributed computing environment in accordance with one or more embodiments.

FIG. 17 is a schematic diagram of a distributed computing environment 1700 in which systems and/or methods described herein may be implemented. The environment 1700 may include client and server devices, such as two servers 1702 and 1704, and three clients 1706-1708, interconnected by one or more networks, such as network 1710. The servers 1702 and 1704 may include applications or processes accessible by the clients 1706-1708. For example, the server 1702 may include a technical computing environment (TCE) 1712, which may include or have access to a modeling environment, such as the modeling environment 200. The server 1704 may include a code generator, such as the code generator 208. The devices of the environment 1700 may interconnect via wired connections, wireless connections, or a combination of wired and wireless connections.

The servers 1702 and 1704 may include one or more devices capable of receiving, generating, storing, processing, executing, and/or providing information. For example, the servers 1702 and 1704 may include a computing device, such as a server, a desktop computer, a laptop computer, a tablet computer, a handheld computer, or a similar device.

The clients 1706-1708 may be capable of receiving, generating, storing, processing, executing, and/or providing information. Information may include any type of machine-readable information having substantially any format that may be adapted for use, e.g., in one or more networks and/or with one or more devices. The information may include digital information and/or analog information. The information may further be packetized and/or non-packetized. In an embodiment, the clients 1706-1708 may download data and/or code from the servers 1702 and 1704 via the network 1710. In some implementations, the clients 1706-1708 may be desktop computers, workstations, laptop computers, tablet computers, handheld computers, mobile phones (e.g., smart phones, radiotelephones, etc.), electronic readers, or similar devices. In some implementations, the clients 1706-1708 may receive information from and/or transmit information to the servers 1702 and 1704.

The network 1710 may include one or more wired and/or wireless networks. For example, the network 1710 may include a cellular network, a public land mobile network ("PLMN"), a local area network ("LAN"), a wide area network ("WAN"), a metropolitan area network ("MAN"), a telephone network (e.g., the Public Switched Telephone Network ("PSTN")), an ad hoc network, an intranet, the Internet, a fiber optic-based network, and/or a combination of these or other types of networks. Information may be exchanged between network devices using any network protocol, such as, but not limited to, the Internet Protocol (IP), Asynchronous Transfer Mode (ATM), Synchronous Optical Network (SONET), the User Datagram Protocol (UDP), Institute of Electrical and Electronics Engineers (IEEE) 802.11, etc.

The number of devices and/or networks shown in FIG. 17 is provided as an example. In practice, there may be additional devices and/or networks, fewer devices and/or networks, different devices and/or networks, or differently arranged devices and/or networks than those shown in FIG. 17. Furthermore, two or more devices shown in FIG. 17 may be implemented within a single device, or a single device shown in FIG. 17 may be implemented as multiple, distributed devices. Additionally, one or more of the devices of the distributed computing environment 1700 may perform one or more functions described as being performed by another one or more devices of the environment 1700.

The foregoing description of embodiments is intended to provide illustration and description, but is not intended to be exhaustive or to limit the disclosure to the precise form disclosed. Modifications and variations are possible in light of the above teachings or may be acquired from a practice of the disclosure. For example, while a series of acts has been described above with respect to the flow diagrams, the order of the acts may be modified in other implementations. In addition, the acts, operations, and steps may be performed by additional or other modules or entities, which may be combined or separated to form other modules or entities. Further, non-dependent acts may be performed in parallel. Also, the term "user", as used herein, is intended to be broadly interpreted to include, for example, a computer or data processing system (e.g., system 100) or a human user of a computer or data processing system, unless otherwise stated.

Further, certain embodiments of the disclosure may be implemented as logic that performs one or more functions. This logic may be hardware-based, software-based, or a combination of hardware-based and software-based. Some or all of the logic may be stored in one or more tangible non-transitory computer-readable storage media and may include computer-executable instructions that may be executed by a computer or data processing system, such as system 1600. The computer-executable instructions may include instructions that implement one or more embodiments of the disclosure. The tangible non-transitory computer-readable storage media may be volatile or non-volatile and may include, for example, flash memories, dynamic memories, removable disks, and non-removable disks.

No element, act, or instruction used herein should be construed as critical or essential to the disclosure unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

The foregoing description has been directed to specific embodiments of the present disclosure. It will be apparent, however, that other variations and modifications may be made to the described embodiments, with the attainment of some or all of their advantages. For example, the observer builder 106 may be included in the model verification engine 211. Therefore, it is the object of the appended claims to cover all such variations and modifications as come within the true spirit and scope of the disclosure.

The following items provide aspects of the present disclosure:

Item 1. A computer-implemented method for performing validation of a component of an executable simulation model of a vehicle, the model including an observer that is configured to access an intrinsic execution event generated during the execution of the component, wherein the intrinsic execution event indicates a failure or an exception;

wherein the component models a part of the vehicle or the vehicle itself, the method comprising:

establishing for the executable simulation model, a first execution space and a second execution space, where the first execution space is separate from the second execution space, such that values of attributes of the observer are inaccessible to the first execution space;

executing the component of the executable simulation model utilizing the first execution space, the executing of the component producing the intrinsic execution event;

capturing at least a portion of a simulation state when the execution event occurred, wherein the simulation state includes a time step identifier, an identifier of the intrinsic execution event and signal values of the component;

executing the observer of the executable simulation model utilizing the second execution space, such that the values of the attributes of the observer are blocked from propagating to the component;

providing the portion of the simulation state to the observer during execution of the observer utilizing the second execution space; and obtaining, by the observer, the signal values of the component in order to reproduce the failure or the exception.

Item 2. A computer-implemented method comprising:

for an executable simulation model that includes a component and an observer that is configured to access model data of the component generated during execution of the component, an intrinsic execution event generated during the execution of the component, establishing, by at least one processor, for the executable simulation model, a first execution space and a second execution space, where the first execution space is separate from the second execution space, such that values of attributes of the observer are inaccessible to the first execution space;

executing, by the at least one processor, the component of the executable simulation model utilizing the first execution space, the executing of the component producing the model data of the component or the intrinsic execution event;

executing, by the at least one processor, the observer of the executable simulation model utilizing the second execution space, such that the values of the attributes of the observer are blocked from propagating to the component; and providing the model data of the component or the intrinsic execution event to the observer during execution of the observer utilizing the second execution space.

Item 3. The computer-method of item 1 or 2 wherein the step of executing the observer follows the step of executing the component.

Item 4. The computer-implemented method of any of the preceding items further comprising:
translating the model data of the component or the intrinsic execution event to a format compatible with execution of the observer before the providing.

Item 5. The computer-implemented method of any of the preceding items further comprising:
providing one or more observer port elements within the observer, the one or more observer port elements providing access, within the observer, to the model data of the component or the intrinsic execution events generated during the step of executing the component.

Item 6. The computer-implemented method of any of the preceding items wherein the model data of the component includes one or more of:
input data of the component;
output data of the component;
parameters of the component;
states of the component; or
function calls of the component.

Item 7. The computer-implemented method of any of the preceding items wherein the intrinsic execution event includes at least one of:
computation of a value that is a not a number (NaN) value;
occurrence of a divide-by-zero operation;
computation of a value of infinity (inf);
a datatype overflow;
a change to a tunable parameter;
a variable crossing through zero;
discrete state activations;
state transitions;
state transition actions;
state transition conditions; or
discrete state actions.

Item 8. The computer-implemented method of any of the preceding items wherein the step of executing the observer produces one or more verification results for the component.

Item 9. The computer-implemented method of item 8 wherein the observer includes:
a first operation mode in which the observer is activated and executed, and presents one or more verification results on the display;
a second operation mode in which the observer is activated and executed, and does not present the one or more verification results on the display; and
a third operation mode in which the observer is conditionally executed in response to a control input.

Item 10. The computer-implemented method of item 9 wherein the observer includes a fourth operation mode which the step of executing the observer is not performed.

Item 11. The computer-implemented method of item 9 further comprising: presenting a visual aid that indicates a current operation mode of the observer.

Item 12. The computer-implemented method of item 9 further comprising: receiving a command for switching the observer among the first operation mode, the second operation mode, and the third operation mode.

Item 13. The computer-implemented method of any of the preceding items wherein:
the first space includes a first model editor and a first workspace having a scope limited to the component, and
the second space includes a second model editor and a second workspace having a scope limited to the observer.

Item 14. The computer-implemented method of any of the preceding items wherein the step of executing the observer includes producing data, the method further comprising:
blocking the data produced during the step of executing the observer from entering the first design space.

Item 15. The computer-implemented method of any of the preceding items further comprising:
assigning the component to the first execution space and the observer to the second execution space.
producing a report in response to the step of executing the observer, the report including validation results for the component.

Item 16. The computer-implemented method of any of the preceding items further comprising:
producing a report in response to the step of executing the observer, the report including validation results for the component.

Item 17. The computer-implemented method of any of the preceding items wherein the component produces the model data at a first sample rate and the observer is executed at a second sample rate, the method further comprising:
reconciling the model data produced at the first sample rate to the second sample rate of the observer.

Item 18. The computer-implemented method of any of the preceding items further comprising:
configuring the observer to access a hardware event or a hardware condition produced at a data processing device executing the component or produced at a target platform executing code generated for the component and the observer.

Item 19. The computer-implemented method of item 18 wherein the hardware event is at least one of:
processor clock rate;
processor overheating;
memory utilization;
accesses to one or more processor registers;
access to one or more memories;
one or more interrupts at the data processing device or the target platform;
one or more asynchronous events at the data processing device or the target platform;
interrupt priority level; or
interrupt service routine (ISR) called to service the one or more interrupts or the one or more asynchronous events.

Item 20. The computer-implemented method of item 18 wherein the hardware condition is at least one of:
contents of one or more registers;
contents of one or more memories;
task execution time of one or more tasks at the data processing device or the target platform;
data from one or more sensors connected to the data processing device or the target platform;
a time associated with the ISR;
time associated with a message at the data processing device or the target platform; or
execution profiling data associated with the data processing device or the target platform.

Item 21. A computer-implemented method comprising:
for a graphical simulation model having executable semantics, the graphical simulation model including
a graphical component, and
a test harness having a plurality of elements, the test harness linked by one or more connections to the component, and designed to validate or assess the component;

partitioning the graphical simulation model into a first space and a second space, where the graphical component and the test harness are included in the first space;

automatically converting, by a processor, the test harness to an observer, the automatically converting including moving at least some of the plurality of elements of the test harness from the first space to the second space;

executing, by the processor, the component, the step of executing the component producing component execution values;

executing, by the processor, the observer;

providing the component execution values to the observer during the step of executing the observer.

Item 22. The computer-implemented method of item 21 wherein the step of executing the observer occurs after the step of executing the component.

Item 23. The computer-implemented method of item 21 or 22 wherein the observer specifies a plurality of attributes, the method further comprising: blocking values of the plurality of attributes of the observer from propagating to the component.

Item 24. The computer-implemented method of any one of items 21 to 23 wherein the step of automatically converting includes:

adding one or more observer port elements to the observer; and configuring the one or more observer port elements to provide access, within the observer, to the component execution values produced by the component during the step of executing the component.

Item 25. The computer-implemented method of any one of items 21 to 24 wherein the one or more connections are visually presented in a display of the graphical model.

Item 26. One or more non-transitory computer-readable media, having stored thereon instructions that when executed by a computing device, cause the computing device to perform the method according to any one of items 1 to 25.

Item 27. One or more non-transitory computer-readable media comprising program instructions for execution by one or more processors, the program instructions instructing the one or more processors to:

for an executable simulation model that includes a component and an observer that is configured to access model data of the component generated during execution of the component or an intrinsic execution event generated during the execution of the component, establish, for the executable simulation model, a first execution space and a second execution space, where the first execution space is separate from the second execution space, such that values of attributes of the observer are inaccessible to the first execution space;

execute the component of the executable simulation model utilizing the first execution space, the executing of the component producing the model data of the component or the intrinsic execution event;

execute the observer of the executable simulation model utilizing the second execution space, such that the values of the attributes of the observer are blocked from propagating to the component;

translate the model data of the component or the intrinsic execution event to a format compatible with execution of the observer; and provide the model data of the component or the intrinsic execution event following the translating to the observer during execution of the observer utilizing the second execution space.

What is claimed is:

1. A computer-implemented method comprising:

for an executable simulation model that includes a component and an observer, wherein the observer is configured to access at least one of (i) model data of the component generated during execution of the component or (ii) an intrinsic execution event generated during the execution of the component, establishing, by at least one processor, for the executable simulation model, a first execution space and a second execution space, where the first execution space is separate from the second execution space, such that values of attributes of the observer are inaccessible to the first execution space;

executing, by the at least one processor, the component of the executable simulation model utilizing the first execution space, the executing of the component of the executable simulation model producing at least one of (i) the model data of the component generated during the execution of the component or (ii) the intrinsic execution event generated during the execution of the component;

executing, by the at least one processor, the observer of the executable simulation model utilizing the second execution space, such that the values of the attributes of the observer are blocked from propagating to the component; and providing at least one of (i) the model data of the component generated during the execution of the component or (ii) the intrinsic execution event generated during the execution of the component to the observer during execution of the observer of the executable simulation model utilizing the second execution space.

2. The computer-implemented method of claim 1 wherein the executing the observer of the executable simulation model follows the executing the component of the executable simulation model.

3. The computer-implemented method of claim 1 further comprising:

translating at least one of (i) the model data of the component generated during the execution of the component or (ii) the intrinsic execution event generated during the execution of the component to a format compatible with execution of the observer of the executable simulation model before the providing the model data of the component.

4. The computer-implemented method of claim 1 further comprising:

providing one or more observer port elements within the observer, the one or more observer port elements providing access, within the observer, to at least one of (i) the model data of the component generated during the execution of the component or (ii) the intrinsic execution event generated during the execution of the component.

5. The computer-implemented method of claim 4 wherein the model data of the component generated during the execution of the component includes one or more of:

input data of the component;

output data of the component;

parameters of the component;

states of the component; or function calls of the component.

6. The computer-implemented method of claim 1 wherein the intrinsic execution event generated during the execution of the component includes at least one of:
- a computation of a value that is a not a number (NaN) value;
- an occurrence of a divide-by-zero operation;
- a computation of a value of infinity (inf);
- a datatype overflow;
- a change to a tunable parameter;
- a variable crossing through zero;
- discrete state activations;
- state transitions;
- state transition actions;
- state transition conditions; or
- discrete state actions.

7. The computer-implemented method of claim 1 wherein the executing the observer of the executable simulation model produces one or more verification results for the component.

8. The computer-implemented method of claim 7 wherein the observer includes:
- a first operation mode in which the observer is activated and executed, and presents the one or more verification results on a display;
- a second operation mode in which the observer is activated and executed, and does not present the one or more verification results on the display; and
- a third operation mode in which the observer is conditionally executed in response to a control input.

9. The computer-implemented method of claim 8 wherein the observer includes a fourth operation mode in which the executing the observer of the executable simulation model is not performed.

10. The computer-implemented method of claim 8 further comprising:
presenting a visual aid that indicates a current operation mode of the observer.

11. The computer-implemented method of claim 8 further comprising:
receiving a command for switching the observer among the first operation mode, the second operation mode, and the third operation mode.

12. The computer-implemented method of claim 1 wherein:
- the first execution space includes a first model editor and a first workspace having a scope limited to the component, and
- the second execution space includes a second model editor and a second workspace having a scope limited to the observer.

13. The computer-implemented method of claim 1 wherein the executing the observer of the executable simulation model includes producing data, the computer-implemented method further comprising:
blocking the data produced during the executing the observer of the executable simulation model from entering the first execution space.

14. The computer-implemented method of claim 1 further comprising:
- assigning the component to the first execution space and the observer to the second execution space; and
- producing a report in response to the executing the observer of the executable simulation model, the report including validation results for the component.

15. The computer-implemented method of claim 1 further comprising:
producing a report in response to the executing the observer of the executable simulation model, the report including validation results for the component.

16. The computer-implemented method of claim 1 wherein the component produces the model data of the component at a first sample rate and the observer is executed at a second sample rate, the computer-implemented method further comprising:
reconciling the model data of the component produced at the first sample rate to the second sample rate of the observer.

17. The computer-implemented method of claim 1 further comprising:
configuring the observer to access a hardware event or a hardware condition produced at a data processing device executing the component or produced at a target platform executing code generated for the component and the observer.

18. The computer-implemented method of claim 17 wherein the hardware event is at least one of:
- a processor clock rate;
- a processor overheating;
- a memory utilization;
- accesses to one or more processor registers;
- an access to one or more memories;
- one or more interrupts at the data processing device or the target platform;
- one or more asynchronous events at the data processing device or the target platform;
- an interrupt priority level; or
- an interrupt service routine (ISR) called to service the one or more interrupts or the one or more asynchronous events at the data processing device or the target platform.

19. The computer-implemented method of claim 17 wherein the hardware condition is at least one of:
- contents of one or more processor registers;
- contents of one or more memories;
- a task execution time of one or more tasks at the data processing device or the target platform;
- data from one or more sensors connected to the data processing device or the target platform;
- a time associated with an interrupt service routine (ISR);
- a time associated with a message at the data processing device or the target platform; or
- execution profiling data associated with the data processing device or the target platform.

20. The computer-implemented method of claim 1 further comprising:
selecting the model data of the component generated during the execution of the component or the intrinsic execution event generated during the execution of the component that is translated to the format compatible with the execution of the observer of the executable simulation model.

21. The computer-implemented method of claim 1 wherein the first execution space and the second execution space are on a same data processing machine.

22. The computer-implemented method of claim 1 wherein the first execution space is on a first data processing machine and the second execution space is on a second data processing machine that is different from the first data processing machine.

23. The computer-implemented method of claim 1 wherein the first execution space is on a host and the second execution space is on a target.

24. The computer-implemented method of claim 1 wherein the first execution space is on a target and the second execution space is on a host.

25. The computer-implemented method of claim 1 wherein the executing the observer of the executable simulation model includes performing at least one of verification or validation using at least one of (i) the model data of the component generated during the execution of the component or (ii) the intrinsic execution event generated during the execution of the component.

26. A computer-implemented method comprising:
for a graphical simulation model having executable semantics, the graphical simulation model including:
a graphical component, and
a test harness having a plurality of elements, the test harness is:
linked by one or more connections to the graphical component, and
designed to validate or assess the graphical component,
partitioning the graphical simulation model into a first execution space and a second execution space, where the graphical component and the test harness are included in the first execution space;
automatically converting, by at least one processor, the test harness to an observer, where the observer specifies a plurality of attributes, the automatically converting the test harness to the observer including:
moving at least some of the plurality of elements of the test harness from the first execution space to the second execution space;
executing, by the at least one processor, the graphical component utilizing the first execution space, the executing the graphical component producing graphical component execution values;
executing, by the at least one processor, the observer utilizing the second execution space, such that values of the plurality of attributes of the observer are blocked from propagating to the graphical component; and
providing the graphical component execution values to the observer during the executing the observer.

27. The computer-implemented method of claim 26 wherein the executing the observer occurs after the executing the graphical component.

28. The computer-implemented method of claim 26 wherein the automatically converting the test harness to the observer includes:
adding one or more observer port elements to the observer; and
configuring the one or more observer port elements to provide access, within the observer, to the graphical component execution values produced by the graphical component during the executing the graphical component.

29. The computer-implemented method of claim 26 wherein the one or more connections are visually presented in a display of the graphical simulation model.

30. One or more non-transitory computer-readable media storing program instructions for execution by one or more processors, the program instructions comprising instructions to:
for an executable simulation model that includes a component and an observer, wherein the observer is configured to access at least one of (i) model data of the component generated during execution of the component or (ii) an intrinsic execution event generated during the execution of the component,
establish, for the executable simulation model, a first execution space and a second execution space, where the first execution space is separate from the second execution space, such that values of attributes of the observer are inaccessible to the first execution space;
execute the component of the executable simulation model utilizing the first execution space, the executing of the component of the executable simulation model producing at least one of (i) the model data of the component generated during the execution of the component or (ii) the intrinsic execution event generated during the execution of the component;
execute the observer of the executable simulation model utilizing the second execution space, such that the values of the attributes of the observer are blocked from propagating to the component; and
provide at least one of (i) the model data of the component generated during the execution of the component or (ii) the intrinsic execution event generated during the execution of the component to the observer during execution of the observer of the executable simulation model utilizing the second execution space.

31. The one or more non-transitory computer-readable media of claim 30 further comprising instructions to:
translate at least one of (i) the model data of the component generated during the execution of the component or (ii) the intrinsic execution event generated during the execution of the component to a format compatible with execution of the observer of the executable simulation model before the providing the model data of the component.

32. The one or more non-transitory computer-readable media of claim 30 further comprising instructions to:
configure the observer to access a hardware event or a hardware condition produced at a data processing device executing the component or produced at a target platform executing code generated for the component and the observer.

33. The one or more non-transitory computer-readable media of claim 32 wherein the hardware event is at least one of:
a processor clock rate;
a processor overheating;
a memory utilization;
accesses to one or more processor registers;
an access to one or more memories;
one or more interrupts at the data processing device or the target platform;
one or more asynchronous events at the data processing device or the target platform;
an interrupt priority level; or
an interrupt service routine (ISR) called to service the one or more interrupts or the one or more asynchronous events at the data processing device or the target platform.

34. The one or more non-transitory computer-readable media of claim 32 wherein the hardware condition is at least one of:
contents of one or more processor registers;
contents of one or more memories;
a task execution time of one or more tasks at the data processing device or the target platform;

data from one or more sensors connected to the data processing device or the target platform;
a time associated with an interrupt service routine (ISR);
a time associated with a message at the data processing device or the target platform; or
execution profiling data associated with the data processing device or the target platform.

35. The one or more non-transitory computer-readable media of claim 30 further comprising instructions to:
provide one or more observer port elements within the observer, the one or more observer port elements providing access, within the observer, to at least one of (i) the model data of the component generated during the execution of the component or (ii) the intrinsic execution event generated during the execution of the component.

36. The one or more non-transitory computer-readable media of claim 30 wherein the executing the observer of the executable simulation model includes performing at least one of verification or validation using at least one of (i) the model data of the component generated during the execution of the component or (ii) the intrinsic execution event generated during the execution of the component.

37. An apparatus comprising:
a memory storing an executable simulation model that includes a component and an observer, wherein the observer is configured to access at least one of (i) model data of the component generated during execution of the component or (ii) an intrinsic execution event generated during the execution of the component; and
one or more processors configured to:
establish, for the executable simulation model, a first execution space and a second execution space, where the first execution space is separate from the second execution space, such that values of attributes of the observer are inaccessible to the first execution space;
execute the component of the executable simulation model utilizing the first execution space, the executing of the component of the executable simulation model producing at least one of (i) the model data of the component generated during the execution of the component or (ii) the intrinsic execution event generated during the execution of the component;
execute the observer of the executable simulation model utilizing the second execution space, such that the values of the attributes of the observer are blocked from propagating to the component; and
provide at least one of (i) the model data of the component generated during the execution of the component or (ii) the intrinsic execution event generated during the execution of the component to the observer during execution of the observer of the executable simulation model utilizing the second execution space.

38. The apparatus of claim 37 wherein the one or more processors are further configured to:
translate at least one of (i) the model data of the component generated during the execution of the component or (ii) the intrinsic execution event generated during the execution of the component to a format compatible with execution of the observer of the executable simulation model before the providing the model data of the component.

39. The apparatus of claim 37 wherein the one or more processors are further configured to:
provide one or more observer port elements within the observer, the one or more observer port elements providing access, within the observer, to at least one of (i) the model data of the component generated during the execution of the component or (ii) the intrinsic execution event generated during the execution of the component.

40. The apparatus of claim 37 wherein the one or more processors are further configured to:
configure the observer to access a hardware event or a hardware condition produced at a data processing device executing the component or produced at a target platform executing code generated for the component and the observer.

41. The apparatus of claim 40 wherein the hardware event is at least one of:
a processor clock rate;
a processor overheating;
a memory utilization;
accesses to one or more processor registers;
an access to one or more memories;
one or more interrupts at the data processing device or the target platform;
one or more asynchronous events at the data processing device or the target platform;
an interrupt priority level; or
an interrupt service routine (ISR) called to service the one or more interrupts or the one or more asynchronous events at the data processing device or the target platform.

42. The apparatus of claim 40 wherein the hardware condition is at least one of:
contents of one or more processor registers;
contents of one or more memories;
a task execution time of one or more tasks at the data processing device or the target platform;
data from one or more sensors connected to the data processing device or the target platform;
a time associated with an interrupt service routine (ISR);
a time associated with a message at the data processing device or the target platform; or
execution profiling data associated with the data processing device or the target platform.

43. The apparatus of claim 37 wherein the executing the observer of the executable simulation model includes performing at least one of verification or validation using at least one of (i) the model data of the component generated during the execution of the component or (ii) the intrinsic execution event generated during the execution of the component.

44. One or more non-transitory computer-readable media storing program instructions for execution by one or more processors, the program instructions comprising instructions to:
for a graphical simulation model having executable semantics, the graphical simulation model including:
a graphical component, and
a test harness having a plurality of elements, the test harness is:
linked by one or more connections to the graphical component, and
designed to validate or assess the graphical component,
partition the graphical simulation model into a first execution space and a second execution space, where the graphical component and the test harness are included in the first execution space;

automatically convert the test harness to an observer, where the observer specifies a plurality of attributes, the automatically converting the test harness to the observer including:
  moving at least some of the plurality of elements of the test harness from the first execution space to the second execution space;
execute the graphical component utilizing the first execution space, the executing the graphical component producing graphical component execution values;
execute the observer utilizing the second execution space, such that values of the plurality of attributes of the observer are blocked from propagating to the graphical component; and
provide the graphical component execution values to the observer during the executing the observer.

45. The one or more non-transitory computer-readable media of claim 44 wherein the automatically converting the test harness to the observer includes:
  adding one or more observer port elements to the observer; and
  configuring the one or more observer port elements to provide access, within the observer, to the graphical component execution values produced by the graphical component during the executing the graphical component.

46. The one or more non-transitory computer-readable media of claim 44 wherein the one or more connections are visually presented in a display of the graphical simulation model.

47. An apparatus comprising:
a memory storing a graphical simulation model having executable semantics, the graphical simulation model including:
  a graphical component, and
  a test harness having a plurality of elements, the test harness is:
    linked by one or more connections to the graphical component, and
    designed to validate or assess the graphical component; and
one or more processors configured to:
  partition the graphical simulation model into a first execution space and a second execution space, where the graphical component and the test harness are included in the first execution space;
  automatically convert the test harness to an observer, where the observer specifies a plurality of attributes, the automatically converting the test harness to the observer including:
    moving at least some of the plurality of elements of the test harness from the first execution space to the second execution space;
  execute the graphical component utilizing the first execution space, the executing the graphical component producing graphical component execution values;
  execute the observer utilizing the second execution space, such that values of the plurality of attributes of the observer are blocked from propagating to the graphical component; and
  provide the graphical component execution values to the observer during the executing the observer.

48. The apparatus of claim 47 wherein the automatically converting the test harness to the observer includes:
  adding one or more observer port elements to the observer; and
  configuring the one or more observer port elements to provide access, within the observer, to the graphical component execution values produced by the graphical component during the executing the graphical component.

49. The apparatus of claim 47 wherein the one or more connections are visually presented in a display of the graphical simulation model.

* * * * *

UNITED STATES PATENT AND TRADEMARK OFFICE
CERTIFICATE OF CORRECTION

Page 1 of 2

PATENT NO. : 10,922,208 B2
APPLICATION NO. : 16/426624
DATED : February 16, 2021
INVENTOR(S) : Mahesh Nanjundappa et al.

It is certified that error appears in the above-identified patent and that said Letters Patent is hereby corrected as shown below:

In the Specification

Column 17, Line 33:
Delete "the design model 765 execution scope 700, e.g., the com-"
Insert -- the design model execution scope 700, e.g., the com- --

Column 17, Line 41:
Delete "observe model data, such as block inputs, block 770 outputs,"
Insert -- observe model data, such as block inputs, block outputs, --

Column 23, Line 45:
Delete "named 'SimulinkFunction, three Function Caller blocks"
Insert -- named 'SimulinkFunction', three Function Caller blocks --

Column 23, Line 46:
Delete "2204-2206 named 'Caller1', Caller2', and 'Caller3', a Sine"
Insert -- 2204-2206 named 'Caller1', 'Caller2', and 'Caller3', a Sine --

Column 24, Line 65:
Delete "Zero Crossing Counter2', three Scope blocks 2510-2512"
Insert: -- 'Zero Crossing Counter2', three Scope blocks 2510-2512 --

Column 24, Line 66:
Delete "named 'Scope1', Scope', and 'Scope11', a Product block"
Insert -- named 'Scope1', 'Scope', and 'Scope11', a Product block --

Column 26, Line 30:
Delete "embodiments, the detector 714 may capture 1180 the sim-"
Insert -- embodiments, the detector 714 may capture the sim- --

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*

Column 26, Line 37:
Delete "sage may be accessed by 1185 the simulation engine 206, for"
Insert -- sage may be accessed by the simulation engine 206, for --

Column 28, Line 41:
Delete "may be added 1280 and connected to the component 801."
Insert -- may be added and connected to the component 801. --

Column 34, Line 9:
Delete "ous-time behavior, discretetime behavior, a finite state"
Insert -- ous-time behavior, discrete-time behavior, a finite state --

Column 36, Line 41:
Delete "signal as indicated at output port 2808 named 'TanOn', a fan"
Insert -- signal as indicated at output port 2808 named 'FanOn', a fan --

Column 36, Line 56:
Delete "named 'Observerd', may be presented in the same model"
Insert -- named 'Observer1', may be presented in the same model --